(12) United States Patent
Yaoi et al.

(10) Patent No.: US 8,587,179 B2
(45) Date of Patent: Nov. 19, 2013

(54) BOUNDARY ACOUSTIC WAVE DEVICE

(71) Applicant: Murata Manufacturing Co., Ltd., Nagaokakyo (JP)

(72) Inventors: Mari Yaoi, Nagaokakyo (JP); Tetsuya Kimura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/688,284

(22) Filed: Nov. 29, 2012

(65) Prior Publication Data

US 2013/0088121 A1  Apr. 11, 2013

Related U.S. Application Data

(63) Continuation of application No. 13/368,361, filed on Feb. 8, 2012, now Pat. No. 8,344,589, which is a continuation of application No. PCT/JP2010/058430, filed on May 19, 2010.

(30) Foreign Application Priority Data

Aug. 10, 2009  (JP) ................................. 2009-185790
Aug. 28, 2009  (JP) ................................. 2009-191861

(51) Int. Cl.
*H01L 41/08*  (2006.01)

(52) U.S. Cl.
USPC .................... 310/313 A; 310/313 R; 310/364

(58) Field of Classification Search
USPC .......................................... 310/313 A, 313 R
See application file for complete search history.

(56) References Cited

U.S. PATENT DOCUMENTS

| 8,344,589 B2* | 1/2013 | Yaoi et al. ................. 310/313 B |
| 8,381,386 B2* | 2/2013 | Kando ............................ 29/594 |
| 2009/0265904 A1* | 10/2009 | Kando et al. .................. 29/25.35 |
| 2012/0279795 A1* | 11/2012 | Furukawa et al. ............ 181/139 |
| 2013/0069481 A1* | 3/2013 | Kimura et al. ............ 310/313 R |
| 2013/0088121 A1* | 4/2013 | Yaoi et al. ................. 310/313 A |

OTHER PUBLICATIONS

Yaoi et al.; "Boundary Acoustic Wave Device"; U.S. Appl. No. 13/368,361, filed Feb. 8, 2012.

* cited by examiner

*Primary Examiner* — Mark Budd
(74) *Attorney, Agent, or Firm* — Keating & Bennett, LLP

(57) ABSTRACT

Regarding a boundary acoustic wave device in which at least a part of an IDT electrode is embedded in a groove disposed in a piezoelectric substrate, the acoustic velocity is increased. A boundary acoustic wave device is provided with a piezoelectric substrate, a first dielectric layer, and an IDT electrode. The surface of the piezoelectric substrate is provided with a groove. The IDT electrode is disposed at the boundary between the piezoelectric substrate and the first dielectric layer in such a way that at least a part thereof is located in the groove. In the inside of the groove, the groove angle γ, which is the size of an angle formed by an upper end portion of the inside surface of the groove with the surface of the piezoelectric substrate, is less than 90 degrees.

10 Claims, 28 Drawing Sheets

BOUNDARY ACOUSTIC WAVE DEVICE

BACKGROUND OF THE INVENTION

1. Field of the Invention

The present invention relates to a boundary acoustic wave device for use as a resonator and a filter device, for example. In particular, the present invention relates to a boundary acoustic wave device in which at least a portion of an IDT electrode is embedded in a groove disposed in a piezoelectric substrate.

2. Description of the Related Art

The boundary acoustic wave device is an elastic wave device which does not require a package having a cavity and which can be miniaturized as compared with a surface acoustic wave device. Therefore, the boundary acoustic wave device has attracted rising attention in recent years.

For example, WO 2008/044411 A1 described below discloses a boundary acoustic wave device in which at least a portion of an IDT electrode is embedded in a groove disposed in a piezoelectric substrate. FIG. 78 is a magnified schematic cross-sectional view showing a portion of an IDT electrode of this boundary acoustic wave device. As shown in FIG. 78, a boundary acoustic wave device 101 is provided with a LiNbO$_3$ substrate 102. A silicon oxide film 103 is disposed on the LiNbO$_3$ substrate 102. An IDT electrode 104 is disposed at the boundary between the LiNbO$_3$ substrate 102 and the silicon oxide film 103. The IDT electrode 104 is embedded in a groove 102a disposed in the LiNbO$_3$ substrate 102. The upper surface of the IDT electrode 104 must be flush with the surface of the LiNbO$_3$ substrate 102.

WO 2008/044411 A1 discloses that the upper surface of the IDT electrode 104 must be flush with the surface of the LiNbO$_3$ substrate 102, the upper surface of the silicon oxide film 103 is flat and, thereby, a low insertion loss can be realized.

However, regarding the boundary acoustic wave device 101 in which the IDT electrode 104 is embedded in the groove 102a of the LiNbO$_3$ substrate 102, there is a problem in that the acoustic velocity of propagating boundary acoustic wave cannot be increased sufficiently.

SUMMARY OF THE INVENTION

In consideration of such circumstances, preferred embodiments of the present invention increase an acoustic velocity of a boundary acoustic wave device in which at least a portion of an IDT electrode is embedded in a groove disposed in a piezoelectric substrate.

A boundary acoustic wave device according to a preferred embodiment of the present invention includes a piezoelectric substrate, a first dielectric layer, and an IDT electrode. A surface of the piezoelectric substrate is provided with a groove. The first dielectric layer is disposed on the surface of the piezoelectric substrate. The IDT electrode is disposed at a boundary between the piezoelectric substrate and the first dielectric layer in such a way that at least a portion thereof is located in the groove. Inside of the groove, a groove angle, which is the size of an angle defined by an upper end portion of an inside surface of the groove with the surface of the piezoelectric substrate, is less than about 90 degrees, for example.

In the present specification, it is defined that the surface of the piezoelectric substrate does not include the bottom surface and the side surface of the groove.

In a preferred embodiment of the present invention, a portion of the IDT electrode is located outside the groove, and the portion of the IDT electrode located outside the groove is tapered so as to decrease in size moving away from the piezoelectric substrate. Regarding this configuration, it becomes difficult to form a gap between the first dielectric layer and the IDT electrode and, therefore, degradation in filter characteristic and resonant characteristic can be prevented.

In another preferred embodiment of the present invention, the boundary acoustic wave device is further provided with a second dielectric layer which is disposed on the first dielectric layer and which has an acoustic velocity larger than that of the first dielectric layer. A boundary acoustic wave is confined in the first dielectric layer effectively by disposing the second dielectric layer. Therefore, the insertion loss can be reduced because of a waveguide effect.

In another preferred embodiment of the present invention, each of the first and the second dielectric layers is preferably made of silicon oxide, silicon nitride, or aluminum nitride, for example.

In another preferred embodiment of the present invention, the average density of the portion of the IDT electrode located in the groove is higher than the average density of the piezoelectric substrate. In the case where the groove angle is less than about 90°, the stop band can be increased by specifying the average density of the portion, which is located in the groove, of the IDT electrode to be higher than the average density of the piezoelectric substrate.

In another preferred embodiment of the present invention, at least some portion of the portion of the IDT electrode located in the groove is made of at least one type of metal selected from the group consisting of Pt, Au, W, Ta, Mo, Ni, and Cu or an alloy containing at least one type of metal selected from the group consisting of Pt, Au, W, Ta, Mo, Ni, and Cu.

In another preferred embodiment of the present invention, the IDT electrode preferably includes a laminate of a plurality of electrode layers, and a resistivity of at least one layer of the plurality of electrode layers is about 5 µΩcm or less, for example. As a result, the insertion loss can be further reduced because the resistance of the IDT electrode can be reduced.

In another preferred embodiment of the present invention, the electrode layer having a resistivity of about 5 µΩcm or less is made of at least one type of metal selected from the group consisting of Al, Cu, Au, and Ag or an alloy containing at least one type of metal selected from the group consisting of Al, Cu, Au, and Ag.

In another preferred embodiment of the present invention, the IDT electrode preferably includes a laminate of a plurality of electrode layers, and a diffusion preventing film is disposed in at least one of a location between the IDT electrode and the bottom of the groove and a location between the electrode layers adjacent to each other. According to this configuration, diffusion of an electrode material between the electrode layers can be prevented. Furthermore, the adhesion between the electrode layers adjacent to each other can be enhanced.

In another preferred embodiment of the present invention, the diffusion preventing film is made of at least one type of metal selected from the group consisting of Ti, Ni, Cr, and Ta or an alloy containing at least one type of metal selected from the group consisting of Ti, Ni, Cr, and Ta.

In another preferred embodiment of the present invention, the piezoelectric substrate is made of LiTaO$_3$, for example.

In another preferred embodiment of the present invention, the IDT electrode includes a first electrode layer, which is located in the groove of the piezoelectric substrate and which contains Pt, and a second electrode layer, which is located outside the groove of the piezoelectric substrate and which contains Al, the first dielectric layer is made of silicon oxide, and θ of the Euler Angles (φ, θ, ϕ) and the groove angle γ are within the range specified in Tables 1 to 4 below and each of φ and ϕ of the Euler Angles is within the range of 0°±5°, where the Euler Angles of the piezoelectric substrate are specified to be (φ, θ, ϕ) and the groove angle is specified to be γ. According to this configuration, in the case where the piezoelectric substrate is made of $LiTaO_3$, the stop band can be further increased.

TABLE 1

| Thickness of first dielectric layer h/λ [%] | θ of Euler Angles (φ, θ, ϕ) [°] | Thickness of first electrode layer h/λ [%] | Thickness of second electrode layer h/λ [%] | Groove angle [°] |
|---|---|---|---|---|
| 10 < h < λ ≤ 30 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 37.1 ≤ γ < 90.0 |
| | | | 7.5 < Al ≤ 12.5 | 39.9 ≤ γ < 90.0 |
| | | | 12.5 < Al ≤ 17.5 | 39.5 ≤ γ < 90.0 |
| | | 5 < Pt ≤ 7 | 2.5 < Al ≤ 7.5 | 37.7 ≤ γ < 90.0 |
| | | | 7.5 < Al ≤ 12.5 | 32.4 ≤ γ < 90.0 |
| | | | 12.5 < Al ≤ 17.5 | 29.9 ≤ γ < 90.0 |
| | | 7 < Pt ≤ 9 | 2.5 < Al ≤ 7.5 | 52.1 ≤ γ < 90.0 |
| | | | 7.5 < Al ≤ 12.5 | 57.5 ≤ γ < 90.0 |
| | | | 12.5 < Al ≤ 17.5 | 62.8 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 19.3 ≤ γ < 90.0 |
| | | | 7.5 < Al ≤ 12.5 | 32.1 ≤ γ < 90.0 |
| | | | 12.5 < Al ≤ 17.5 | 34.8 ≤ γ < 90.0 |
| | | 5 < Pt ≤ 7 | 2.5 < Al ≤ 7.5 | 38.7 ≤ γ < 90.0 |
| | | | 7.5 < Al ≤ 12.5 | 34 ≤ γ < 90.0 |
| | | | 12.5 < Al ≤ 17.5 | 30 ≤ γ < 90.0 |
| | | 7 < Pt ≤ 9 | 2.5 < Al ≤ 7.5 | 49.2 ≤ γ < 90.0 |
| | | | 7.5 < Al ≤ 12.5 | 50.3 ≤ γ < 90.0 |
| | | | 12.5 < Al ≤ 17.5 | 50.8 ≤ γ < 90.0 |
| | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.5 ≤ γ < 90.0 |
| | | | 7.5 < Al ≤ 12.5 | 27.9 ≤ γ < 90.0 |
| | | | 12.5 < Al ≤ 17.5 | 27 ≤ γ < 90.0 |
| | | 5 < Pt ≤ 7 | 2.5 < Al ≤ 7.5 | 40 ≤ γ < 90.0 |
| | | | 7.5 < Al ≤ 12.5 | 35 ≤ γ < 90.0 |
| | | | 12.5 < Al ≤ 17.5 | 32.7 ≤ γ < 90.0 |
| | | 7 < Pt ≤ 9 | 2.5 < Al ≤ 7.5 | 49.8 ≤ γ < 90.0 |
| | | | 7.5 < Al ≤ 12.5 | 39.2 ≤ γ < 90.0 |
| | | | 12.5 < Al ≤ 17.5 | 47.4 ≤ γ < 90.0 |
| | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.0 ≤ γ < 90.0 |
| | | | 7.5 < Al ≤ 12.5 | 32.5 ≤ γ < 90.0 |
| | | | 12.5 < Al ≤ 17.5 | 37.3 ≤ γ < 90.0 |
| | | 5 < Pt ≤ 7 | 2.5 < Al ≤ 7.5 | 41.3 ≤ γ < 90.0 |
| | | | 7.5 < Al ≤ 12.5 | 38.4 ≤ γ < 90.0 |
| | | | 12.5 < Al ≤ 17.5 | 35 ≤ γ < 90.0 |
| | | 7 < Pt ≤ 9 | 2.5 < Al ≤ 7.5 | 49.7 ≤ γ < 90.0 |
| | | | 7.5 < Al ≤ 12.5 | 49.8 ≤ γ < 90.0 |
| | | | 12.5 < Al ≤ 17.5 | 49.5 ≤ γ < 90.0 |

TABLE 2

| Thickness of first dielectric layer h/λ [%] | θ of Euler Angles (φ, θ, ϕ) [°] | Thickness of first electrode layer h/λ [%] | Thickness of second electrode layer h/λ [%] | Groove angle [°] |
|---|---|---|---|---|
| 10 < h < λ ≤ 30 | 140 < θ ≤ 144 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 41.5 ≤ γ < 90.0 |
| | | | 7.5 < Al ≤ 12.5 | 46.9 ≤ γ < 90.0 |
| | | | 12.5 < Al ≤ 17.5 | 46.3 ≤ γ < 90.0 |
| | | 5 < Pt ≤ 7 | 2.5 < Al ≤ 7.5 | 46.6 ≤ γ < 90.0 |
| | | | 7.5 < Al ≤ 12.5 | 41.7 ≤ γ < 90.0 |
| | | | 12.5 < Al ≤ 17.5 | 38.1 ≤ γ < 90.0 |
| | | 7 < Pt ≤ 9 | 2.5 < Al ≤ 7.5 | 51.8 ≤ γ < 90.0 |
| | | | 7.5 < Al ≤ 12.5 | 39.2 ≤ γ < 90.0 |
| | | | 12.5 < Al ≤ 17.5 | 41 ≤ γ < 90.0 |

TABLE 2-continued

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 30 < h < λ ≤ 50 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.8 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 41.2 ≤ γ < 90.0 |
| | | | 7.5 < Al ≤ 12.5 | 34.2 ≤ γ < 90.0 |
| | | | 12.5 < Al ≤ 17.5 | 32.6 ≤ γ < 90.0 |
| | | 7 < Pt ≤ 9 | 2.5 < Al ≤ 7.5 | 59.2 ≤ γ < 90.0 |
| | | | 7.5 < Al ≤ 12.5 | 58.4 ≤ γ < 90.0 |
| | | | 12.5 < Al ≤ 17.5 | 33.0 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 20 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 39.8 ≤ γ < 90.0 |
| | | | 7.5 < Al ≤ 12.5 | 36.3 ≤ γ < 90.0 |
| | | | 12.5 < Al ≤ 17.5 | 33.2 ≤ γ < 90.0 |
| | | 7 < Pt ≤ 9 | 2.5 < Al ≤ 7.5 | 59.9 ≤ γ < 90.0 |
| | | | 7.5 < Al ≤ 12.5 | 48.6 ≤ γ < 90.0 |
| | | | 12.5 < Al ≤ 17.5 | 41.2 ≤ γ < 90.0 |
| | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 20.5 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 36.9 ≤ γ < 90.0 |
| | | | 7.5 < Al ≤ 12.5 | 35.8 ≤ γ < 90.0 |
| | | | 12.5 < Al ≤ 17.5 | 33.4 ≤ γ < 90.0 |
| | | 7 < Pt ≤ 9 | 2.5 < Al ≤ 7.5 | 38.5 ≤ γ < 90.0 |
| | | | 7.5 < Al ≤ 12.5 | 36.2 ≤ γ < 90.0 |
| | | | 12.5 < Al ≤ 17.5 | 37.4 ≤ γ < 90.0 |

TABLE 3

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 30 < h < λ ≤ 50 | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 22.5 ≤ γ < 90.0 |
| | | | 7.5 < Al ≤ 12.5 | 19.3 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 40.5 ≤ γ < 90.0 |
| | | | 7.5 < Al ≤ 12.5 | 30.7 ≤ γ < 90.0 |
| | | | 12.5 < Al ≤ 17.5 | 32.3 ≤ γ < 90.0 |
| | | 7 < Pt ≤ 9 | 2.5 < Al ≤ 7.5 | 46 ≤ γ < 90.0 |
| | | | 7.5 < Al ≤ 12.5 | 45 ≤ γ < 90.0 |
| | | | 12.5 < Al ≤ 17.5 | 36.3 ≤ γ < 90.0 |
| | 140 < θ ≤ 144 | 1 < Pt ≤ 3 | 2.5 < Al ≤ 7.5 | 19 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 26.7 ≤ γ < 90.0 |
| | | | 7.5 < Al ≤ 12.5 | 22.7 ≤ γ < 90.0 |
| | | | 12.5 < Al ≤ 17.5 | 18.1 ≤ γ < 90.0 |
| | | 5 < Pt ≤ 7 | 2.5 < Al ≤ 7.5 | 41.8 ≤ γ < 90.0 |
| | | | 7.5 < Al ≤ 12.5 | 39.9 ≤ γ < 90.0 |
| | | | 12.5 < Al ≤ 17.5 | 40.7 ≤ γ < 90.0 |
| | | 7 < Pt ≤ 9 | 2.5 < Al ≤ 7.5 | 46.9 ≤ γ < 90.0 |
| | | | 7.5 < Al ≤ 12.5 | 46.1 ≤ γ < 90.0 |
| | | | 12.5 < Al ≤ 17.5 | 45.7 ≤ γ < 90.0 |
| 50 < h < λ ≤ 70 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 56.8 ≤ γ < 90.0 |
| | | | 7.5 < Al ≤ 12.5 | 46.2 ≤ γ < 90.0 |
| | | | 12.5 < Al ≤ 17.5 | 36.5 ≤ γ < 90.0 |

TABLE 3-continued

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| | | 5 < Pt ≤ 7 | 2.5 < Al ≤ 7.5 | 33.8 ≤ γ < 90.0 |
| | | | 7.5 < Al ≤ 12.5 | 29.4 ≤ γ < 90.0 |
| | | | 12.5 < Al ≤ 17.5 | 26.1 ≤ γ < 90.0 |
| | | 7 < Pt ≤ 9 | 2.5 < Al ≤ 7.5 | 57.2 ≤ γ < 90.0 |
| | | | 7.5 < Al ≤ 12.5 | 51.9 ≤ γ < 90.0 |
| | | | 12.5 < Al ≤ 17.5 | 39.9 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 54.1 ≤ γ < 90.0 |
| | | | 7.5 < Al ≤ 12.5 | 40.9 ≤ γ < 90.0 |
| | | | 12.5 < Al ≤ 17.5 | 35.8 ≤ γ < 90.0 |
| | | 5 < Pt ≤ 7 | 2.5 < Al ≤ 7.5 | 48.7 ≤ γ < 90.0 |
| | | | 7.5 < Al ≤ 12.5 | 40.6 ≤ γ < 90.0 |
| | | | 12.5 < Al ≤ 17.5 | 53.7 ≤ γ < 90.0 |
| | | 7 < Pt ≤ 9 | 2.5 < Al ≤ 7.5 | 51.6 ≤ γ < 90.0 |
| | | | 7.5 < Al ≤ 12.5 | 50.6 ≤ γ < 90.0 |
| | | | 12.5 < Al ≤ 17.5 | 46 ≤ γ < 90.0 |

TABLE 4

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 50 < h < λ ≤ 70 | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.0 ≤ γ < 90.0 |
| | | | 7.5 < Al ≤ 12.5 | 42.6 ≤ γ < 90.0 |
| | | | 12.5 < Al ≤ 17.5 | 27.6 ≤ γ < 90.0 |
| | | 5 < Pt ≤ 7 | 2.5 < Al ≤ 7.5 | 34.2 ≤ γ < 90.0 |
| | | | 7.5 < Al ≤ 12.5 | 32.2 ≤ γ < 90.0 |
| | | | 12.5 < Al ≤ 17.5 | 43 ≤ γ < 90.0 |
| | | 7 < Pt ≤ 9 | 2.5 < Al ≤ 7.5 | 44.6 ≤ γ < 90.0 |
| | | | 7.5 < Al ≤ 12.5 | 49.9 ≤ γ < 90.0 |
| | | | 12.5 < Al ≤ 17.5 | 45.2 ≤ γ < 90.0 |
| | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 19.7 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 34.4 ≤ γ < 90.0 |
| | | | 7.5 < Al ≤ 12.5 | 33 ≤ γ < 90.0 |
| | | | 12.5 < Al ≤ 17.5 | 30.1 ≤ γ < 90.0 |
| | | 7 < Pt ≤ 9 | 2.5 < Al ≤ 7.5 | 41.2 ≤ γ < 90.0 |
| | | | 7.5 < Al ≤ 12.5 | 48 ≤ γ < 90.0 |
| | | | 12.5 < Al ≤ 17.5 | 44 ≤ γ < 90.0 |
| | 140 < θ ≤ 144 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 26.3 ≤ γ < 90.0 |
| | | | 7.5 < Al ≤ 12.5 | 19.4 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 45 ≤ γ < 90.0 |
| | | | 7.5 < Al ≤ 12.5 | 43.2 ≤ γ < 90.0 |
| | | | 12.5 < Al ≤ 17.5 | 39.5 ≤ γ < 90.0 |
| | | 7 < Pt ≤ 9 | 2.5 < Al ≤ 7.5 | 48.9 ≤ γ < 90.0 |
| | | | 7.5 < Al ≤ 12.5 | 48.1 ≤ γ < 90.0 |
| | | | 12.5 < Al ≤ 17.5 | 48 ≤ γ < 90.0 |

In another preferred embodiment of the present invention, the piezoelectric substrate is made of $LiNbO_3$, for example.

In another preferred embodiment of the present invention, the following relationships $-5°≤\phi≤5°$, $+80°≤\theta≤+130°$, $-10°≤\phi≤+10°$, and $10°≤\gamma<90°$ are satisfied, where the Euler Angles of the piezoelectric substrate are specified to be ($\phi$, $\theta$, $\phi$) and the groove angle is specified to be $\gamma$. Regarding this configuration, in the case where the piezoelectric substrate is made of $LiNbO_3$ and a boundary acoustic wave in a SH (Shear Horizontal) mode is utilized, the stop band can be further increased.

In another preferred embodiment of the present invention, the following relationships $-5°≤\phi≤+5°$, $+200°≤\theta≤+250°$, $-10°≤\phi≤+10°$, and $10°≤\gamma<90°$ are satisfied, where the Euler Angles of the piezoelectric substrate are specified to be ($\phi$, $\theta$, $\phi$) and the groove angle is specified to be $\gamma$. Regarding this configuration, in the case where the piezoelectric substrate is made of LiNbO₃ and a boundary acoustic wave in a Stoneley mode is utilized, the stop band can be further increased.

In another preferred embodiment of the present invention, the groove angle is preferably within the range of about 10° or more and about 80° or less. Regarding this configuration, the acoustic velocity can be further increased.

According to various preferred embodiments of the present invention, a boundary acoustic wave device including a piezoelectric substrate, a first dielectric layer disposed on the piezoelectric substrate, and an IDT electrode disposed at a boundary between the piezoelectric substrate and the first dielectric layer, a groove angle of a groove in the piezoelectric substrate, in which at least a portion of the IDT electrode is embedded, is preferably less than about 90 degrees and, thereby, the acoustic velocity can be further increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear by explaining preferred embodiments below with reference to drawings.

Figure 1:
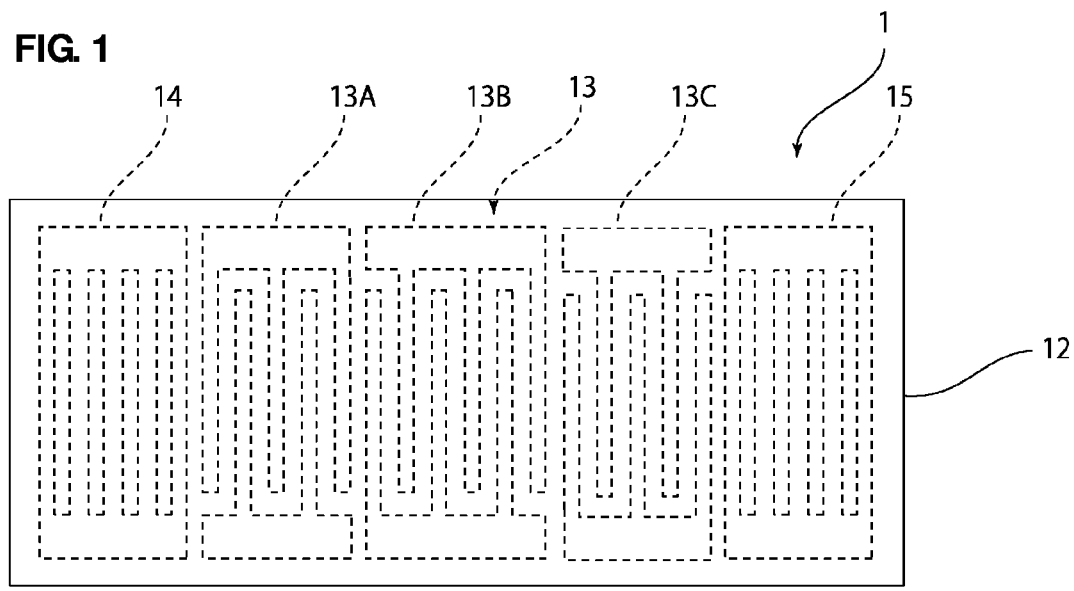
FIG. 1 is a schematic plan view of a boundary acoustic wave device according to a preferred embodiment of the present invention.
Figure 2:
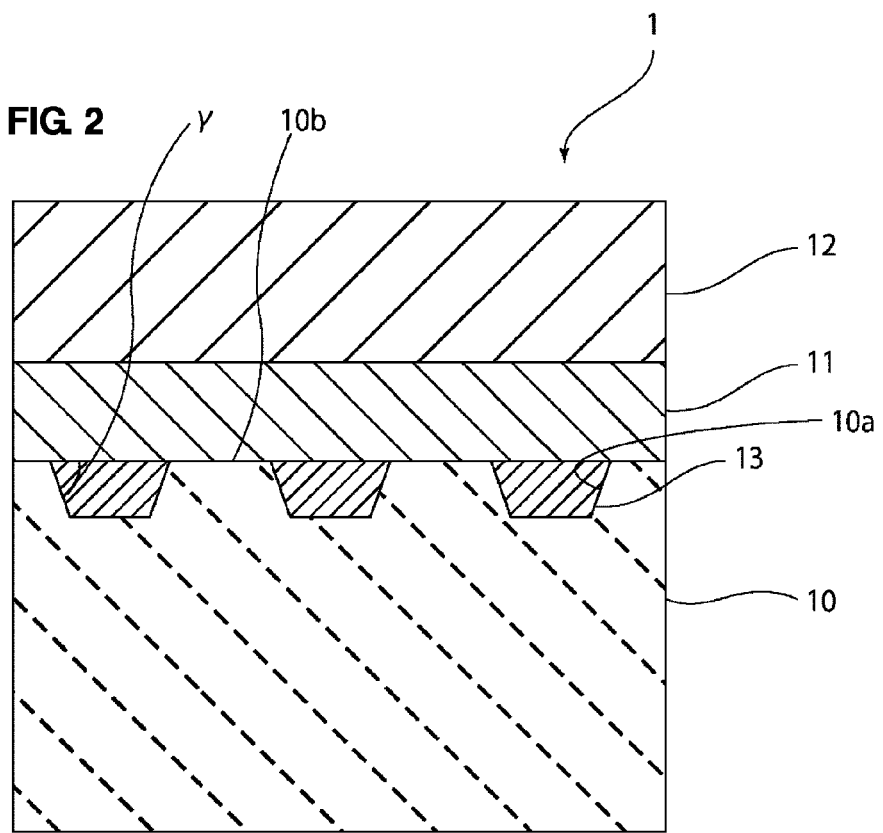
FIG. 2 is a schematic cross-sectional view of a boundary acoustic wave device.

FIG. 1 is a schematic plan view of a boundary acoustic wave device according to the present preferred embodiment. FIG. 2 is a schematic cross-sectional view of the boundary acoustic wave device according to the present preferred embodiment. As shown in FIG. 2, a boundary acoustic wave device 1 preferably is a so-called three-media boundary acoustic wave device and is provided with a piezoelectric substrate 10 and first and second dielectric layers 11 and 12.

The piezoelectric substrate 10 is not specifically limited insofar as it is formed from a piezoelectric material. The piezoelectric substrate 10 can be made of, for example, a LiNbO₃ substrate or a LiTaO₃ substrate.

A first dielectric layer 11 is disposed on the piezoelectric substrate 10. A second dielectric layer 12 is disposed on the first dielectric layer 11. The acoustic velocity of the second dielectric layer 12 is larger than the acoustic velocity of the first dielectric layer 11.

The materials for the first and second dielectric layers 11 and 12 are not specifically limited insofar as the acoustic velocity of the second dielectric layer 12 is larger than the acoustic velocity of the first dielectric layer 11. For example, the first and second dielectric layers 11 and 12 can be made of aluminum nitride, e.g., AlN, besides silicon oxides, e.g., SiO₂, silicon nitrides, e.g., SiN, and the like.

More specifically, for example, the first dielectric layer 11 can be made of silicon oxides, e.g., SiO₂, and the second dielectric layer 12 can be made of a silicon nitride, e.g., SiN, or an aluminum nitride, e.g., AlN.

An IDT electrode 13 is disposed at the boundary between the piezoelectric substrate 10 and the first dielectric layer 11. At least a portion of the IDT electrodes 13 are located in a plurality of grooves 10a disposed in the piezoelectric substrate 10. That is, at least a portion of the IDT electrodes 13 are embedded in a plurality of grooves 10a disposed in the piezoelectric substrate 10. Specifically, in the present preferred embodiment, the whole IDT electrode 13 is embedded in the groove 10a. The surface of the IDT electrode 13 is preferably flush with the surface 10b of the piezoelectric substrate 10.

As shown in FIG. 1, in the present preferred embodiment, the IDT electrode 13 includes first to third IDT electrodes 13A, 13B, and 13C, each preferably defined by a pair of comb-shaped electrodes which are interdigitated with each other. The first to the third IDT electrodes 13A, 13B, and 13C are arranged along the propagation direction of the boundary acoustic wave. Grating reflectors 14 and 15 are disposed on both sides of the first to the third IDT electrodes 13A, 13B, and 13C in the propagation direction of the boundary acoustic wave. These grating reflectors 14 and 15 are also embedded in the groove 10a disposed in the piezoelectric substrate 10.

As shown in FIG. 2, the cross-sectional shape of the groove 10a, in which the IDT electrode 13 is embedded, is specified to be a shape having a width which decreases with decreasing away from the surface 10b of the piezoelectric substrate 10. In the present preferred embodiment, the cross-sectional shape of the groove 10a is preferably nearly trapezoidal. In this regard, among the angles formed by an upper end portion, which is located on the surface 10b side of the piezoelectric substrate 10, of the inside surface of the groove 10a with the surface 10b of the piezoelectric substrate 10, the size of an angle (groove angle) γ located on the side inside the groove 10a is specified to be less than about 90 degrees, for example. Consequently, the acoustic velocity of the boundary acoustic wave generated in the IDT electrode 13 is increased, as described below.

Figure 3:
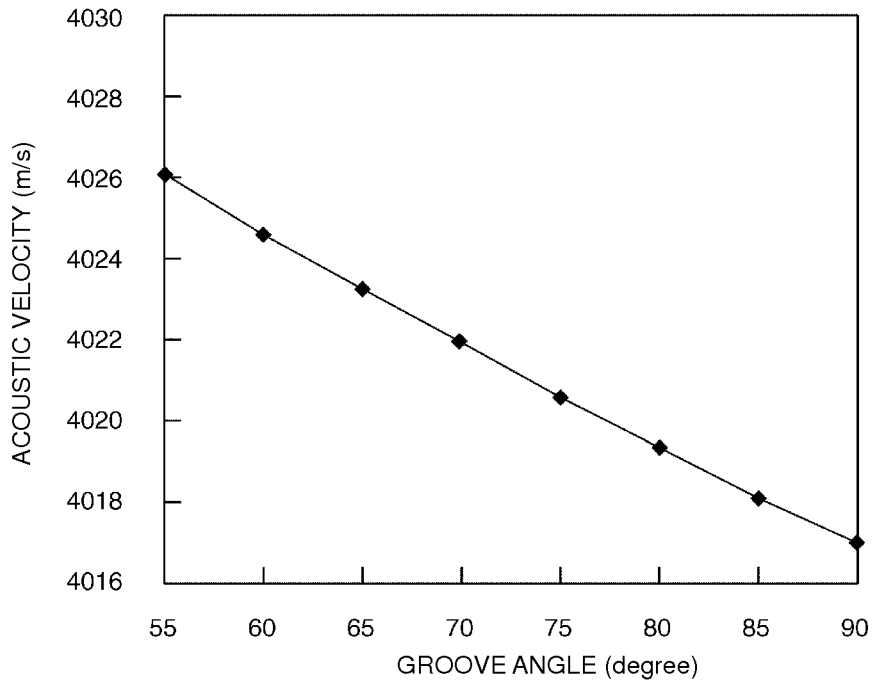
FIG. 3 is a graph showing the relationship between the groove angle γ and the acoustic velocity of a boundary acoustic wave in the case where an IDT electrode is made of Al.

FIG. 3 is a graph showing the relationship between the groove angle γ and the acoustic velocity of a boundary acoustic wave in the case where the IDT electrode 13 is made of Al. As is clear from the results shown in FIG. 3, the acoustic velocity of the boundary acoustic wave can be increased as compared with that in the case where the groove angle is about 90° by setting the groove angle γ to be less than about 90°. Furthermore, it is clear that in the case where the IDT electrode 13 disposed in the groove 10a is made of Al having a low density, the acoustic velocity of the boundary acoustic wave increases linear functionally as the groove angle γ decreases.

Figure 4:
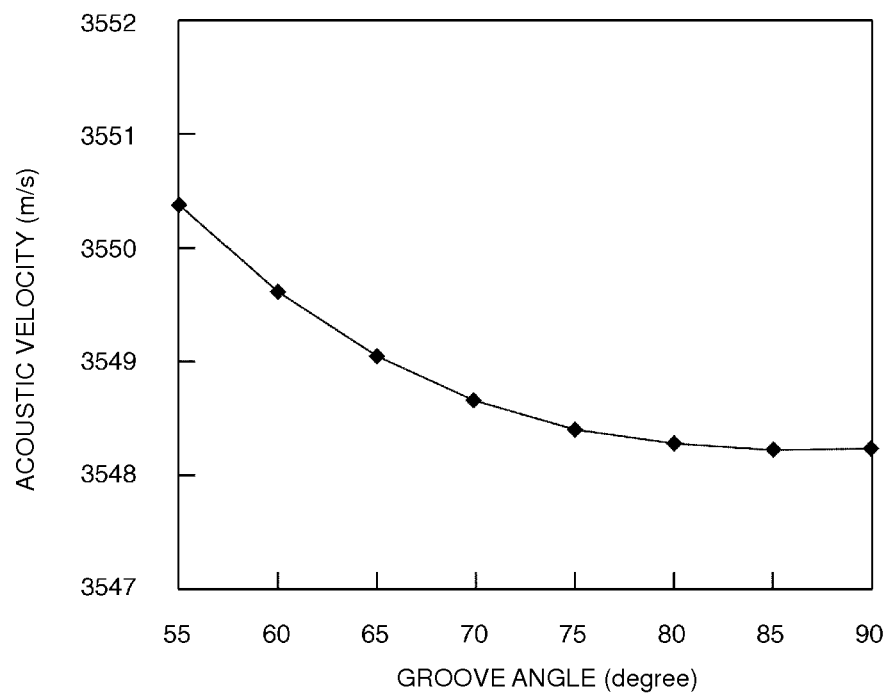
FIG. 4 is a graph showing the relationship between the groove angle γ and the acoustic velocity of a boundary acoustic wave in the case where an IDT electrode is made of Pt.

FIG. 4 is a graph showing the relationship between the groove angle γ and the acoustic velocity of a boundary acoustic wave in the case where the IDT electrode 13 is preferably made of Pt. As is clear from the results shown in FIG. 4, in the case where the IDT electrode 13 is made of Pt as well, the acoustic velocity of the boundary acoustic wave can also be increased as compared with that in the case where the groove angle is about 90° by setting the groove angle γ to be less than about 90°. However, it is clear that in the case where the IDT electrode 13 disposed in the groove 10a is made of Pt having a high density, the rate of change in acoustic velocity of the boundary acoustic wave relative to a decrease in groove angle γ tends to increase as the groove angle γ decreases. If the groove angle γ is larger than about 80°, the acoustic velocity of the boundary acoustic wave does not increase significantly as the groove angle γ decreases. On the other hand, if the groove angle γ is about 80° or less, the acoustic velocity of the boundary acoustic wave increases significantly as the groove angle γ decreases.

From these results, the acoustic velocity of the boundary acoustic wave can be increased as compared with that in the case where the groove angle γ is about 90° by setting the groove angle γ to be less than about 90° regardless of the type of the IDT electrode 13. In this regard, it is preferable that the groove angle γ is about 80° or less, for example. The acoustic velocity of the boundary acoustic wave can be increased significantly regardless of the type of the IDT electrode 13 by setting the groove angle γ to be about 80° or less.

The lower limit of the groove angle γ is not specifically limited with respect to the relationship with the acoustic velocity of the boundary acoustic wave. However, the lower limit of the groove angle γ is, for example, preferably about 10°, preferably about 30°, preferably about 45°, and more preferably about 55°.

The design parameters of the boundary acoustic wave devices which exhibit the acoustic velocities of the boundary acoustic wave shown in FIGS. 3 and 4 are as described below.

Piezoelectric substrate 10: LiTaO₃ substrate having rotation angles of (0, 138°, 0)

Electrode finger ratio (duty) of IDT electrode 13: 0.5

First dielectric layer 11: SiO₂ layer (film thickness normalized by wave length: 40%)

Second dielectric layer 12: SiN layer (film thickness normalized by wave length: 100%)

Figure 5:
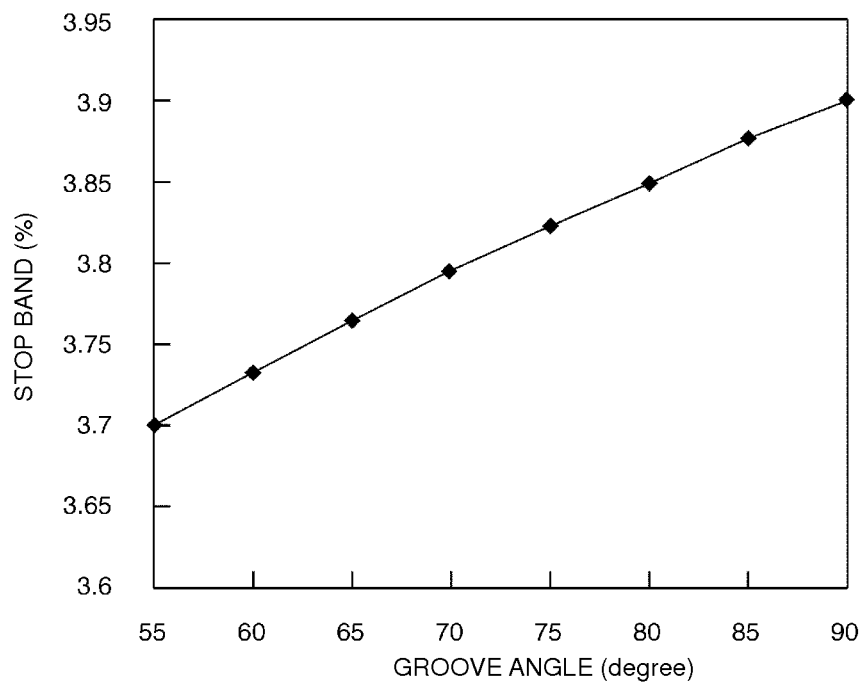
FIG. 5 is a graph showing the relationship between the groove angle γ and the stop band in the case where an IDT electrode is made of Al.
Figure 6:
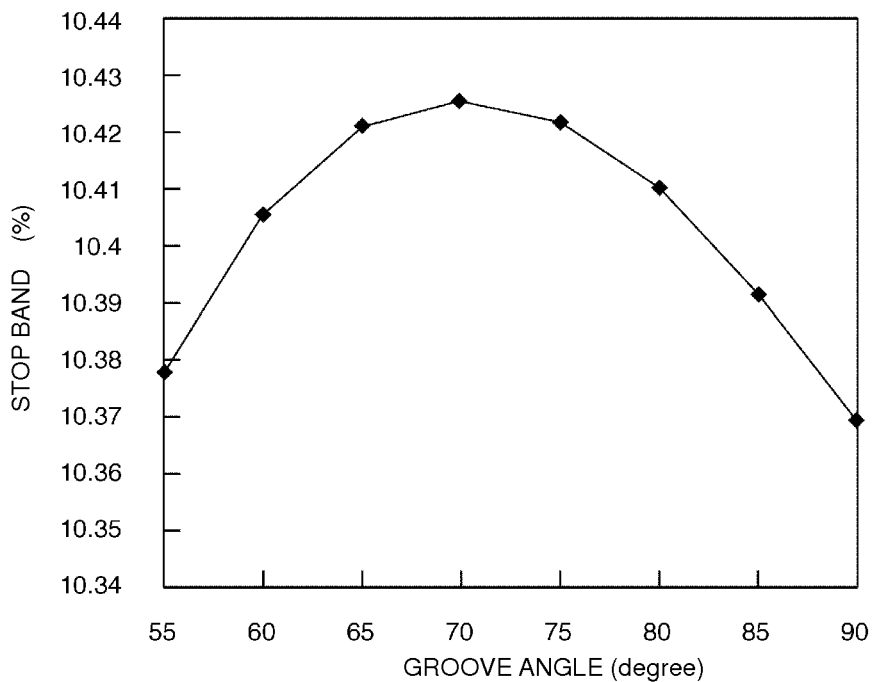
FIG. 6 is a graph showing the relationship between the groove angle γ and the stop band in the case where an IDT electrode is made of Pt.

Next, regarding the case shown in FIG. 3 where the IDT electrode 13 is made of Al, the relationship between the groove angle and the stop band will be described. The results thereof are shown in FIG. 5. Likewise, regarding the case shown in FIG. 4 where the IDT electrode 13 is made of Pt, the relationship between the groove angle and the stop band will be described. The results thereof are shown in FIG. 6.

As shown in FIG. 5, in the case where the IDT electrode 13 is made of Al having a low density, the stop band tends to become small as the groove angle γ becomes small. In the case where the IDT electrode 13 is made of Al having a low density, the stop band tends to linear functionally become small as the groove angle γ becomes small.

On the other hand, in the case where the IDT electrode 13 is made of Pt having a high density and the groove angle is less than about 90°, the stop band tends to become larger than that in the case where the groove angle γ is about 90°.

As is clear from these results, the stop band can be increased while the acoustic velocity of the boundary acoustic wave is increased by specifying the groove angle γ to be less than about 90° and, in addition, forming the IDT electrode 13 of a high-density, electrically conductive material, e.g., Pt.

In this regard, as is clear from the results shown in FIG. 6, in the case where the IDT electrode 13 is made of Pt having a high density, the acoustic velocity of the boundary acoustic wave does not linear functionally increase as the groove angle γ decreases. In the range of the groove angle γ of about 90° to about 70°, the stop band tends to increase monotonously as the groove angle γ decreases, although in the range of the groove angle γ less than about 70°, the stop band tends to decrease monotonously as the groove angle γ decreases. However, even in the case where the groove angle γ is about 55°, the stop band is larger than that in the case where the groove angle γ is about 90°. Therefore, it is clear that in the case where the IDT electrode 13 is made of Pt, in order to increase the stop band, the groove angle γ is preferably less than about 90° and about 55° or more, and further preferably about 70°.

Next, the relationship between the electrode density of the IDT electrode 13 and the stop band was determined. In each of the case where the groove angle γ is about 60° and the case where the groove angle γ is about 90°, when the average density of the IDT electrode 13 is changed variously, the relationship with the size of the stop band is shown in Table 5 described below.

TABLE 5

| Density of IDT electrode 13 | Stop band | |
|---|---|---|
| (g/cm³) | Groove angle γ = 60° | Groove angle γ = 90° |
| 2.69 | 1.873 | 1.960 |
| 4.54 | 1.500 | 1.735 |
| 8.93 | 0.444 | 0.360 |
| 16.6 | 6.278 | 6.217 |
| 21.37 | 10.411 | 10.368 |

As shown in Table 5 described above, in the case where the average density of the IDT electrode 13 is smaller than the density (about 7.45 g/cm³) of the piezoelectric substrate 10 (LiTaO₃ substrate), the stop band in the case where the groove angle γ was about 90° was larger than that in the case where the groove angle γ was about 60°. On the other hand, in the case where the average density of the IDT electrode 13 is larger than the density (about 7.45 g/cm³) of the piezoelectric substrate 10, the stop band in the case where the groove angle γ was about 60° was larger than that in the case where the groove angle γ was about 90°. As is clear from these results, in the case where the IDT electrode 13 is embedded in the groove 10a completely and the surface of the IDT electrode 13 is flush with the surface 10b of the piezoelectric substrate 10, the effect that the stop band is increased by reducing the groove angle γ is obtained when the average density of the IDT electrode 13 is larger than the average density of the piezoelectric substrate 10. That is, it is clear that the stop band can be increased while the acoustic velocity of the boundary acoustic wave is increased by making the average density of the IDT electrode 13 larger than the average density of the piezoelectric substrate 10 and, in addition, specifying the groove angle γ to be less than about 90°.

Therefore, the material for the IDT electrode 13 located in the groove 10a is not specifically limited insofar as the material is an electrically conductive material. However, it is preferable that at least a portion of the IDT electrode 13 is made of a high-density, electrically conductive material, e.g., one type of metal selected from the group consisting of Pt, Au, W, Ta, Mo, Ni, and Cu or an alloy containing at least one type of metal selected from the group consisting of Pt, Au, W, Ta, Mo, Ni, and Cu.

The modified preferred embodiments of the above-described preferred embodiments will be described below. In this regard, in the following explanations, members having substantially the same functions as the members in the above-described first preferred embodiment will be indicated by the same reference numerals as those set forth above and explanations thereof will be omitted.

First Modified Preferred Embodiment

In the above-described first preferred embodiment, the example in which the whole IDT electrode 13 is embedded in the groove 10a and the IDT electrode 13 includes a single electrically conductive layer, is explained. However, the present invention is not limited to this configuration. For example, only a portion of the IDT electrode 13 may be embedded in the groove 10a and the other portion may be located on the side upper than the surface 10b of the piezoelectric substrate 10. Furthermore, the IDT electrode 13 may include a laminate of a plurality of electrically conductive layers.

Figure 7:
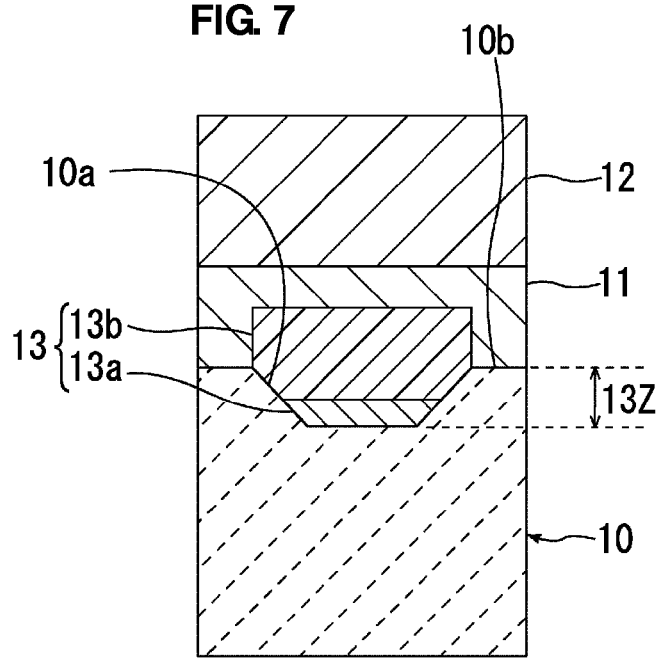
FIG. 7 is a magnified schematic cross-sectional view of a portion of an IDT electrode in a first modified preferred embodiment of the present invention.

In the present modified preferred embodiment, as shown in FIG. 7, the IDT electrode 13 preferably includes an electrode layer laminate of a first electrode layer 13a, which is disposed on the piezoelectric substrate 10 in such a way that at least a portion thereof is located in the groove 10a, and a second electrode layer 13b, which is laminated on the first electrode layer 13a. A portion of the IDT electrode 13 is located on the side upper than the surface 10b of the piezoelectric substrate 10. More specifically, the first electrode layer 13a is disposed in the groove 10a. Then, a portion of the second electrode layer 13b is located in the groove 10a, and the remainder portion is located on the side upper than the surface 10b of the piezoelectric substrate 10.

Figure 79:
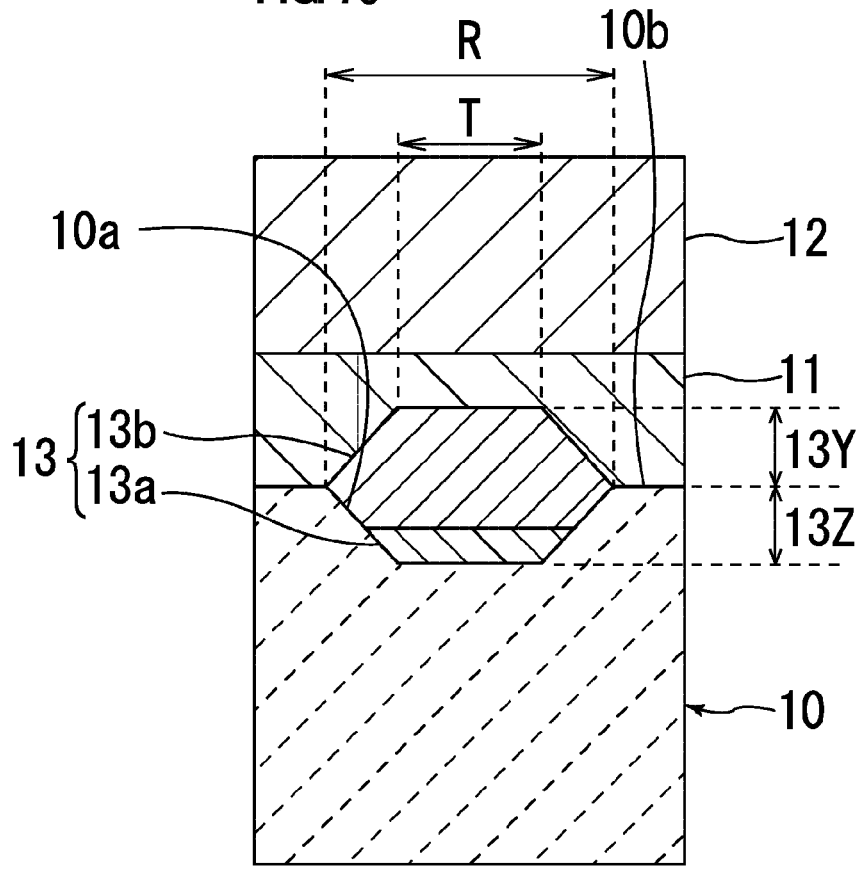
FIG. 79 is a magnified schematic cross-sectional view of a portion of an IDT electrode in a ninth modified preferred embodiment of the present invention.
Figure 80:
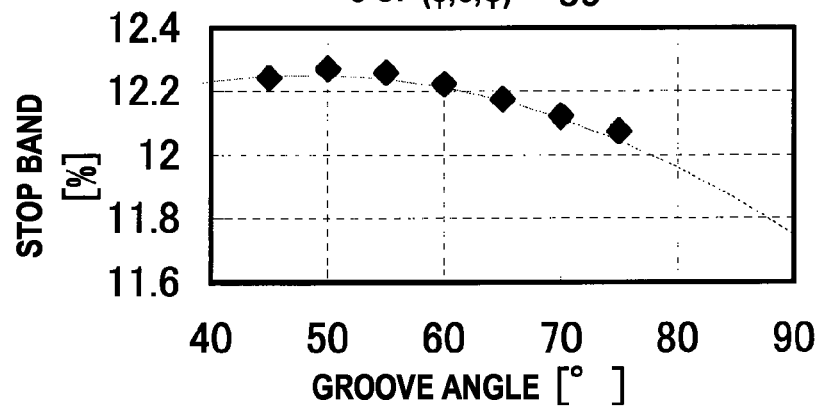
FIG. 80 shows the relationship between the groove angle (γ) and the stop band, where the cross-sectional shape is as shown in FIG. 17 and the piezoelectric substrate is formed from a LiNbO₃ substrate having Euler Angles of (0, 85°, 0).
Figure 81:
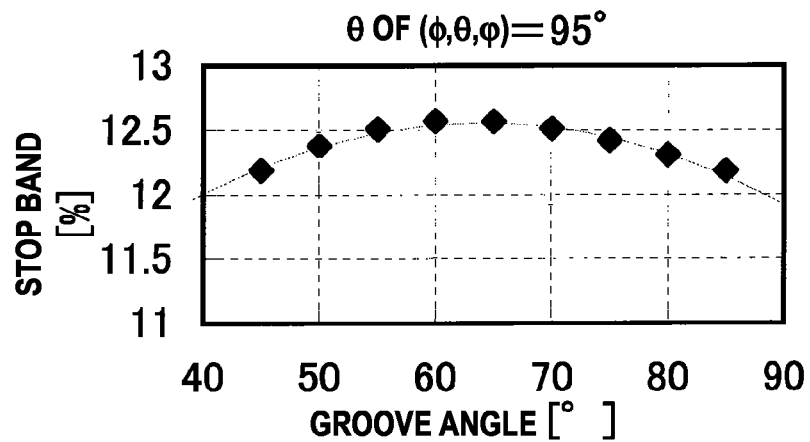
FIG. 81 shows the relationship between the groove angle (γ) and the stop band, where the cross-sectional shape is as shown in FIG. 17 and the piezoelectric substrate is formed from a LiNbO₃ substrate having Euler Angles of (0, 95°, 0).
Figure 82:
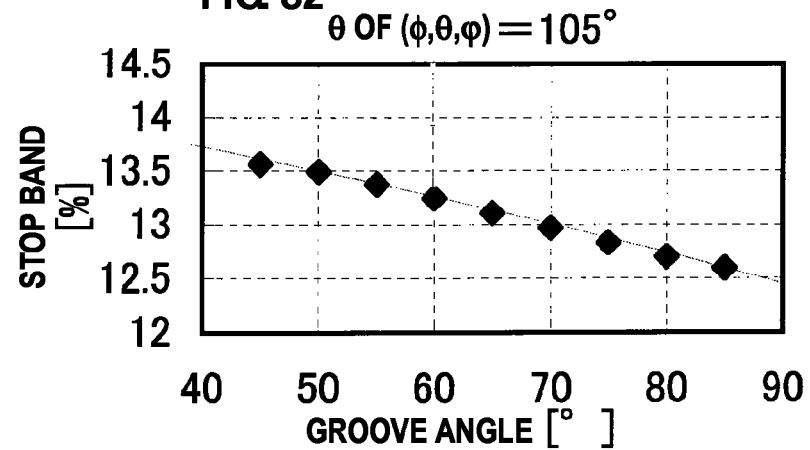
FIG. 82 shows the relationship between the groove angle (γ) and the stop band, where the cross-sectional shape is as shown in FIG. 17 and the piezoelectric substrate is formed from a LiNbO₃ substrate having Euler Angles of (0, 105°, 0).
Figure 83:
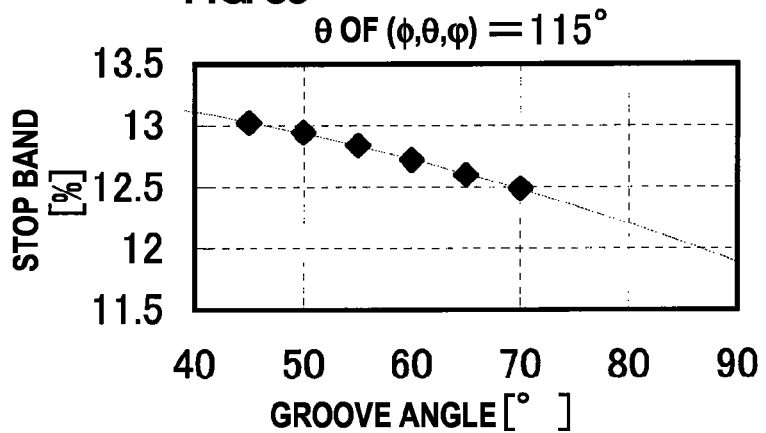
FIG. 83 shows the relationship between the groove angle (γ) and the stop band, where the cross-sectional shape is as shown in FIG. 17 and the piezoelectric substrate is formed from a LiNbO₃ substrate having Euler Angles of (0, 115°, 0).
Figure 84:
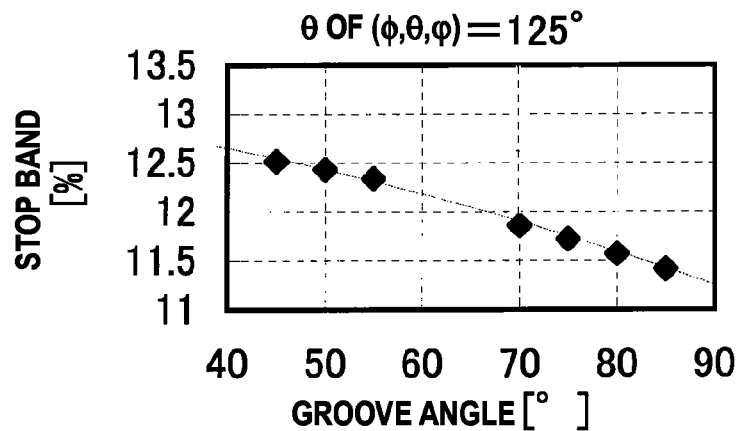
FIG. 84 shows the relationship between the groove angle (γ) and the stop band, where the cross-sectional shape is as shown in FIG. 17 and the piezoelectric substrate is formed from a LiNbO₃ substrate having Euler Angles of (0, 125°, 0).
Figure 85:
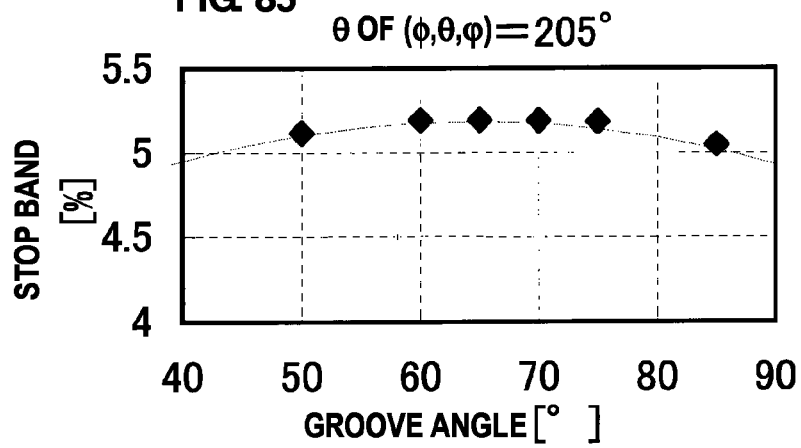
FIG. 85 shows the relationship between the groove angle (γ) and the stop band, where the cross-sectional shape is as shown in FIG. 17 and the piezoelectric substrate is formed from a LiNbO₃ substrate having Euler Angles of (0, 205°, 0).
Figure 86:
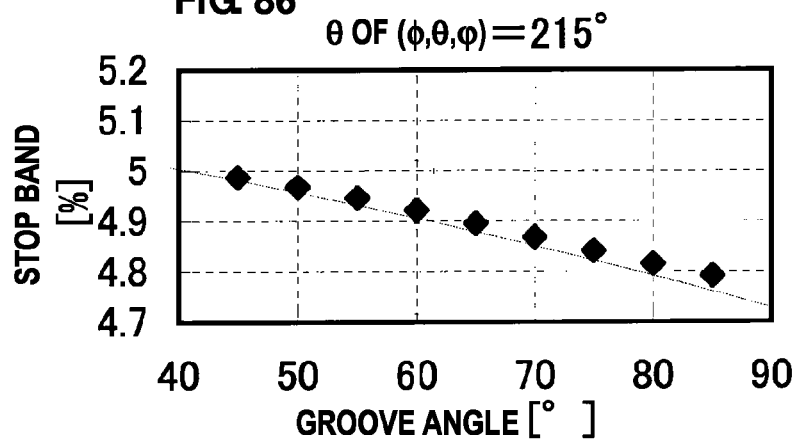
FIG. 86 shows the relationship between the groove angle (γ) and the stop band, where the cross-sectional shape is as shown in FIG. 17 and the piezoelectric substrate is formed from a LiNbO₃ substrate having Euler Angles of (0, 215°, 0).
Figure 87:
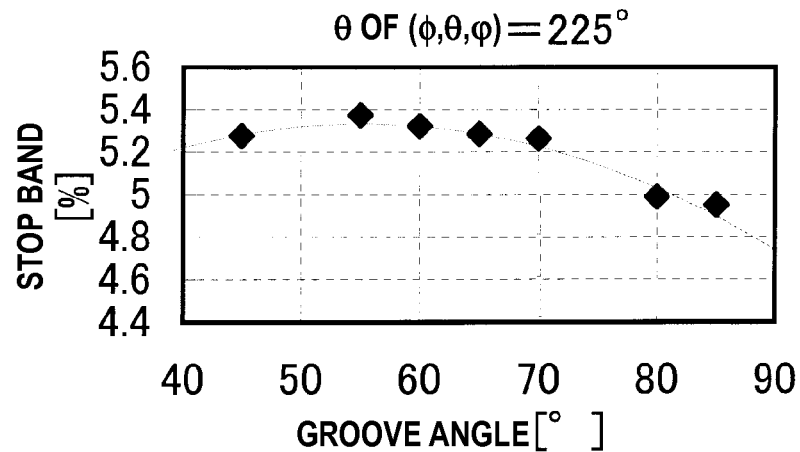
FIG. 87 shows the relationship between the groove angle (γ) and the stop band, where the cross-sectional shape is as shown in FIG. 17 and the piezoelectric substrate is formed from a LiNbO₃ substrate having Euler Angles of (0, 225°, 0).
Figure 88:
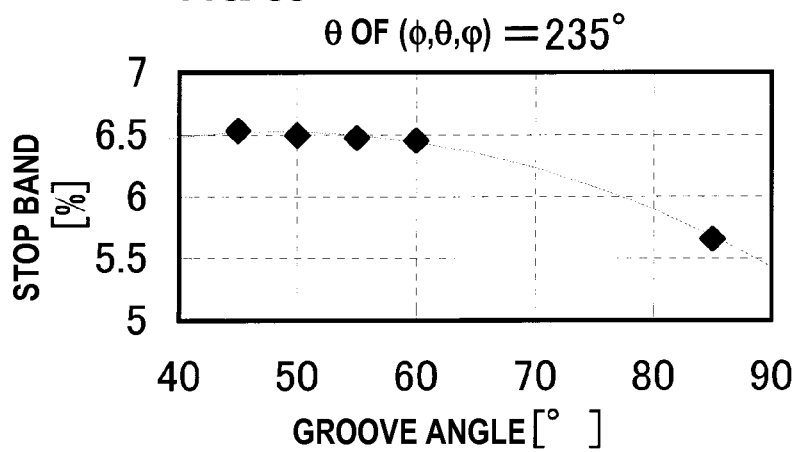
FIG. 88 shows the relationship between the groove angle (γ) and the stop band, where the cross-sectional shape is as shown in FIG. 17 and the piezoelectric substrate is formed from a LiNbO₃ substrate having Euler Angles of (0, 235°, 0).
Figure 89:
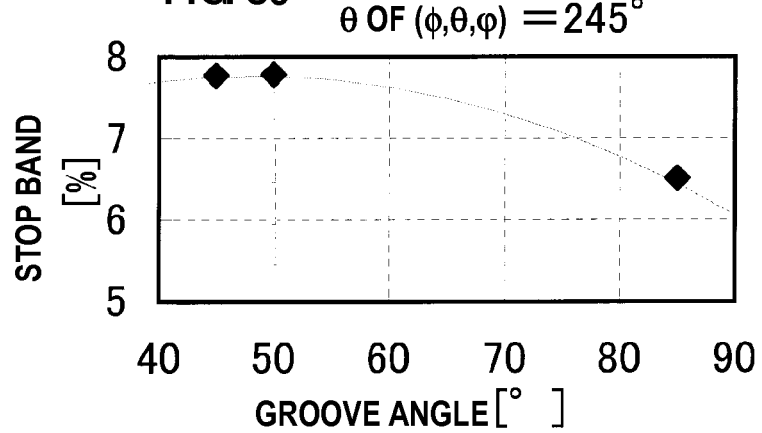
FIG. 89 shows the relationship between the groove angle (γ) and the stop band, where the cross-sectional shape is as shown in FIG. 17 and the piezoelectric substrate is formed from a LiNbO₃ substrate having Euler Angles of (0, 245°, 0).

Alternatively, as shown in FIG. 79, a portion 13Y, which is located outside the groove 10a, of the IDT electrode 13 may taper with decreasing distance away from the piezoelectric substrate 10. In the example shown in FIG. 79, the cross-sectional shape of the portion 13Y, which is located outside the groove 10a, of the IDT electrode 13 preferably has a nearly trapezoidal shape in which the length T of the upper base is smaller than the length R of the lower base.

As shown in FIG. 79, the portion 13Y, which is located outside the groove 10a, of the IDT electrode 13 is specified to have a tapered shape and, thereby, a gap is not formed easily between the first dielectric layer 11 and the IDT electrode 13. Therefore, scattering of a boundary acoustic wave due to formation of a gap between the first dielectric layer 11 and the IDT electrode 13 can be suppressed. As a result, degradation in characteristics, e.g., an insertion loss, can be suppressed.

Meanwhile, in the case where the first dielectric layer 11 is made of silicon oxide, degradation in temperature characteristics of frequency due to formation of a gap between the first dielectric layer 11 and the IDT electrode 13 can also be suppressed.

In this regard, the cross-sectional shape of the portion 13Y, which is located outside the groove 10a, of the IDT electrode 13 is not limited to the nearly trapezoidal shape and may be a semi-elliptic shape, a semi-oval shape, a triangular shape, or the like.

The first electrode layer 13a is made of a material, e.g., at least one type of metal selected from the group consisting of Pt, Au, W, Ta, Mo, Ni, and Cu or an alloy containing at least one type of metal selected from the group consisting of Pt, Au, W, Ta, Mo, Ni, and Cu, having a density higher than the piezoelectric substrate 10. Furthermore, the average density of a portion 13Z, which is located in the groove 10a, of the IDT electrode 13 is specified to become higher than the average density of the piezoelectric substrate 10. That is, the average density of the first electrode layer 13a and the portion, which is located in the groove 10a, of the second electrode layer 13b is specified to become higher than the average density of the piezoelectric substrate 10. Concretely, in the present preferred embodiment, the first electrode layer is made of Pt, and the second electrode layer is made of Al.

Table 6 described below shows the average density of the portion 13Z, which is located in the groove 10a, of the IDT electrode 13, where the ratio of the thickness of the first electrode layer 13a to the thickness of the portion, which is located in the groove 10a, of the second electrode layer 13b is changed variously.

Figure 8:
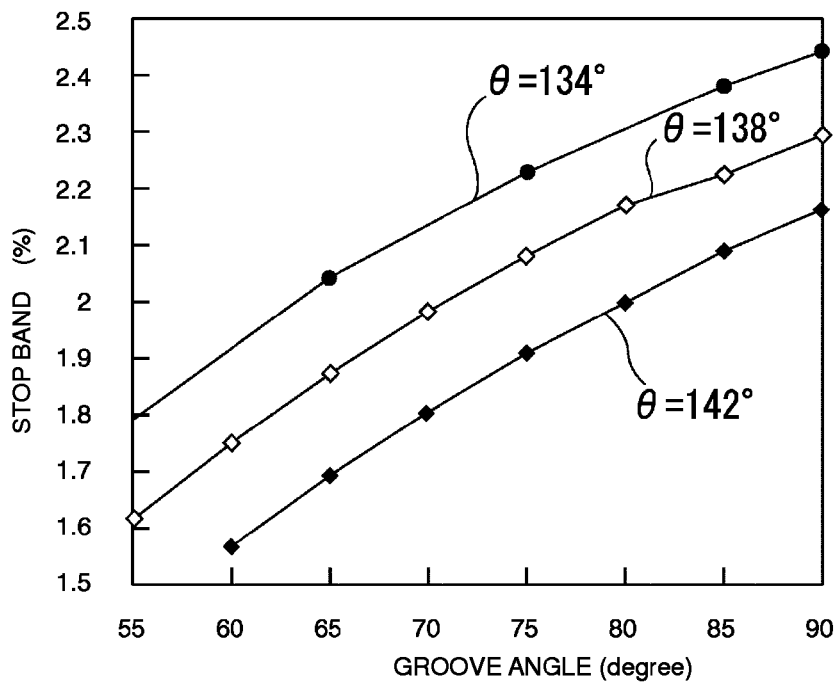
FIG. 8 is a graph showing the relationship between the groove angle γ and the stop band, where the film thickness of a first electrode layer normalized by the wave length is about 1%, the film thickness of a portion, which is located in a groove 10a, of a second electrode layer normalized by the wave length is about 5%, and the film thickness of a portion, which is located outside the groove 10a, of the second electrode layer normalized by the wave length is about 10%.

Moreover, FIG. 8 shows the relationship between the groove angle γ and the stop band, where the film thickness of the first electrode layer 13a normalized by the wave length is 1%, the film thickness of the portion, which is located in the groove 10a, of the second electrode layer 13b normalized by the wave length is 5%, and the film thickness of the portion, which is located outside the groove 10a, of the second electrode layer 13b normalized by the wave length is 10%.

Figure 9:
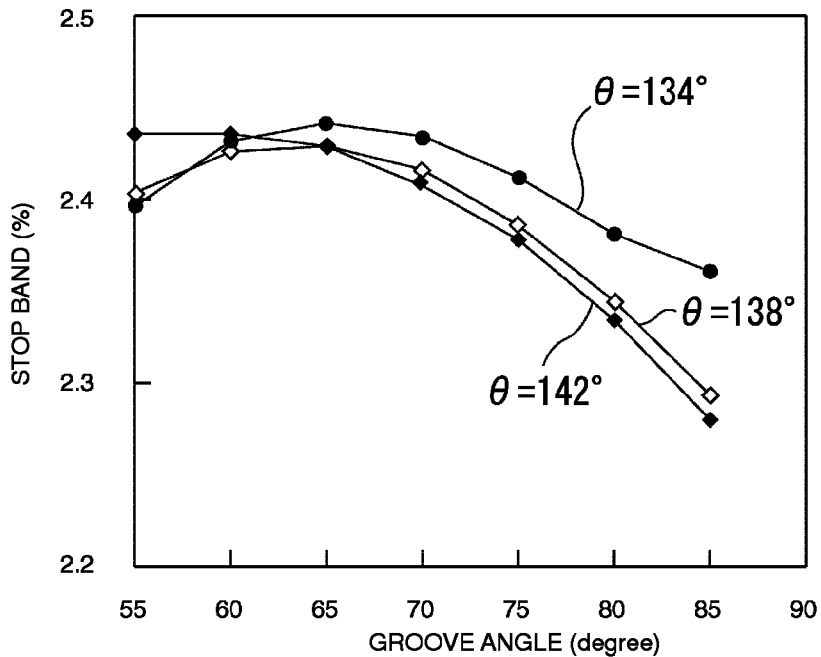
FIG. 9 is a graph showing the relationship between the groove angle γ and the stop band, where the film thickness of a first electrode layer normalized by the wave length is about 3%, the film thickness of a portion, which is located in a groove 10a, of a second electrode layer normalized by the wave length is about 3%, and the film thickness of a portion, which is located outside the groove 10a, of the second electrode layer normalized by the wave length is about 10%.

FIG. 9 shows the relationship between the groove angle γ and the stop band, where the film thickness of the first electrode layer 13a normalized by the wave length is 3%, the film thickness of the portion, which is located in the groove 10a, of the second electrode layer 13b normalized by the wave length is 3%, and the film thickness of the portion, which is located outside the groove 10a, of the second electrode layer 13b normalized by the wave length is 10%.

Figure 10:
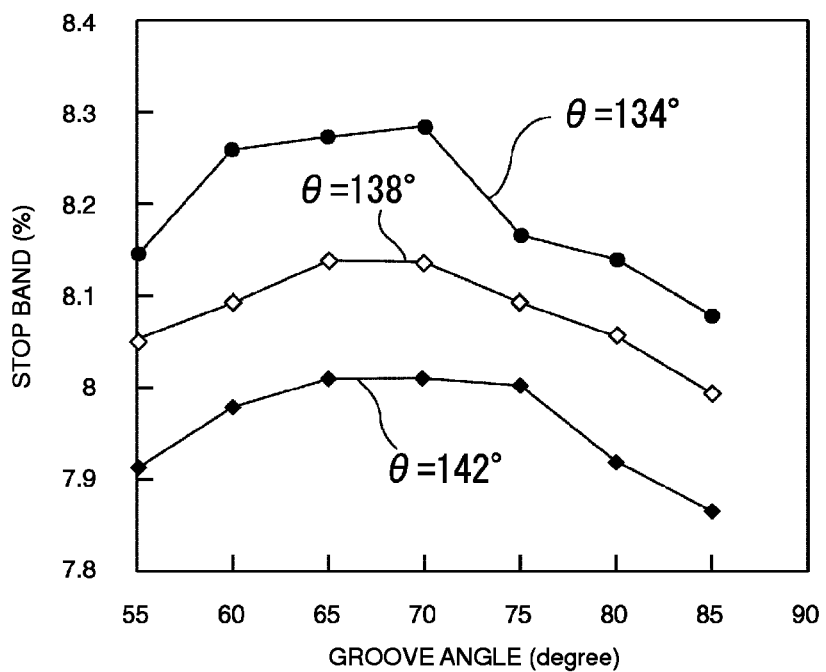
FIG. 10 is a graph showing the relationship between the groove angle γ and the stop band, where the film thickness of a first electrode layer normalized by the wave length is about 5%, the film thickness of a portion, which is located in a groove 10a, of a second electrode layer normalized by the wave length is about 1%, and the film thickness of a portion, which is located outside the groove 10a, of the second electrode layer normalized by the wave length is about 10%.

FIG. 10 shows the relationship between the groove angle γ and the stop band, where the film thickness of the first electrode layer 13a normalized by the wave length is 5%, the film thickness of the portion, which is located in the groove 10a, of the second electrode layer 13b normalized by the wave length is 1%, and the film thickness of the portion, which is located outside the groove 10a, of the second electrode layer 13b normalized by the wave length is 10%.

In this regard, in FIG. 8 to FIG. 10, the graph indicated by "134°" is the graph in the case where the LiTaO3 substrate having rotation angles of (0°, 134°, 0° is used as the piezoelectric substrate 10. The graph indicated by "138°" is the graph in the case where the LiTaO3 substrate having rotation angles of (0°, 138°, 0° is used as the piezoelectric substrate 10. The graph indicated by "142°" is the graph in the case where the LiTaO3 substrate having rotation angles of (0°, 142°, 0° is used as the piezoelectric substrate 10.

TABLE 6

|  | First electrode layer 13a | Portion, which is located in groove 10a, of second electrode layer 13b | Average density (g/cm$^3$) |
|---|---|---|---|
| Density (g/cm$^3$) | 21.5 | 2.7 |  |
| Thickness (%) | 1 | 5 | 5.41 |
|  | 2 | 4 | 8.29 |
|  | 3 | 3 | 11.34 |
|  | 4 | 2 | 14.56 |
|  | 5 | 1 | 17.95 |

As shown in Table 6 described above, in the case where the film thickness of the first electrode layer 13a normalized by the wave length is 1% and the film thickness of the portion, which is located in the groove 10a, of the second electrode layer 13b normalized by the wave length is 5%, the average density of the portion, which is located in the groove 10a, of the IDT electrode 13 is 5.41 g/cm$^3$ and is smaller than the density (7.45 g/cm$^3$) of the piezoelectric substrate 10 (LiTaO$_3$ substrate). In this case, as shown in FIG. 8, the stop band is the largest when the groove angle γ is 90°, and the stop band tends to become small as the groove angle γ becomes small from 90°.

As shown in Table 6 described above, in the case where the film thickness of the first electrode layer 13a normalized by the wave length is 3% and the film thickness of the portion, which is located in the groove 10a, of the second electrode layer 13b normalized by the wave length is 3%, the average density of the portion, which is located in the groove 10a, of the IDT electrode 13 is 11.34 g/cm$^3$ and is larger than the density (7.45 g/cm$^3$) of the piezoelectric substrate 10 (LiTaO$_3$ substrate). Likewise, in the case where the film thickness of the first electrode layer 13a normalized by the wave length is 5% and the film thickness of the portion, which is located in the groove 10a, of the second electrode layer 13b normalized by the wave length is 1%, the average density of the portion, which is located in the groove 10a, of the IDT electrode 13 is 17.95 g/cm$^3$ and is larger than the density (7.45 g/cm$^3$) of the piezoelectric substrate 10 (LiTaO$_3$ substrate). In these cases, as shown in FIG. 9 and FIG. 10, it is clear that the stop band can be made larger than the stop band in the case where the groove angle γ is specified to be 90° by specifying the groove angle γ to be less than 90°.

As is clear from these results, in the case where the IDT electrode 13 is formed from the electrically conductive layer laminate as well, the stop band can be increased while the acoustic velocity of the boundary acoustic wave is increased by making the average density of the portion 13Z, which is located in the groove 10a, of the IDT electrode 13 larger than the average density of the piezoelectric substrate 10. Furthermore, as is also clear, the effect that the stop band can be increased while the acoustic velocity of the boundary acoustic wave is increased by making the average density of the portion 13Z, which is located in the groove 10a, of the IDT electrode 13 larger than the average density of the piezoelectric substrate 10 is obtained likewise in the case where only a part of the IDT electrode 13 is located in the groove 10a and the other portion is located on the side upper than the surface 10b of the piezoelectric substrate 10.

In this regard, the material for the second electrode layer 13b is not specifically limited insofar as the material is an electrically conductive material. The material for the second electrode layer 13b may have a density higher than the density of the piezoelectric substrate 10 or be lower than that. For example, the second electrode layer 13b may be made of a material, e.g., at least one type of metal selected from the group consisting of Al, Ag, Pt, Au, W, Ta, Mo, Ni, and Cu or an alloy containing at least one type of metal selected from the group consisting of Al, Ag, Pt, Au, W, Ta, Mo, Ni, and Cu, having a density higher than that of the piezoelectric substrate 10.

However, if the electrical resistivity of the IDT electrode 13 increases, the insertion loss of the boundary acoustic wave device becomes large. Therefore, it is preferable that the second electrode layer 13b is made of a metal or an alloy having a low electrical resistivity. The electrical resistivity of the second electrode layer 13b is preferably 5 μΩcm or less. Consequently, it is preferable that the second electrode layer 13b is made of a low-resistivity material, e.g., at least one type of metal selected from the group consisting of Al, Cu, Au, and Ag or an alloy containing at least one type of metal selected from the group consisting of Al, Cu, Au, and Ag.

Figure 17:
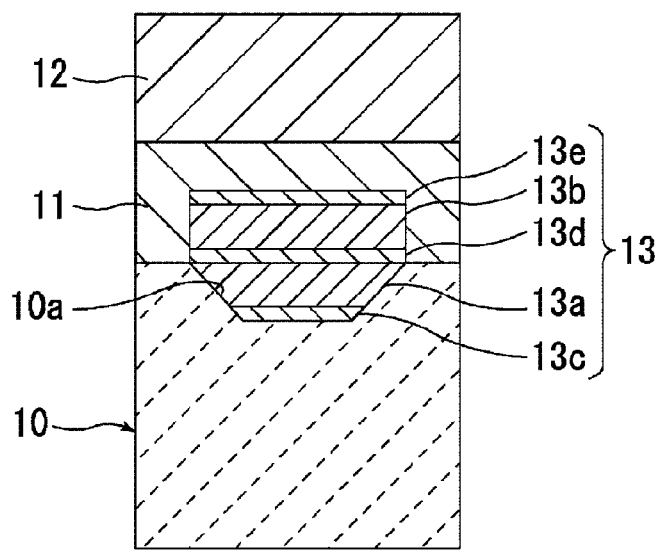
FIG. 17 is a magnified schematic cross-sectional view of a portion of an IDT electrode in an eighth modified preferred embodiment of the present invention.

Next, regarding the structure having a cross-sectional shape shown in FIG. 17, the relationships among θ of the Euler Angles (φ, θ, φ) of the piezoelectric substrate 10, the groove angle γ, and the stop band were examined, where the piezoelectric substrate 10 was made of LiTaO$_3$.

As shown in FIG. 17, regarding the boundary acoustic wave device produced in the present experiment, the IDT electrode 13 was formed from a laminate in which a first diffusion preventing film 13c, a first electrode layer 13a, a second diffusion preventing film 13d, a second electrode layer 13b, and a third diffusion preventing film 13e were laminated in that order from the piezoelectric substrate 10 side. Each of the first to the third diffusion preventing films 13c to 13e was made of a Ti film having a film thickness normalized by the wave length of 0.5%. The first electrode layer 13a was made of a Pt film having a film thickness normalized by the wave length of 2%, 4%, 6%, or 8%. The second electrode layer 13b was made of an Al film having a film thickness normalized by the wave length of 5%, 10%, or 15%. In this regard, the first diffusion preventing film 13c and the first electrode layer 13a were located in the groove 10a, and the other portions were located outside the groove 10a. The first dielectric layer 11 was made of a SiO$_2$ film having a film thickness normalized by the wave length of 20%, 40%, or 60%, and the second dielectric film 12 was made of a SiN film having a film thickness normalized by the wave length of 100%.

Figure 18:
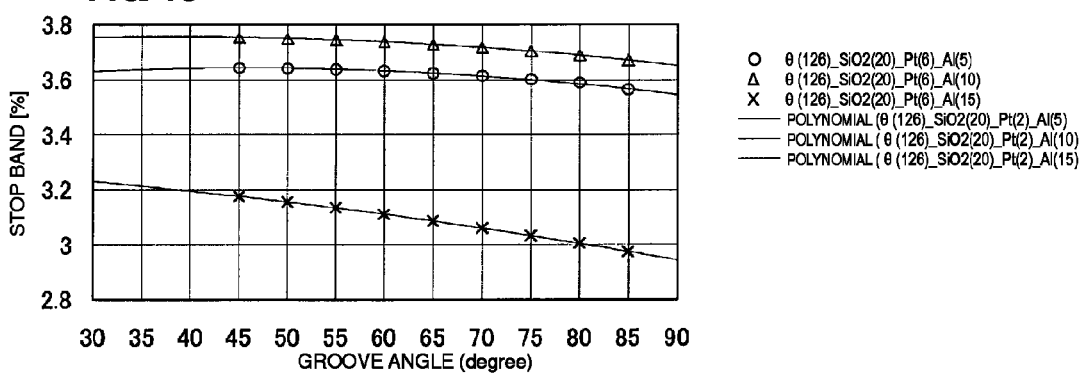
FIG. 18 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 19:
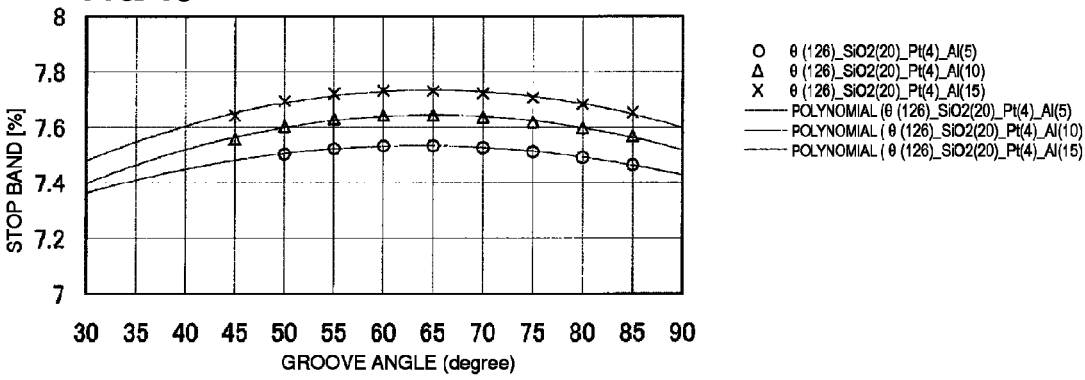
FIG. 19 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 20:
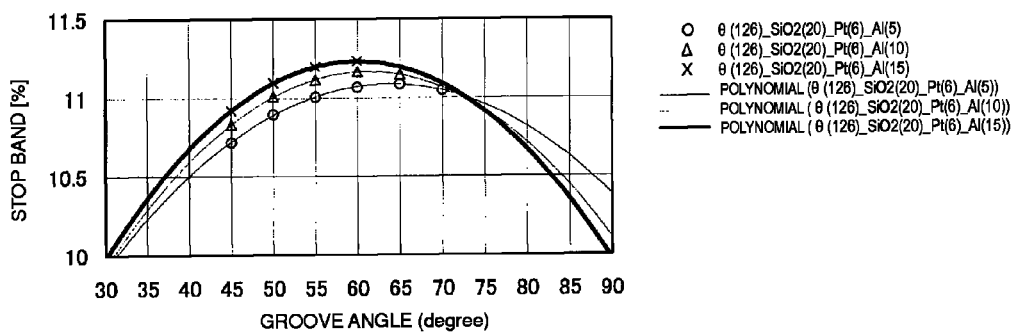
FIG. 20 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 21:
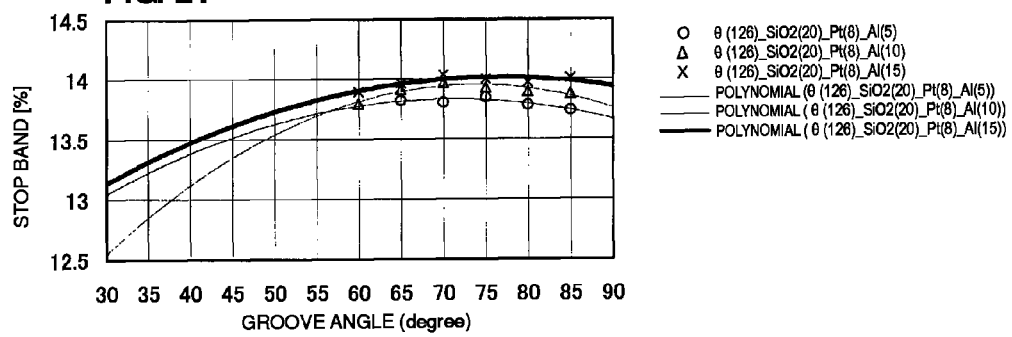
FIG. 21 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 22:
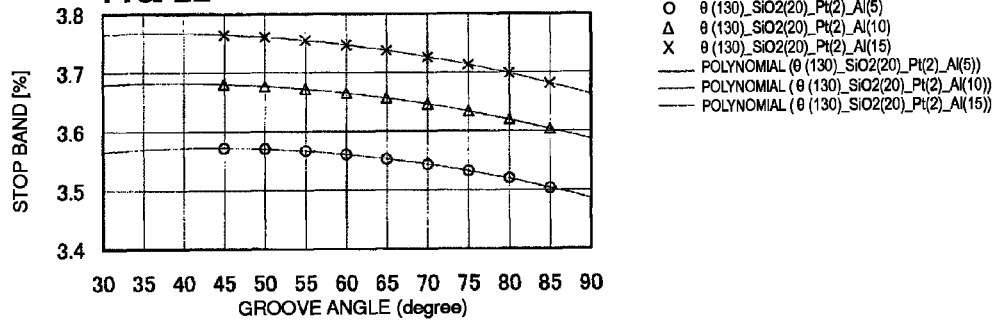
FIG. 22 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 23:
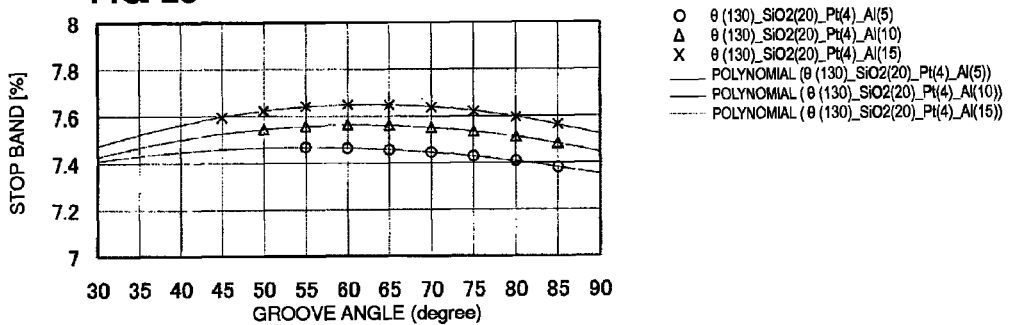
FIG. 23 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 24:
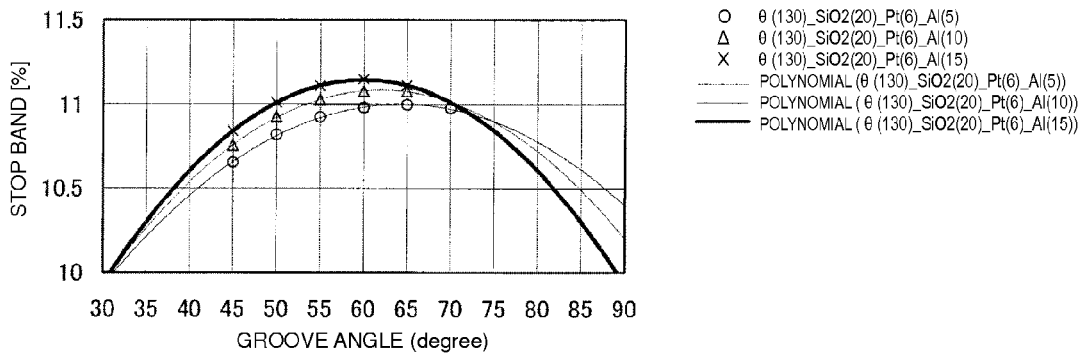
FIG. 24 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 25:
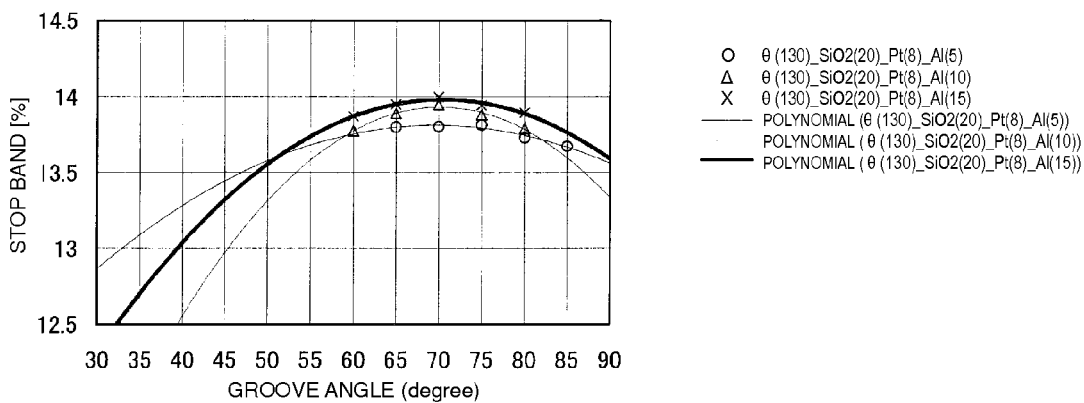
FIG. 25 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 26:
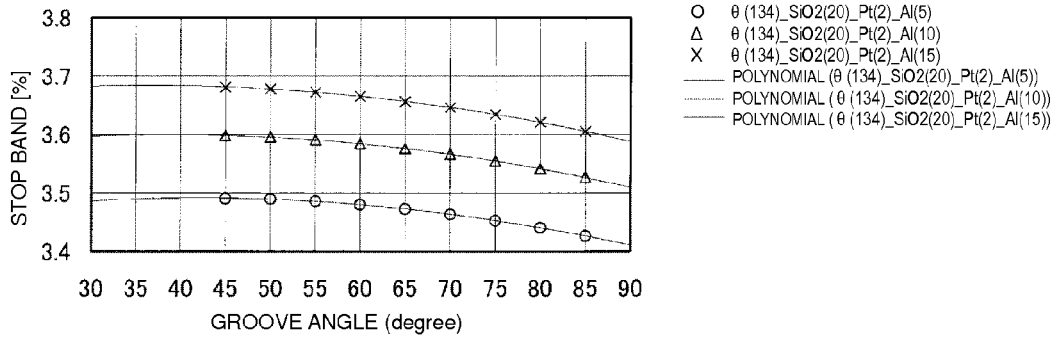
FIG. 26 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 27:
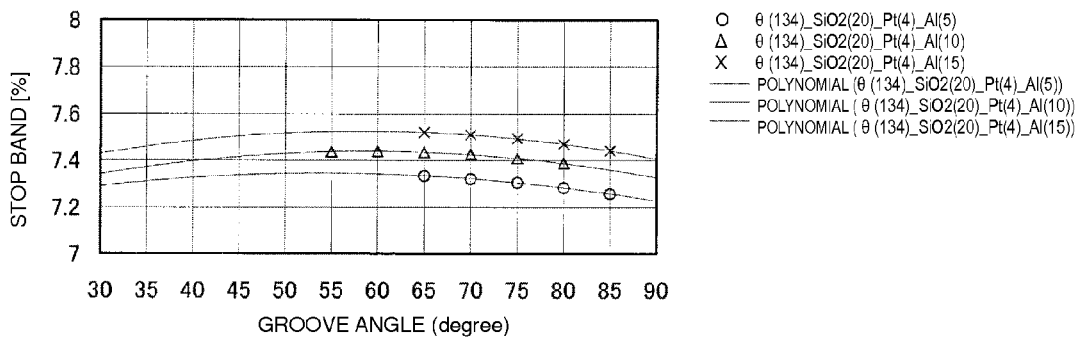
FIG. 27 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 28:
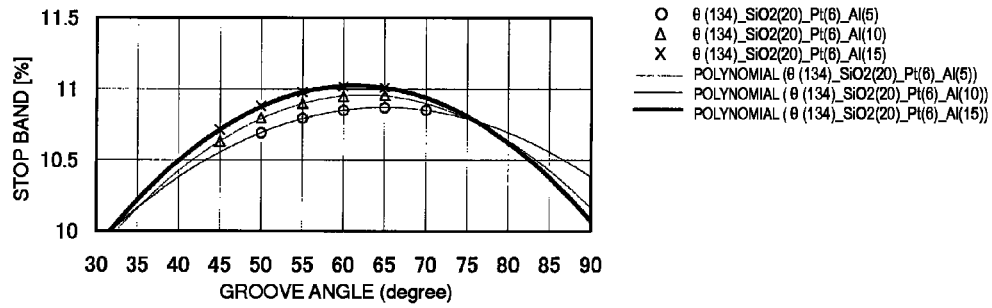
FIG. 28 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 29:
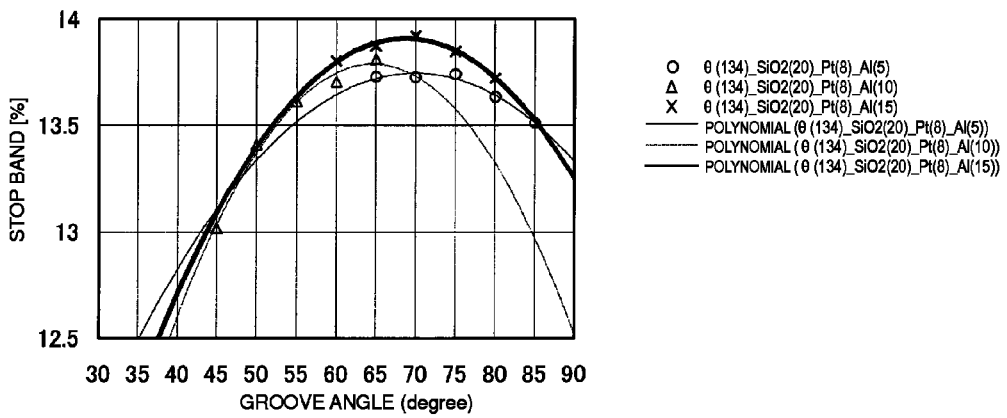
FIG. 29 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 30:
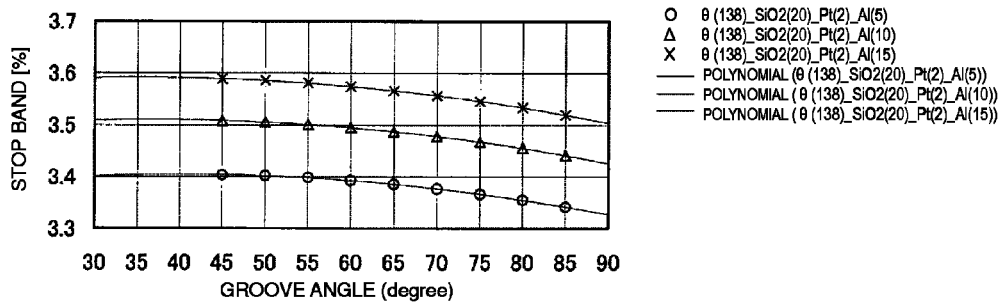
FIG. 30 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 31:
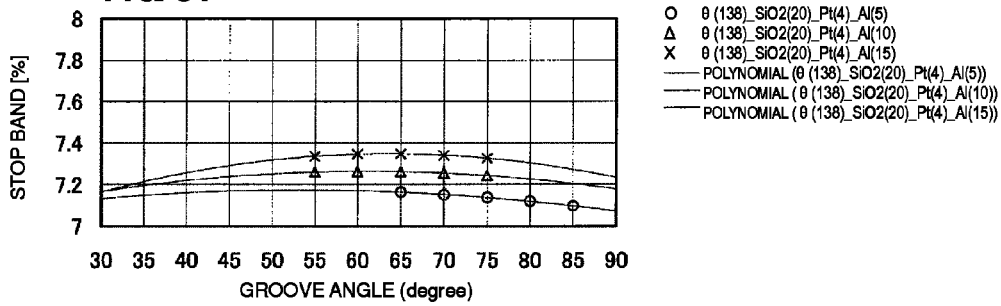
FIG. 31 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 32:
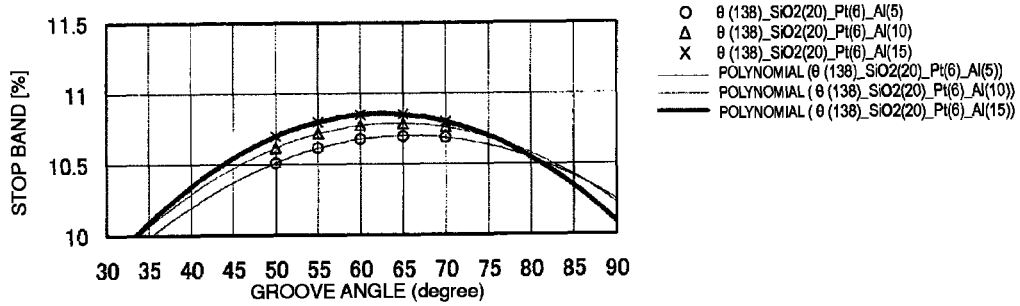
FIG. 32 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 33:
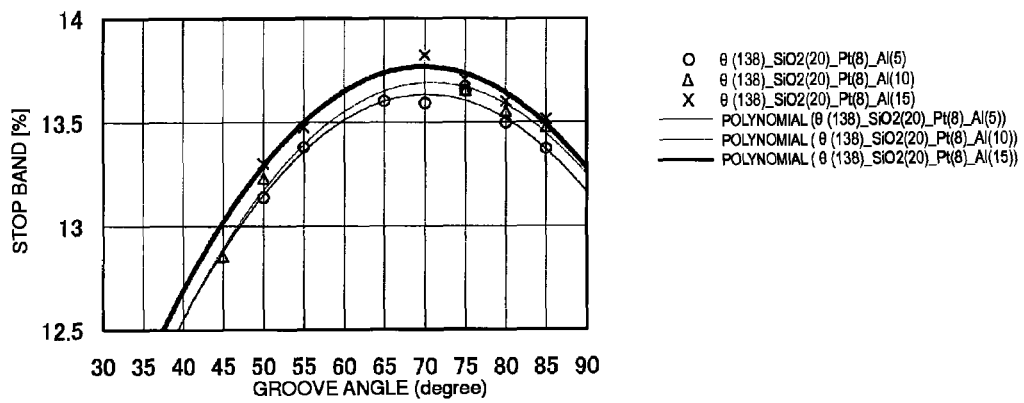
FIG. 33 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 34:
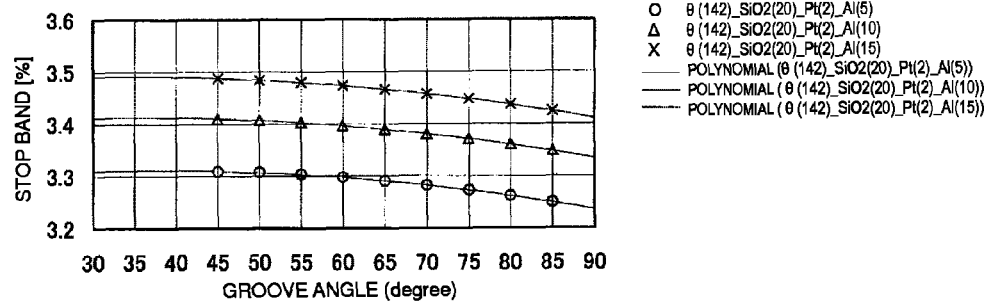
FIG. 34 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 35:
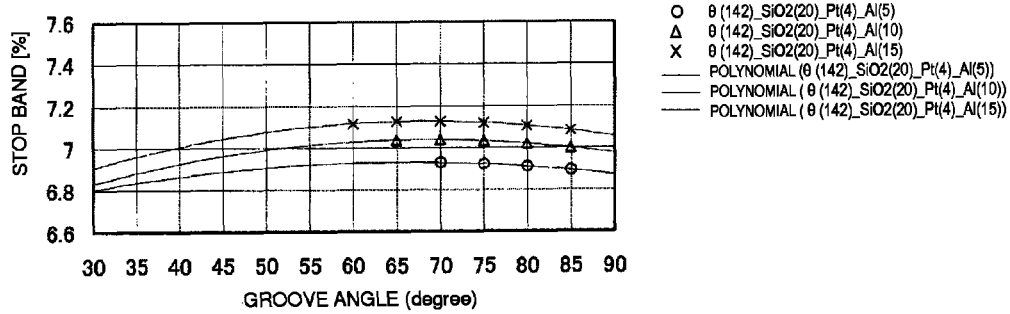
FIG. 35 is a graph showing the relationship between the groove angle γ and the stop band in the eighth modified preferred embodiment of the present invention, where a LiTaO₃ substrate having Euler Angles of (0°, 142°, 0°) is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 36:
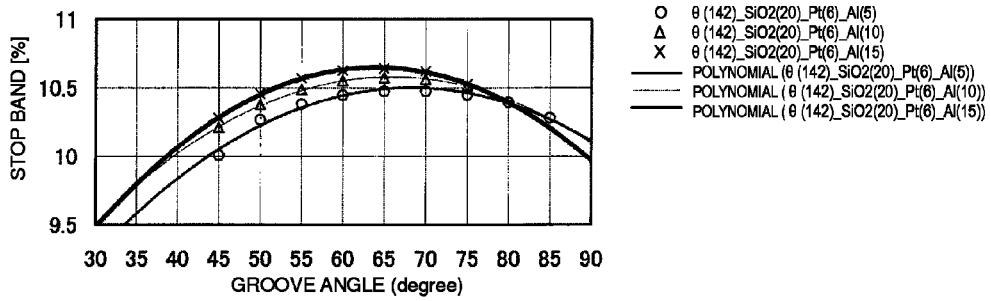
FIG. 36 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 37:
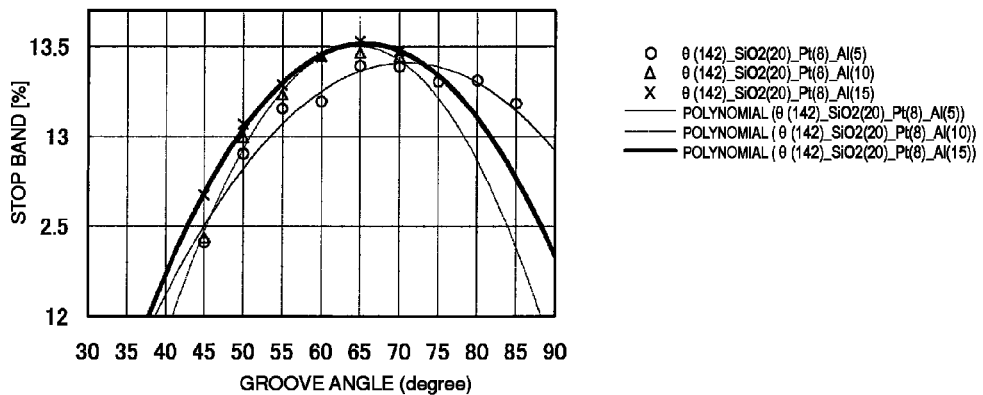
FIG. 37 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 20%, the film thickness of SiN normalized by the wave length is about 100%, and the film thickness of Ti between the individual layers normalized by the wave length is about 10%.
Figure 38:
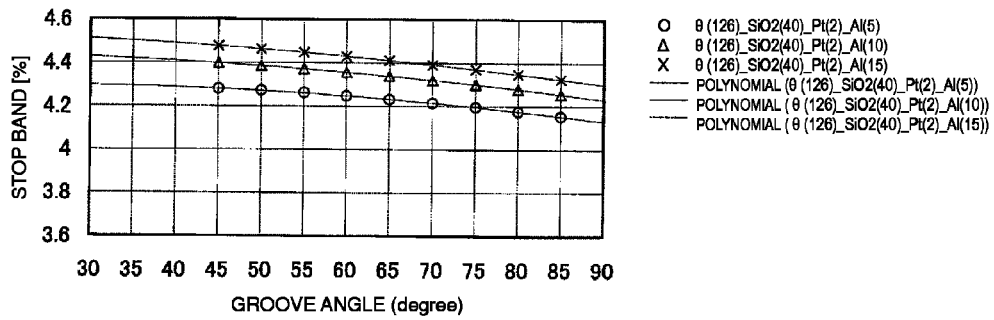
FIG. 38 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 39:
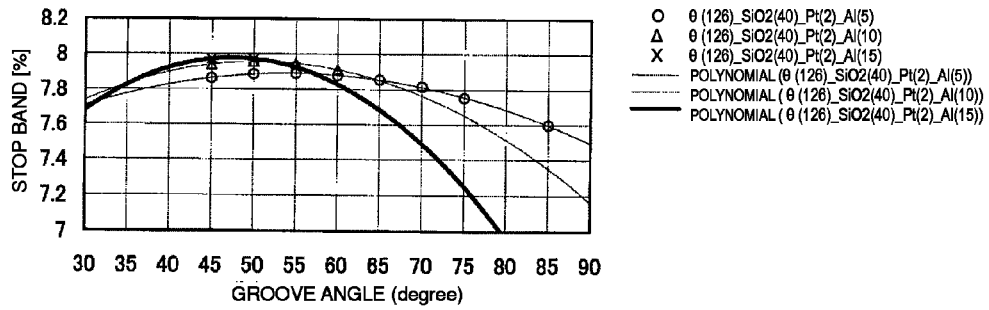
FIG. 39 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 40:
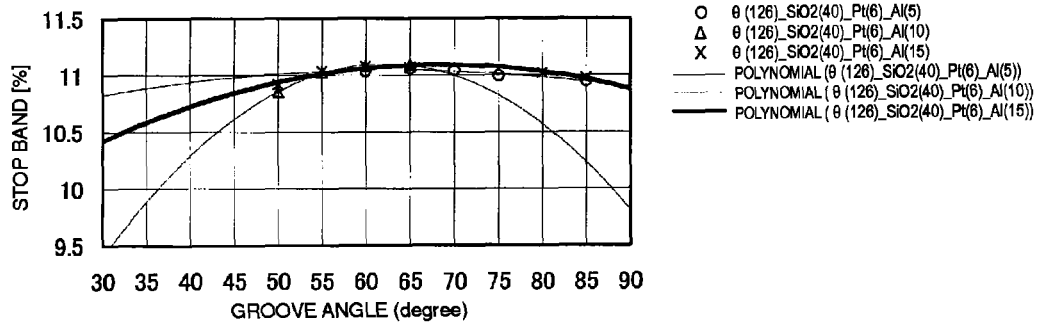
FIG. 40 is a graph showing the relationship between the groove angle γ and the stop band in the eighth modified preferred embodiment, where a LiTaO₃ substrate having Euler Angles of (0°, 126°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 41:
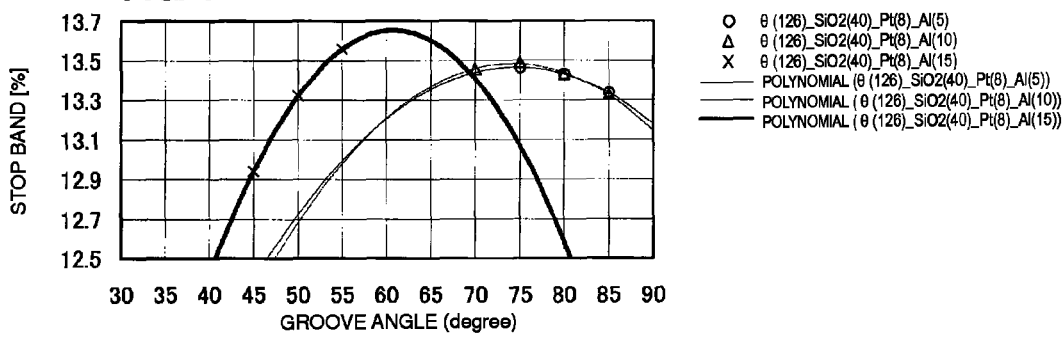
FIG. 41 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 42:
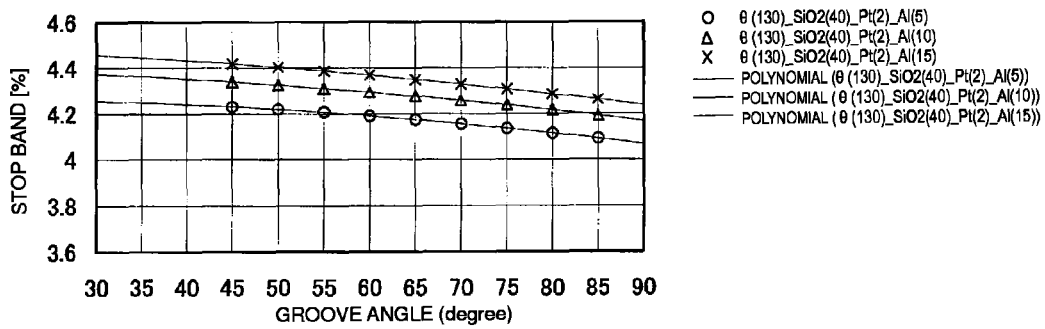
FIG. 42 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 43:
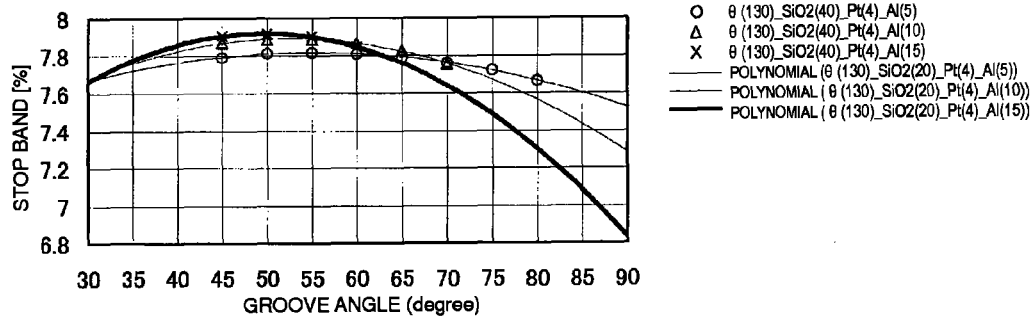
FIG. 43 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 44:
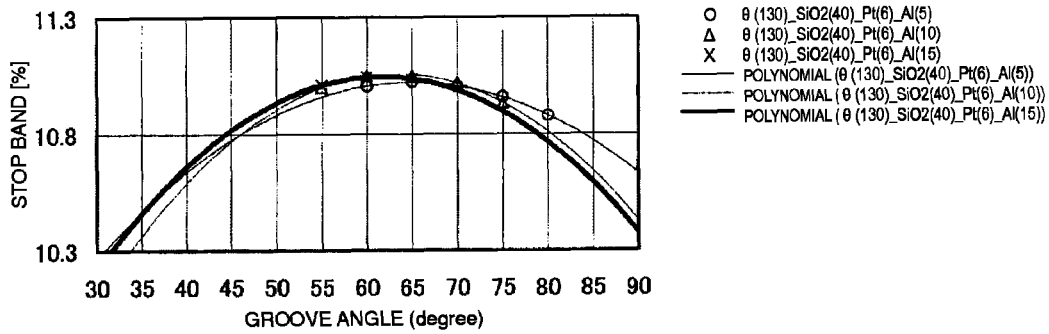
FIG. 44 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 45:
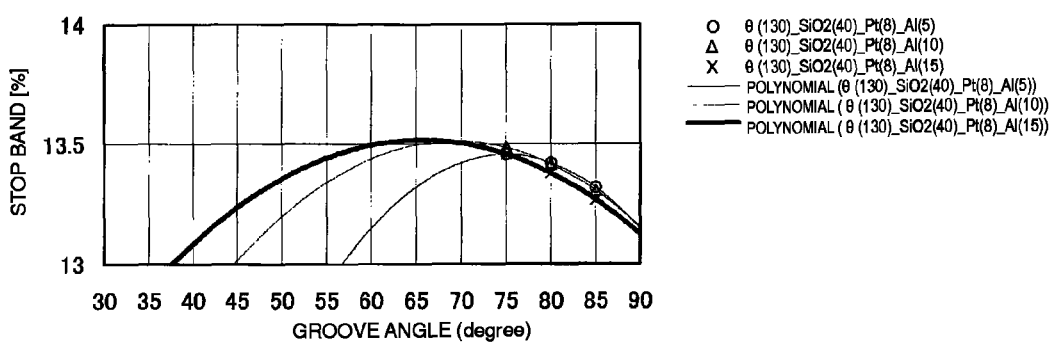
FIG. 45 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 46:
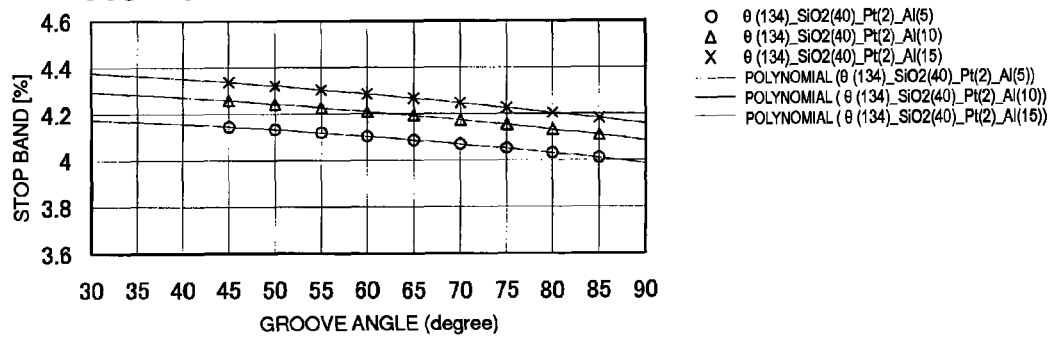
FIG. 46 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 47:
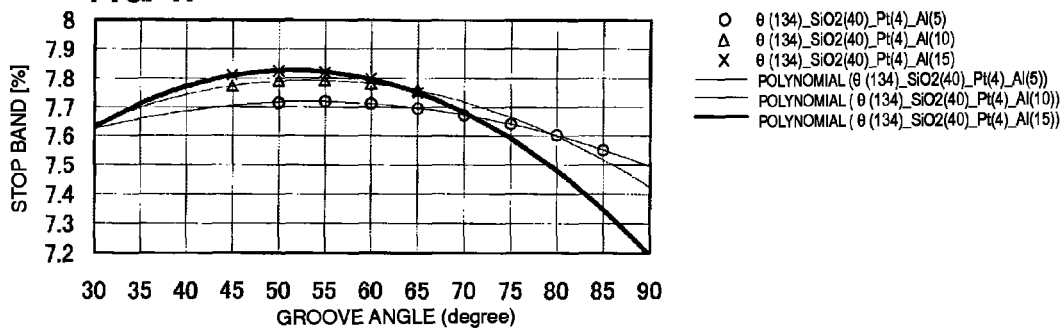
FIG. 47 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 48:
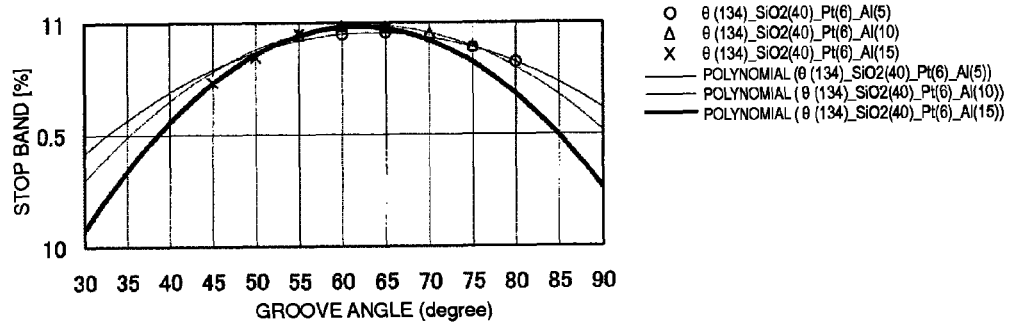
FIG. 48 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 49:
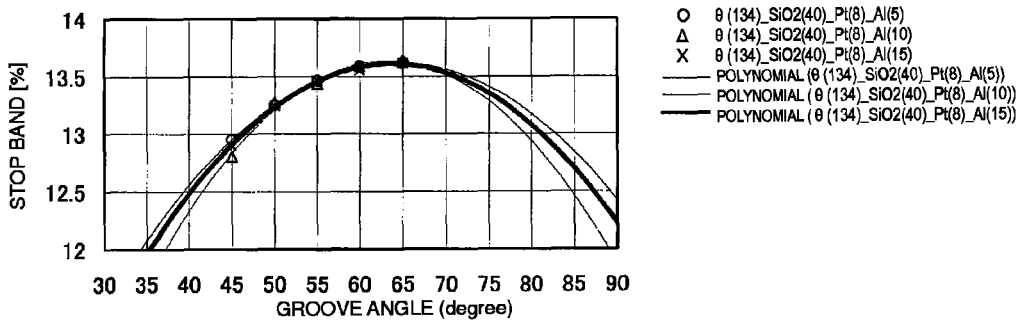
FIG. 49 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 50:
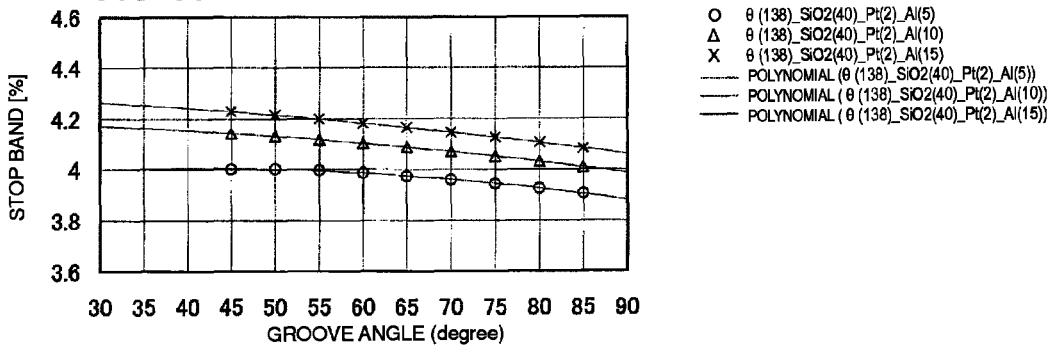
FIG. 50 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 51:
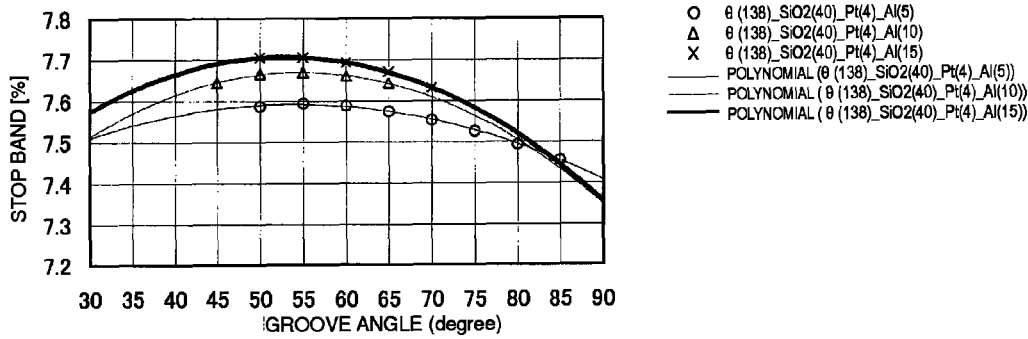
FIG. 51 is a graph showing the relationship between the groove angle γ and the stop band in the eighth modified preferred embodiment, where a LiTaO₃ substrate having Euler Angles of (0°, 138°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 52:
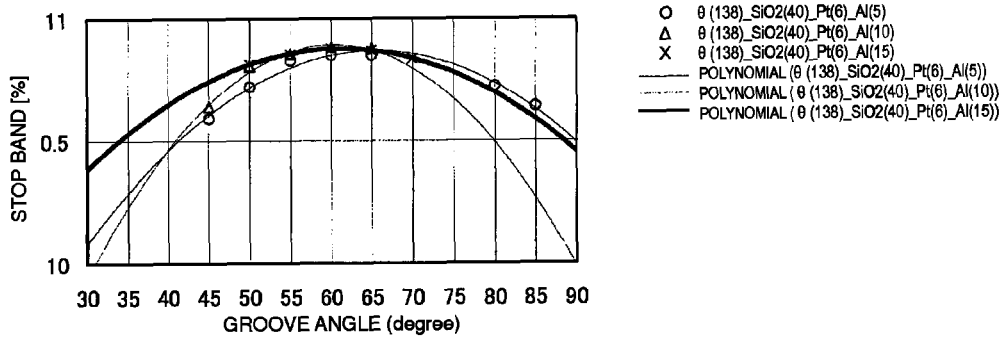
FIG. 52 is a graph showing the relationship between the groove angle γ and the stop band in the eighth modified preferred embodiment of the present invention, where a LiTaO3 substrate having Euler Angles of (0°, 138°, 0° is used as the piezoelectric substrate, the film thickness of Pt normalized by the wave length is about 6%, the film thickness of Al normalized by the wave length is about 5%, about 10%, or about 15%, the film thickness of SiO2 normalized by the wave length is about 40%, the film thickness of SiN normalized by the wave length is about 100%, and the film thickness of Ti between the individual layers normalized by the wave length is about 10%.
Figure 53:
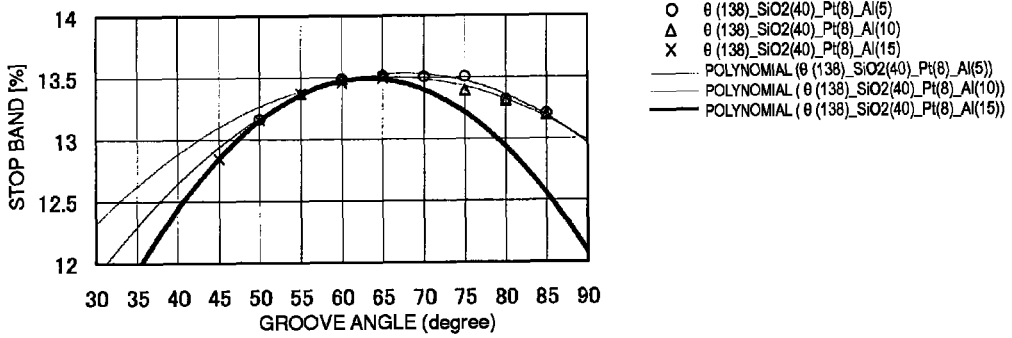
FIG. 53 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 54:
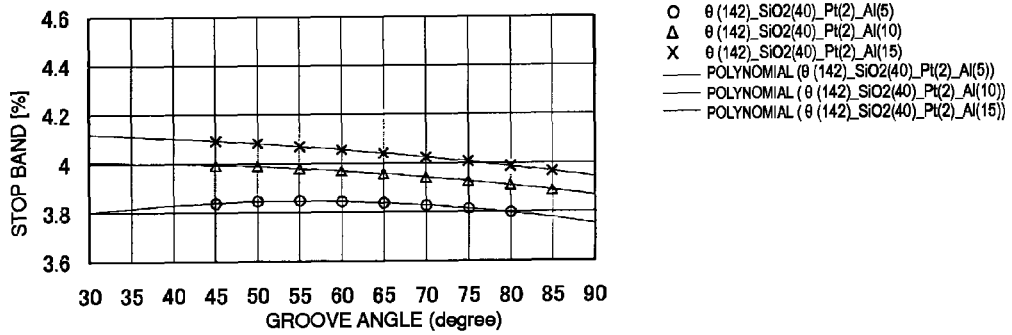
FIG. 54 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 55:
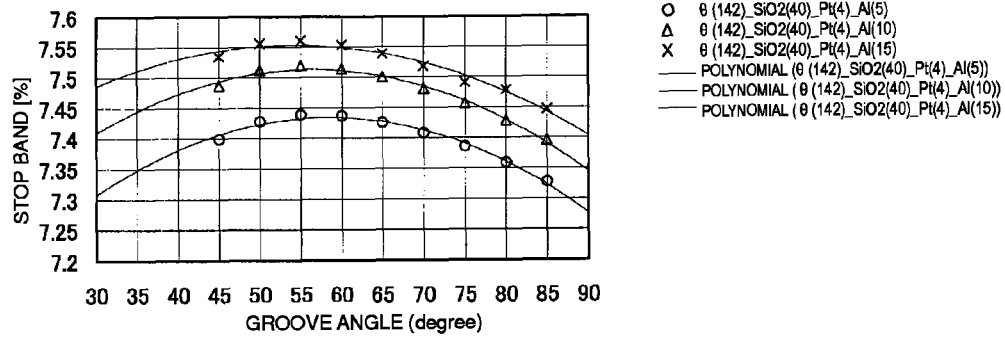
FIG. 55 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 56:
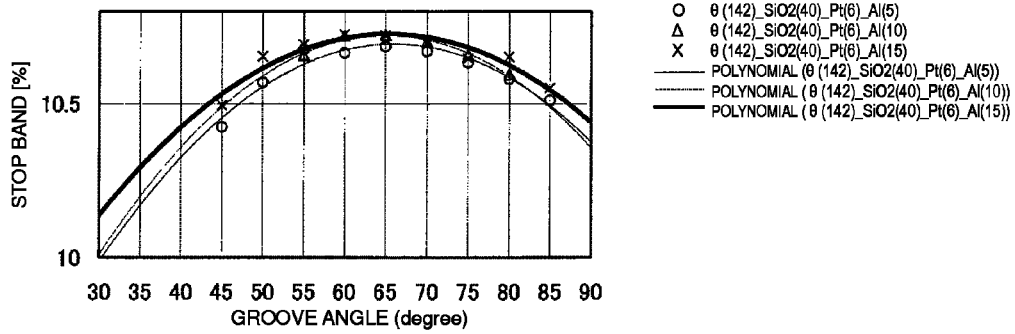
FIG. 56 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 57:
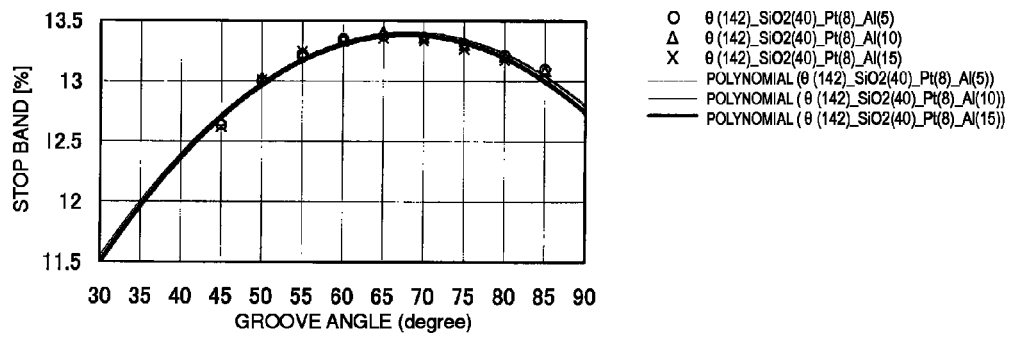
FIG. 57 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 40%, the film thickness of SiN normalized by the wave length is about 100%, and the film thickness of Ti between the individual layers normalized by the wave length is about 10%.
Figure 58:
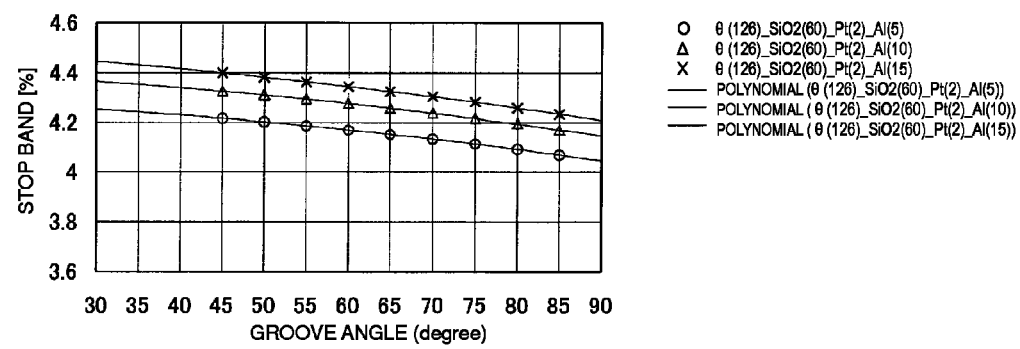
FIG. 58 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 59:
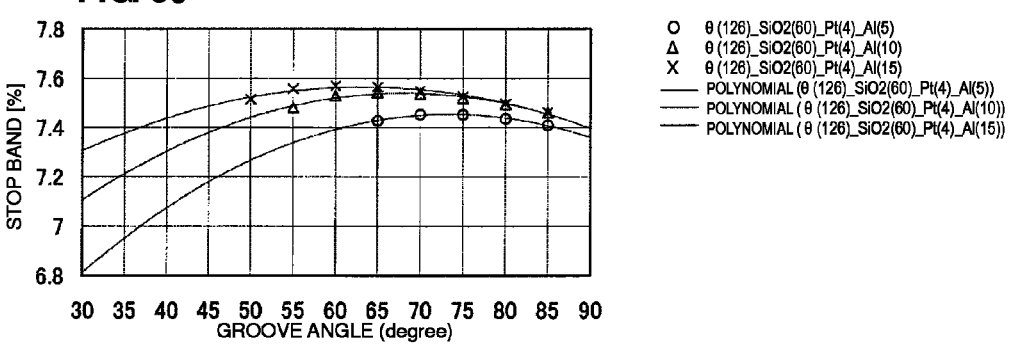
FIG. 59 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 60:
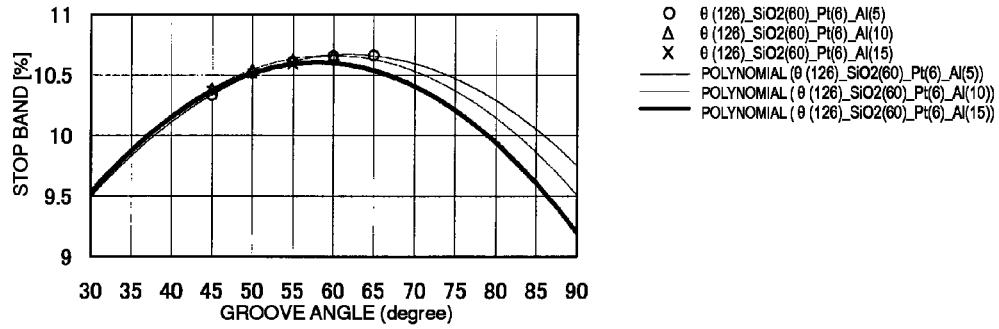
FIG. 60 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 61:
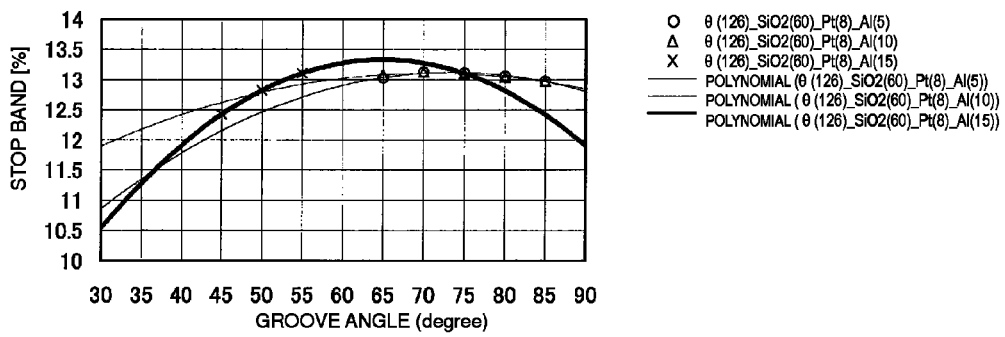
FIG. 61 is a graph showing the relationship between the groove angle γ and the stop band in the eighth modified preferred embodiment of the present invention, where a LiTaO₃ substrate having Euler Angles of (0°, 126°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 62:
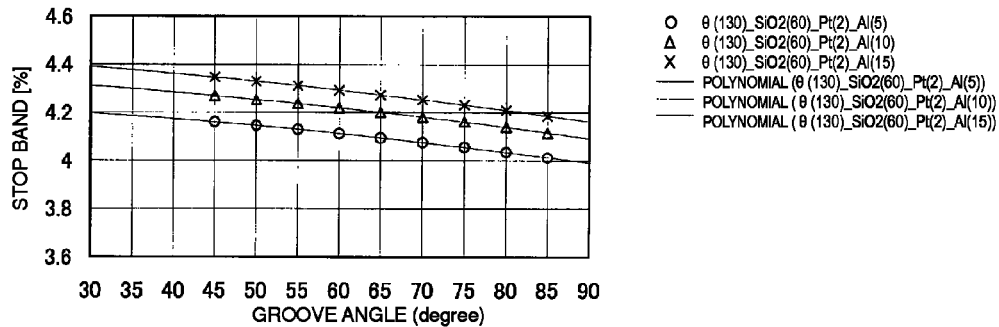
FIG. 62 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 63:
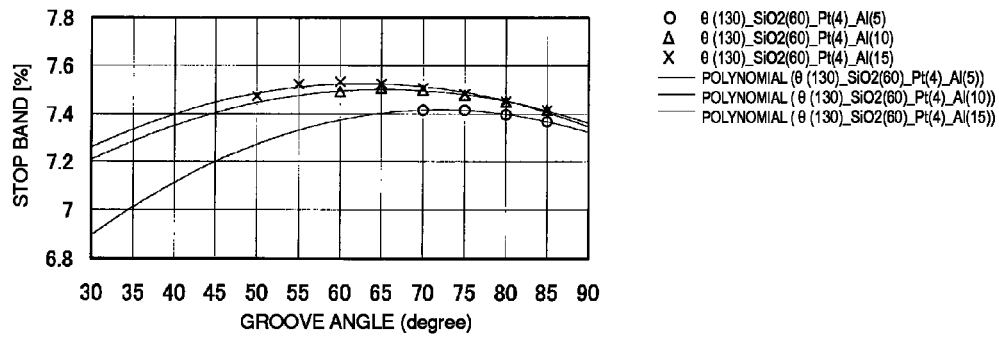
FIG. 63 is a graph showing the relationship between the groove angle γ and the stop band in the eighth modified preferred embodiment of the present invention, where a LiTaO₃ substrate having Euler Angles of (0°, 130°, 0°) is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 64:
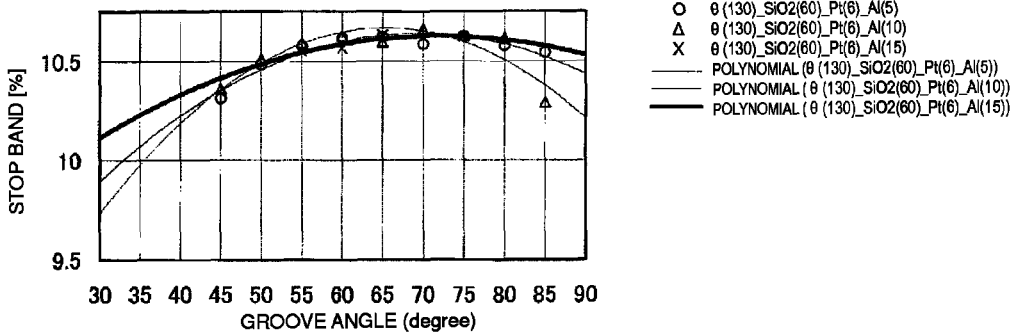
FIG. 64 is a graph showing the relationship between the groove angle γ and the stop band in the eighth modified preferred embodiment of the present invention, where a LiTaO₃ substrate having Euler Angles of (0°, 130°, 0°) is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 65:
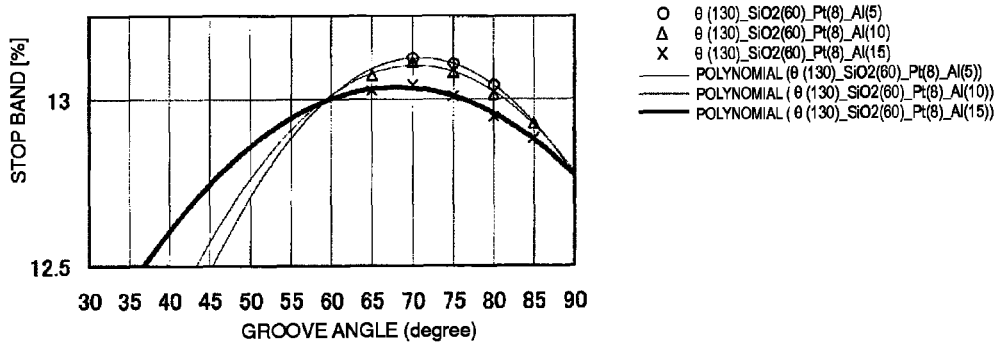
FIG. 65 is a graph showing the relationship between the groove angle γ and the stop band in the eighth modified preferred embodiment of the present invention, where a LiTaO₃ substrate having Euler Angles of (0°, 130°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 66:
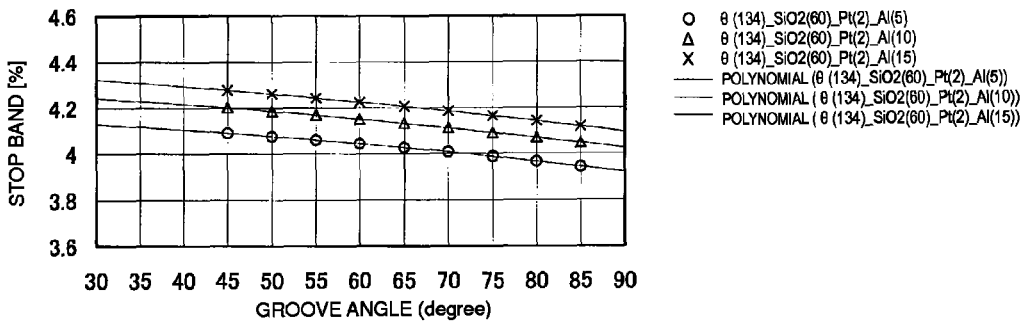
FIG. 66 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 67:
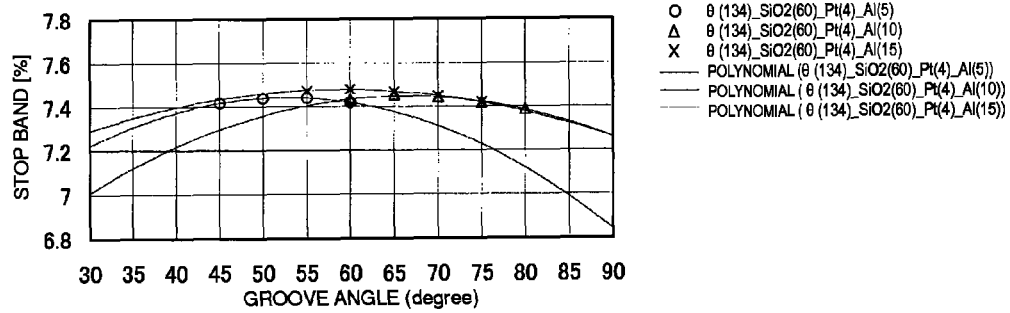
FIG. 67 is a graph showing the relationship between the groove angle γ and the stop band in the eighth modified preferred embodiment, where a LiTaO₃ substrate having Euler Angles of (0°, 134°, 0° is used as the piezoelectric substrate, the film thickness of Pt normalized by the wave length is 4%, the film thickness of Al normalized by the wave length is 5%, 10%, or 15%, the film thickness of SiO₂ normalized by the wave length is 60%, the film thickness of SiN normalized by the wave length is 100%, and the film thickness of Ti between the individual layers normalized by the wave length is about 10%.
Figure 68:
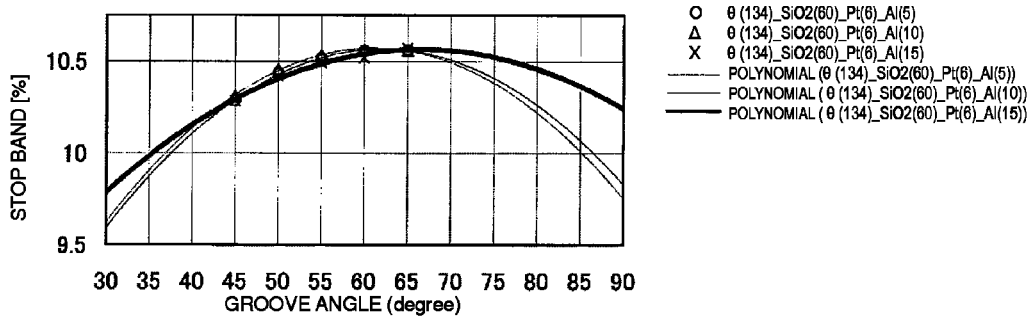
FIG. 68 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 69:
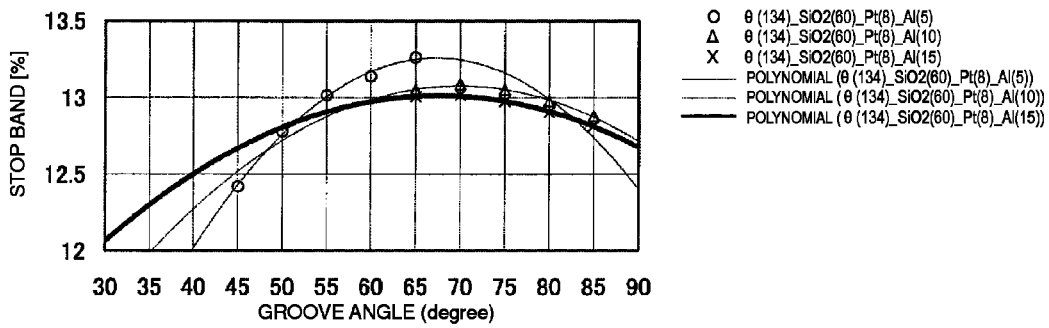
FIG. 69 is a graph showing the relationship between the groove angle γ and the stop band in the eighth modified preferred embodiment of the present invention, where a LiTaO₃ substrate having Euler Angles of (0°, 134°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 70:
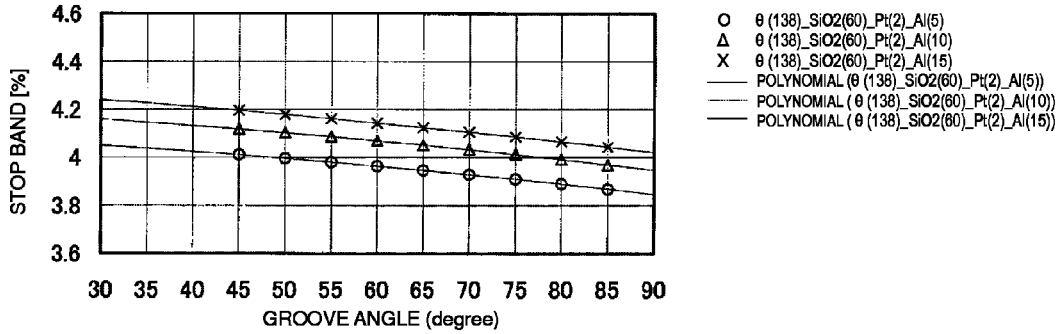
FIG. 70 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 71:
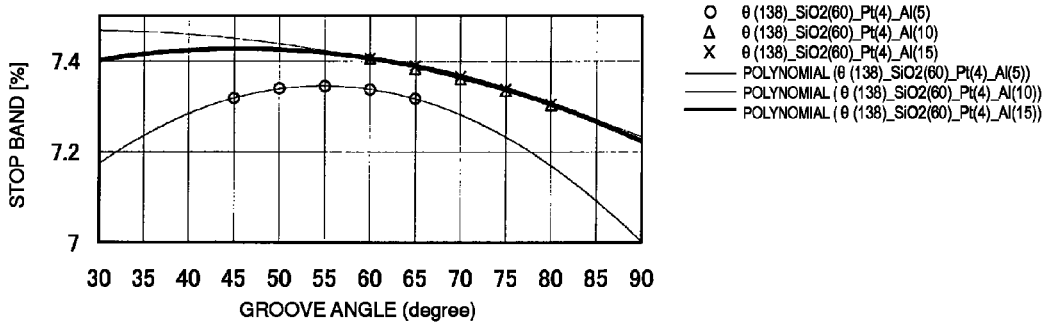
FIG. 71 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 72:
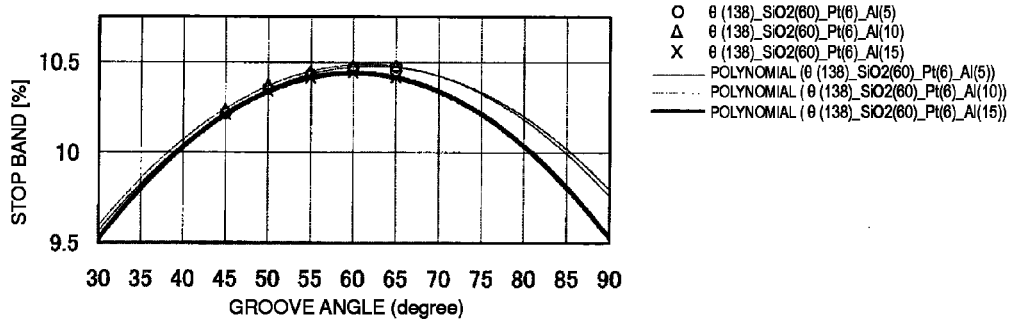
FIG. 72 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 73:
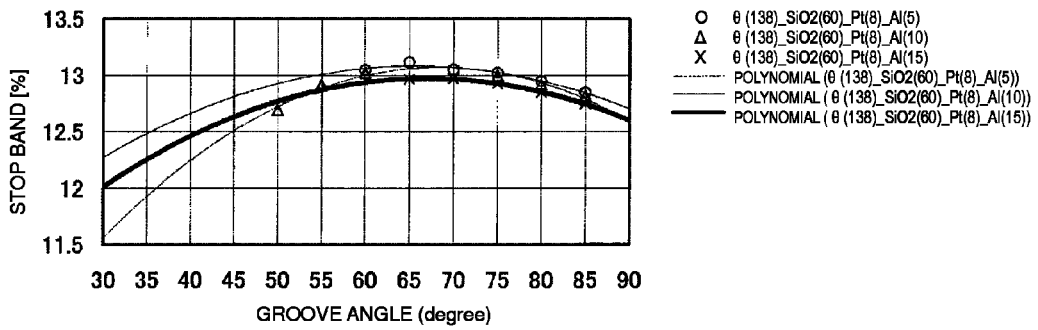
FIG. 73 is a graph showing the relationship between the groove angle γ and the stop band in the eighth modified preferred embodiment of the present invention, where a LiTaO₃ substrate having Euler Angles of (0°, 138°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 74:
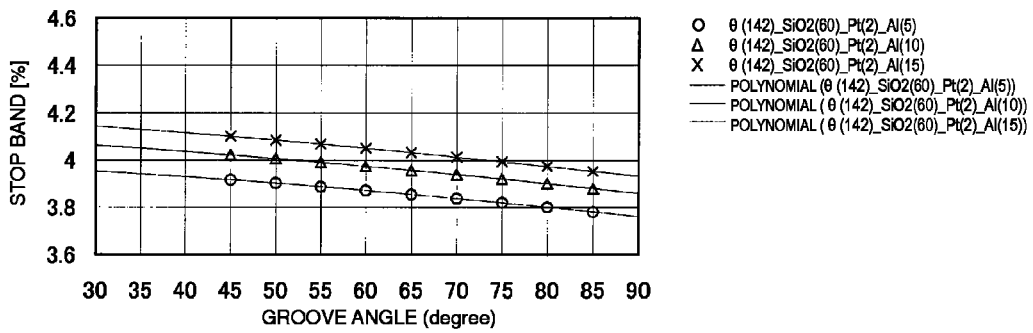
FIG. 74 is a graph showing the relationship between the groove angle γ and the stop band in the eighth modified preferred embodiment, where a LiTaO₃ substrate having Euler Angles of (0°, 142°, 0° is used as the piezoelectric substrate, the film thickness of Pt normalized by the wave length is about 2%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 75:
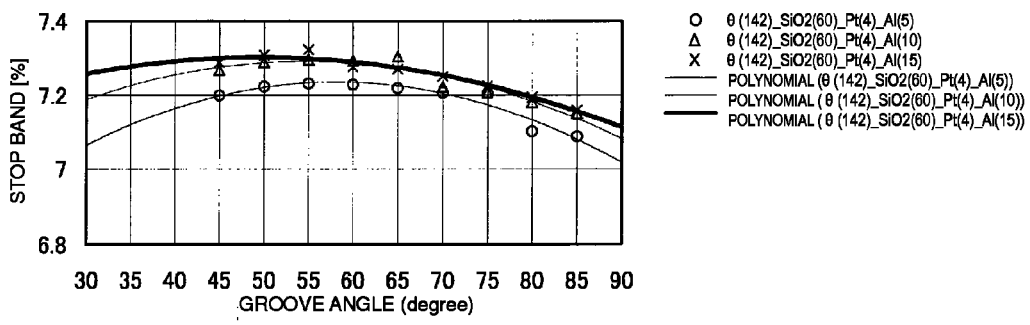
FIG. 75 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 4%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 76:
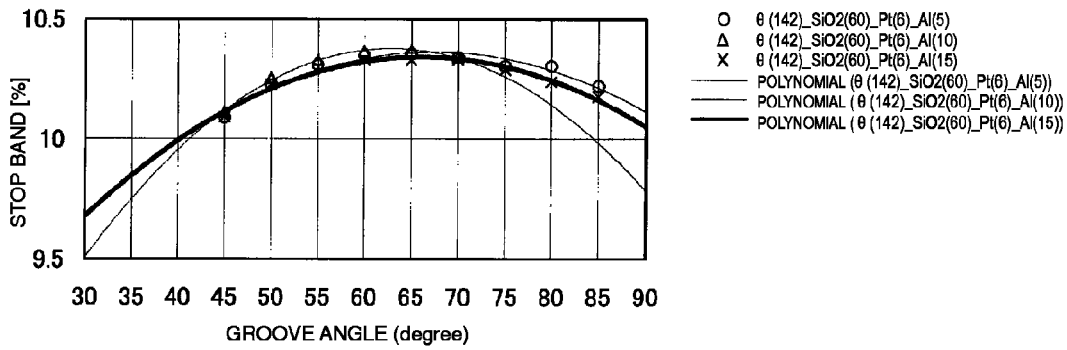
FIG. 76 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 6%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 77:
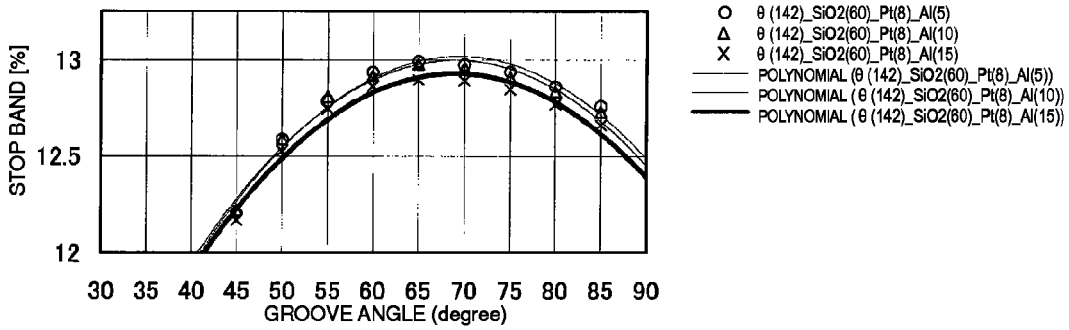
FIG. 77 is a graph showing the relationship between the groove angle γ and the stop band in the eighth modified preferred embodiment of the present invention, where a LiTaO₃ substrate having Euler Angles of (0°, 142°, 0° is used as the piezoelectric substrate, the film thickness of Pt normalized by the wave length is about 8%, the film thickness of Al normalized by the wave length is about 5%, about 10%, or about 15%, the film thickness of SiO₂ normalized by the wave length is about 60%, the film thickness of SiN normalized by the wave length is about 100%, and the film thickness of Ti between the individual layers normalized by the wave length is about 10%.
Figure 78:
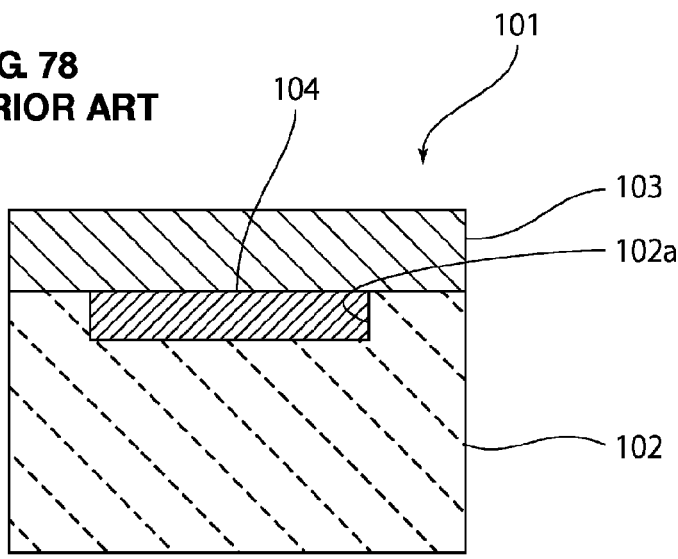
FIG. 78 is a magnified schematic cross-sectional view of a portion of an IDT electrode of a boundary acoustic wave device described in WO 2008/044411 A1.

FIG. 18 to FIG. 77 show the relationship between the groove angle γ and the stop band, where the piezoelectric substrate was made of a LiTaO$_3$ substrate having Euler Angles of (0°, 126° to 142°, 0°), the film thickness of Pt normalized by the wave length was 2%, 4%, 6%, or 8%, the film thickness of Al normalized by the wave length was 5%, 10%, or 15%, and the film thickness of SiO$_2$ normalized by the wave length was 20%, 40%, or 60%.

Moreover, approximate expressions of the data under the individual conditions shown in FIG. 18 to FIG. 77 were calculated by using the method of least squares. In this regard, the approximate expression was assumed to be a quadratic function (y=ax$^2$±bx+c, where y represents a stop band and x represents a groove angle). The values of a, b, and c in the calculated approximate expressions of the data under the individual conditions are shown in Tables 7 to 11 described below.

Furthermore, on the basis of the resulting approximate expression, the size of a stop band when the groove angle was 90° and the lower limit value of the groove angle of the region in which the stop band was larger than or equal to the stop band when the groove angle was 90°, that is, the groove angle at which the stop band was equal to the stop band when the groove angle was 90° was calculated. The results thereof are also shown in Table 7 to Table 11 described below.

TABLE 7

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 126 | 20 | 2 | 5 | −5.014E−05 | 4.610E−03 | 3.538 | 3.547 | 1.942 |
| 126 | 40 | 2 | 5 | −3.973E−05 | 2.005E−03 | 4.270 | 4.129 | −39.524 |
| 126 | 60 | 2 | 5 | −2.388E−05 | −5.770E−04 | 4.291 | 4.045 | −114.163 |
| 126 | 20 | 2 | 10 | −3.853E−05 | 2.947E−03 | 3.700 | 3.653 | −13.523 |
| 126 | 40 | 2 | 10 | −3.131E−05 | 4.957E−04 | 4.439 | 4.230 | −74.166 |
| 126 | 60 | 2 | 10 | −2.209E−05 | −1.011E−03 | 4.416 | 4.146 | −135.775 |
| 126 | 20 | 2 | 15 | −2.630E−05 | −1.585E−03 | 3.302 | 2.946 | −150.237 |
| 126 | 40 | 2 | 15 | −2.746E−05 | −2.560E−04 | 4.545 | 4.299 | −99.323 |
| 126 | 60 | 2 | 15 | −2.154E−05 | −1.346E−03 | 4.504 | 4.208 | −152.491 |
| 126 | 20 | 4 | 5 | −1.512E−04 | 1.923E−02 | 6.922 | 7.427 | 37.144 |
| 126 | 40 | 4 | 5 | −3.195E−04 | 3.478E−02 | 6.944 | 7.486 | 18.837 |
| 126 | 60 | 4 | 5 | −3.409E−04 | 5.006E−02 | 5.617 | 7.361 | 56.833 |
| 126 | 20 | 4 | 10 | −2.020E−04 | 2.623E−02 | 6.793 | 7.518 | 39.872 |
| 126 | 40 | 4 | 10 | −5.129E−04 | 5.197E−02 | 6.639 | 7.163 | 11.334 |
| 126 | 60 | 4 | 10 | −2.990E−04 | 4.073E−02 | 6.153 | 7.397 | 46.231 |
| 126 | 20 | 4 | 15 | −2.123E−04 | 2.749E−02 | 6.845 | 7.599 | 39.454 |
| 126 | 40 | 4 | 15 | −9.652E−04 | 9.178E−02 | 5.796 | 6.239 | 5.095 |
| 126 | 60 | 4 | 15 | −2.350E−04 | 2.974E−02 | 6.625 | 7.398 | 36.540 |
| 126 | 20 | 6 | 5 | −1.027E−03 | 1.311E−01 | 6.903 | 10.383 | 37.672 |
| 126 | 40 | 6 | 5 | −7.083E−04 | 9.295E−02 | 8.008 | 10.637 | 41.229 |
| 126 | 60 | 6 | 5 | −1.158E−03 | 1.433E−01 | 6.235 | 9.756 | 33.788 |
| 126 | 20 | 6 | 10 | −1.271E−03 | 1.556E−01 | 6.404 | 10.111 | 32.408 |
| 126 | 40 | 6 | 10 | −1.652E−03 | 2.052E−01 | 4.728 | 9.813 | 34.190 |
| 126 | 60 | 6 | 10 | −1.256E−03 | 1.500E−01 | 6.185 | 9.510 | 29.414 |
| 126 | 20 | 6 | 15 | −1.394E−03 | 1.672E−01 | 6.222 | 9.972 | 29.884 |
| 126 | 40 | 6 | 15 | −1.264E−03 | 1.551E−01 | 6.332 | 10.046 | 32.641 |
| 126 | 60 | 6 | 15 | −1.375E−03 | 1.596E−01 | 5.971 | 9.201 | 26.105 |
| 126 | 20 | 8 | 5 | −4.670E−04 | 6.634E−02 | 11.478 | 13.667 | 52.076 |
| 126 | 40 | 8 | 5 | −1.228E−03 | 1.832E−01 | 6.631 | 13.178 | 59.247 |
| 126 | 60 | 8 | 5 | −1.191E−03 | 1.753E−01 | 6.679 | 12.807 | 57.175 |
| 126 | 20 | 8 | 10 | −7.326E−04 | 1.080E−01 | 9.971 | 13.759 | 57.454 |
| 126 | 40 | 8 | 10 | −1.370E−03 | 2.032E−01 | 5.945 | 13.144 | 58.399 |
| 126 | 60 | 8 | 10 | −7.204E−04 | 1.022E−01 | 9.485 | 12.851 | 51.918 |
| 126 | 20 | 8 | 15 | −4.069E−04 | 6.219E−02 | 11.640 | 13.941 | 62.841 |
| 126 | 40 | 8 | 15 | −2.881E−03 | 3.499E−01 | 3.029 | 11.188 | 31.470 |
| 126 | 60 | 8 | 15 | −2.287E−03 | 2.972E−01 | 3.685 | 11.904 | 39.926 |

TABLE 8

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 130 | 20 | 2 | 5 | −3.946E−05 | 3.424E−03 | 3.498 | 3.487 | −3.226 |
| 130 | 20 | 2 | 10 | −3.586E−05 | 2.749E−03 | 3.630 | 3.587 | −13.339 |
| 130 | 20 | 2 | 15 | −3.701E−05 | 2.742E−03 | 3.716 | 3.663 | −15.903 |
| 130 | 40 | 2 | 5 | −3.188E−05 | 6.746E−04 | 4.265 | 4.068 | −68.830 |
| 130 | 40 | 2 | 10 | −2.679E−05 | −2.362E−04 | 4.407 | 4.168 | −98.817 |
| 130 | 40 | 2 | 15 | −2.430E−05 | −7.477E−04 | 4.502 | 4.238 | −120.769 |
| 130 | 60 | 2 | 5 | −2.180E−05 | −8.558E−04 | 4.243 | 3.990 | −129.263 |
| 130 | 60 | 2 | 10 | −2.024E−05 | −1.232E−03 | 4.367 | 4.092 | −150.859 |
| 130 | 60 | 2 | 15 | −1.888E−05 | −1.566E−03 | 4.455 | 4.162 | −172.968 |
| 130 | 20 | 4 | 5 | −9.248E−05 | 1.011E−02 | 7.191 | 7.351 | 19.304 |
| 130 | 20 | 4 | 10 | −1.409E−04 | 1.720E−02 | 7.038 | 7.445 | 32.092 |
| 130 | 20 | 4 | 15 | −1.685E−04 | 2.102E−02 | 6.993 | 7.521 | 34.771 |
| 130 | 40 | 4 | 5 | −2.382E−04 | 2.619E−02 | 7.097 | 7.525 | 19.958 |
| 130 | 40 | 4 | 10 | −4.294E−04 | 4.503E−02 | 6.712 | 7.285 | 14.848 |
| 130 | 40 | 4 | 15 | −6.656E−04 | 6.600E−02 | 6.283 | 6.832 | 9.160 |
| 130 | 60 | 4 | 5 | −2.956E−04 | 4.260E−02 | 5.882 | 7.322 | 54.137 |
| 130 | 60 | 4 | 10 | −2.327E−04 | 3.046E−02 | 6.505 | 7.362 | 40.903 |
| 130 | 60 | 4 | 15 | −2.454E−04 | 3.086E−02 | 6.557 | 7.347 | 35.771 |
| 130 | 20 | 6 | 5 | −9.138E−04 | 1.176E−01 | 7.215 | 10.401 | 38.738 |
| 130 | 20 | 6 | 10 | −1.123E−03 | 1.393E−01 | 6.762 | 10.205 | 34.046 |
| 130 | 20 | 6 | 15 | −1.349E−03 | 1.619E−01 | 6.289 | 9.933 | 30.027 |
| 130 | 40 | 6 | 5 | −6.199E−04 | 8.046E−02 | 8.411 | 10.631 | 39.799 |
| 130 | 40 | 6 | 10 | −8.738E−04 | 1.104E−01 | 7.573 | 10.428 | 36.297 |
| 130 | 40 | 6 | 15 | −8.290E−04 | 1.021E−01 | 7.902 | 10.378 | 33.190 |
| 130 | 60 | 6 | 5 | −4.802E−04 | 6.662E−02 | 8.329 | 10.436 | 48.749 |
| 130 | 60 | 6 | 10 | −7.495E−04 | 9.790E−02 | 7.471 | 10.211 | 40.612 |

TABLE 8-continued

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 130 | 60 | 6 | 15 | −2.921E−04 | 4.197E−02 | 9.120 | 10.532 | 53.699 |
| 130 | 20 | 8 | 5 | −6.017E−04 | 8.377E−02 | 10.895 | 13.561 | 49.232 |
| 130 | 20 | 8 | 10 | −1.514E−03 | 2.125E−01 | 6.478 | 13.335 | 50.320 |
| 130 | 20 | 8 | 15 | −1.020E−03 | 1.436E−01 | 8.926 | 13.590 | 50.811 |
| 130 | 40 | 8 | 5 | −1.371E−03 | 2.055E−01 | 5.755 | 13.146 | 59.907 |
| 130 | 40 | 8 | 10 | −8.385E−04 | 1.162E−01 | 9.484 | 13.154 | 48.632 |
| 130 | 40 | 8 | 15 | −6.586E−04 | 8.640E−02 | 10.683 | 13.124 | 41.178 |
| 130 | 60 | 8 | 5 | −9.642E−04 | 1.365E−01 | 8.291 | 12.769 | 51.599 |
| 130 | 60 | 8 | 10 | −8.254E−04 | 1.160E−01 | 9.022 | 12.781 | 50.596 |
| 130 | 60 | 8 | 15 | −5.505E−04 | 7.490E−02 | 10.490 | 12.772 | 46.049 |

TABLE 9

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 134 | 20 | 2 | 5 | −3.520E−05 | 2.970E−03 | 3.429 | 3.411 | −5.624 |
| 134 | 40 | 2 | 5 | −2.821E−05 | 2.517E−04 | 4.192 | 3.986 | −81.077 |
| 134 | 60 | 2 | 5 | −1.969E−05 | −1.094E−03 | 4.181 | 3.924 | −145.579 |
| 134 | 20 | 2 | 10 | −3.415E−05 | 2.643E−03 | 3.549 | 3.510 | −12.618 |
| 134 | 40 | 2 | 10 | −2.308E−05 | −6.724E−04 | 4.335 | 4.088 | −119.139 |
| 134 | 60 | 2 | 10 | −1.832E−05 | −1.433E−03 | 4.303 | 4.026 | −168.228 |
| 134 | 20 | 2 | 15 | −3.365E−05 | 2.470E−03 | 3.639 | 3.588 | −16.587 |
| 134 | 40 | 2 | 15 | −2.165E−05 | −1.030E−03 | 4.427 | 4.159 | −137.565 |
| 134 | 60 | 2 | 15 | −1.703E−05 | −1.730E−03 | 4.391 | 4.098 | −191.581 |
| 134 | 20 | 4 | 5 | −9.042E−05 | 9.811E−03 | 7.079 | 7.229 | 18.495 |
| 134 | 40 | 4 | 5 | −1.862E−04 | 2.057E−02 | 7.148 | 7.491 | 20.488 |
| 134 | 60 | 4 | 5 | −4.328E−04 | 4.557E−02 | 6.245 | 6.840 | 15.282 |
| 134 | 20 | 4 | 10 | −1.171E−04 | 1.381E−02 | 7.033 | 7.327 | 27.895 |
| 134 | 40 | 4 | 10 | −2.767E−04 | 2.960E−02 | 7.001 | 7.424 | 16.973 |
| 134 | 60 | 4 | 10 | −3.342E−04 | 4.432E−02 | 5.979 | 7.261 | 42.606 |
| 134 | 20 | 4 | 15 | −1.179E−04 | 1.379E−02 | 7.122 | 7.408 | 26.985 |
| 134 | 40 | 4 | 15 | −4.279E−04 | 4.407E−02 | 6.694 | 7.194 | 12.979 |
| 134 | 60 | 4 | 15 | −2.240E−04 | 2.635E−02 | 6.704 | 7.261 | 27.640 |
| 134 | 20 | 6 | 5 | −7.885E−04 | 1.025E−01 | 7.538 | 10.379 | 40.024 |
| 134 | 40 | 6 | 5 | −4.789E−04 | 6.077E−02 | 9.027 | 10.618 | 36.904 |
| 134 | 60 | 6 | 5 | −9.441E−04 | 1.172E−01 | 6.927 | 9.832 | 34.187 |
| 134 | 20 | 6 | 10 | −1.054E−03 | 1.318E−01 | 6.837 | 10.161 | 35.043 |
| 134 | 40 | 6 | 10 | −6.395E−04 | 8.044E−02 | 8.458 | 10.518 | 35.787 |
| 134 | 60 | 6 | 10 | −9.782E−04 | 1.195E−01 | 6.920 | 9.754 | 32.178 |
| 134 | 20 | 6 | 15 | −1.163E−03 | 1.427E−01 | 6.650 | 10.071 | 32.694 |
| 134 | 40 | 6 | 15 | −9.023E−04 | 1.114E−01 | 7.547 | 10.261 | 33.420 |
| 134 | 60 | 6 | 15 | −5.839E−04 | 7.768E−02 | 7.982 | 10.244 | 43.045 |
| 134 | 20 | 8 | 5 | −1.029E−03 | 1.439E−01 | 8.718 | 13.333 | 49.832 |
| 134 | 40 | 8 | 5 | −1.802E−03 | 2.316E−01 | 6.180 | 12.426 | 38.511 |
| 134 | 60 | 8 | 5 | −1.663E−03 | 2.239E−01 | 5.724 | 12.402 | 44.614 |
| 134 | 20 | 8 | 10 | −1.962E−03 | 2.534E−01 | 5.607 | 12.522 | 39.151 |
| 134 | 40 | 8 | 10 | −2.430E−03 | 3.067E−01 | 3.953 | 11.871 | 36.208 |
| 134 | 60 | 8 | 10 | −8.940E−04 | 1.251E−01 | 8.702 | 12.715 | 49.871 |
| 134 | 20 | 8 | 15 | −1.453E−03 | 1.997E−01 | 7.050 | 13.252 | 47.435 |
| 134 | 40 | 8 | 15 | −1.999E−03 | 2.547E−01 | 5.496 | 12.225 | 37.404 |
| 134 | 60 | 8 | 15 | −6.711E−04 | 9.073E−02 | 9.948 | 12.678 | 45.209 |

TABLE 10

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 138 | 20 | 2 | 5 | −3.200E−05 | 2.565E−03 | 3.353 | 3.324 | −9.844 |
| 138 | 40 | 2 | 5 | −5.260E−05 | 4.305E−03 | 3.918 | 3.880 | −8.156 |
| 138 | 60 | 2 | 5 | −1.801E−05 | −1.218E−03 | 4.103 | 3.847 | −157.625 |
| 138 | 20 | 2 | 10 | −3.040E−05 | 2.278E−03 | 3.468 | 3.427 | −15.068 |
| 138 | 40 | 2 | 10 | −2.702E−05 | 1.746E−04 | 4.190 | 3.987 | −83.538 |

TABLE 10-continued

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 138 | 60 | 2 | 10 | −1.661E−05 | −1.555E−03 | 4.223 | 3.948 | −183.664 |
| 138 | 20 | 2 | 15 | −2.979E−05 | 2.123E−03 | 3.554 | 3.504 | −18.741 |
| 138 | 40 | 2 | 15 | −2.239E−05 | −7.013E−04 | 4.306 | 4.061 | −121.326 |
| 138 | 60 | 2 | 15 | −1.532E−05 | −1.845E−03 | 4.311 | 4.021 | −210.441 |
| 138 | 20 | 4 | 5 | −7.468E−05 | 7.958E−03 | 6.961 | 7.073 | 16.563 |
| 138 | 40 | 4 | 5 | −1.649E−04 | 1.855E−02 | 7.067 | 7.401 | 22.513 |
| 138 | 60 | 4 | 5 | −2.783E−04 | 3.053E−02 | 6.508 | 7.002 | 19.695 |
| 138 | 20 | 4 | 10 | −1.115E−04 | 1.365E−02 | 6.847 | 7.173 | 32.489 |
| 138 | 40 | 4 | 10 | −2.565E−04 | 2.803E−02 | 6.904 | 7.349 | 19.304 |
| 138 | 60 | 4 | 10 | −6.118E−04 | 3.455E−03 | 7.418 | 7.233 | −33.524 |
| 138 | 20 | 4 | 15 | −1.704E−04 | 2.169E−02 | 6.659 | 7.231 | 37.283 |
| 138 | 40 | 4 | 15 | −2.538E−04 | 2.683E−02 | 6.998 | 7.357 | 15.705 |
| 138 | 60 | 4 | 15 | −1.039E−04 | 9.485E−03 | 7.211 | 7.224 | 1.302 |
| 138 | 20 | 6 | 5 | −7.650E−04 | 1.004E−01 | 7.402 | 10.246 | 41.300 |
| 138 | 40 | 6 | 5 | −5.949E−04 | 7.764E−02 | 8.324 | 10.493 | 40.508 |
| 138 | 60 | 6 | 5 | −8.809E−04 | 1.095E−01 | 7.074 | 9.797 | 34.352 |
| 138 | 20 | 6 | 10 | −8.485E−04 | 1.090E−01 | 7.289 | 10.223 | 38.407 |
| 138 | 40 | 6 | 10 | −1.033E−03 | 1.247E−01 | 7.132 | 9.984 | 30.668 |
| 138 | 60 | 6 | 10 | −8.972E−04 | 1.104E−01 | 7.092 | 9.761 | 33.045 |
| 138 | 20 | 6 | 15 | −1.015E−03 | 1.269E−01 | 6.889 | 10.088 | 35.005 |
| 138 | 40 | 6 | 15 | −5.068E−04 | 6.197E−02 | 8.982 | 10.454 | 32.282 |
| 138 | 60 | 6 | 15 | −1.015E−03 | 1.219E−01 | 6.781 | 9.530 | 30.100 |
| 138 | 20 | 8 | 5 | −1.565E−03 | 2.187E−01 | 6.047 | 13.051 | 49.732 |
| 138 | 40 | 8 | 5 | −1.334E−03 | 1.815E−01 | 7.384 | 12.910 | 46.016 |
| 138 | 60 | 8 | 5 | −6.407E−04 | 8.409E−02 | 10.325 | 12.703 | 41.243 |
| 138 | 20 | 8 | 10 | −1.303E−03 | 1.821E−01 | 7.351 | 13.192 | 49.820 |
| 138 | 40 | 8 | 10 | −1.284E−03 | 1.734E−01 | 7.681 | 12.886 | 45.024 |
| 138 | 60 | 8 | 10 | −1.159E−03 | 1.599E−01 | 7.556 | 12.559 | 47.975 |
| 138 | 20 | 8 | 15 | −1.374E−03 | 1.916E−01 | 7.106 | 13.227 | 49.511 |
| 138 | 40 | 8 | 15 | −1.957E−03 | 2.472E−01 | 5.686 | 12.084 | 36.321 |
| 138 | 60 | 8 | 15 | −7.031E−04 | 9.422E−02 | 9.816 | 12.600 | 43.993 |

TABLE 11

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 142 | 20 | 2 | 5 | −2.767E−05 | 2.108E−03 | 3.270 | 3.236 | −13.808 |
| 142 | 40 | 2 | 5 | −7.500E−05 | 8.176E−03 | 3.623 | 3.752 | 19.022 |
| 142 | 60 | 2 | 5 | −1.714E−05 | −1.116E−03 | 4.004 | 3.760 | −158.006 |
| 142 | 20 | 2 | 10 | −2.653E−05 | 1.881E−03 | 3.379 | 3.334 | −19.109 |
| 142 | 40 | 2 | 10 | −3.745E−05 | 2.205E−03 | 3.971 | 3.866 | −31.118 |
| 142 | 60 | 2 | 10 | −1.522E−05 | −1.567E−03 | 4.124 | 3.859 | −192.937 |
| 142 | 20 | 2 | 15 | −2.585E−05 | 1.771E−03 | 3.461 | 3.411 | −21.493 |
| 142 | 40 | 2 | 15 | −2.586E−05 | 1.809E−04 | 4.137 | 3.944 | −83.003 |
| 142 | 60 | 2 | 15 | −1.378E−05 | −1.876E−03 | 4.213 | 3.932 | −226.131 |
| 142 | 20 | 4 | 5 | −9.928E−05 | 1.306E−02 | 6.503 | 6.874 | 41.532 |
| 142 | 40 | 4 | 5 | −1.573E−04 | 1.836E−02 | 6.898 | 7.277 | 26.742 |
| 142 | 60 | 4 | 5 | −2.148E−04 | 2.498E−02 | 6.509 | 7.018 | 26.303 |
| 142 | 20 | 4 | 10 | −1.399E−04 | 1.914E−02 | 6.385 | 6.975 | 46.866 |
| 142 | 40 | 4 | 10 | −1.486E−04 | 1.674E−02 | 7.041 | 7.344 | 22.693 |
| 142 | 60 | 4 | 10 | −1.682E−04 | 1.840E−02 | 6.788 | 7.082 | 19.364 |
| 142 | 20 | 4 | 15 | −1.508E−04 | 2.055E−02 | 6.427 | 7.055 | 46.258 |
| 142 | 40 | 4 | 15 | −1.160E−04 | 1.254E−02 | 7.214 | 7.403 | 18.107 |
| 142 | 60 | 4 | 15 | −1.159E−04 | 1.148E−02 | 7.018 | 7.112 | 9.057 |
| 142 | 20 | 6 | 5 | −8.279E−04 | 1.131E−01 | 6.641 | 10.110 | 46.556 |
| 142 | 40 | 6 | 5 | −5.491E−04 | 7.239E−02 | 8.309 | 10.376 | 41.829 |
| 142 | 60 | 6 | 5 | −4.923E−04 | 6.647E−02 | 8.120 | 10.114 | 45.022 |
| 142 | 20 | 6 | 10 | −8.281E−04 | 1.091E−01 | 6.985 | 10.096 | 41.746 |
| 142 | 40 | 6 | 10 | −5.833E−04 | 7.580E−02 | 8.261 | 10.358 | 39.943 |
| 142 | 60 | 6 | 10 | −5.093E−04 | 6.782E−02 | 8.118 | 10.097 | 43.178 |
| 142 | 20 | 6 | 15 | −1.007E−03 | 1.290E−01 | 6.520 | 9.969 | 38.054 |
| 142 | 40 | 6 | 15 | −4.728E−04 | 6.178E−02 | 8.710 | 10.441 | 40.669 |
| 142 | 60 | 6 | 15 | −6.206E−04 | 8.039E−02 | 7.744 | 9.952 | 39.531 |
| 142 | 20 | 8 | 5 | −1.358E−03 | 1.925E−01 | 6.587 | 12.918 | 51.802 |
| 142 | 40 | 8 | 5 | −1.298E−03 | 1.776E−01 | 7.330 | 12.805 | 46.877 |
| 142 | 60 | 8 | 5 | −1.260E−03 | 1.750E−01 | 6.940 | 12.488 | 48.943 |
| 142 | 20 | 8 | 10 | −2.695E−03 | 3.481E−01 | 2.263 | 11.763 | 39.168 |

TABLE 11-continued

| Cut angle (θ) | Thickness of first dielectric layer h/λ [%] | Thickness of first electrode layer h/λ [%] | Thickness of second electrode layer h/λ [%] | a | b | c | Stop band when groove angle = 90° | Lower limit value of groove angle of region in which stop band is larger than or equal to stop band when groove angle = 90°(°) |
|---|---|---|---|---|---|---|---|---|
| 142 | 40 | 8 | 10 | −1.286E−03 | 1.749E−01 | 7.459 | 12.790 | 46.073 |
| 142 | 60 | 8 | 10 | −1.246E−03 | 1.721E−01 | 7.059 | 12.453 | 48.102 |
| 142 | 20 | 8 | 15 | −1.976E−03 | 2.590E−01 | 5.034 | 12.333 | 41.041 |
| 142 | 40 | 8 | 15 | −1.317E−03 | 1.787E−01 | 7.322 | 12.741 | 45.733 |
| 142 | 60 | 8 | 15 | −1.223E−03 | 1.688E−01 | 7.108 | 12.392 | 47.985 |

Next, regarding the case where the piezoelectric substrate 10 was made of a LiTaO$_3$ substrate, the range of the groove angle, in which the stop band was able to be made larger than the stop band when the groove angle was 90°, was calculated from the results shown in Table 7 to Table 11 and the range of the groove angles which were able to be formed physically. The calculation results are shown in Tables 12 to 15 described below.

Concretely, the lower limit of the groove angle in which the cross-sectional shape of the groove was trapezoidal was about 10°, where the depth of the groove normalized by the wave length was 2% and the duty was 0.4 to 0.6. Consequently, for example, in the case where the lower limit value of the groove angle of the region in which the stop band was larger than or equal to the stop band when the groove angle was 90° was larger than 10°, the lower limit value of the groove angle of the region in which the stop band was larger than or equal to the stop band when the groove angle was 90° was adopted as the lower limit value of the range of the groove angle in which the stop band was able to become larger than the stop band when the groove angle was 90°. Meanwhile, in the case where the lower limit value of the groove angle of the region in which the stop band was larger than or equal to the stop band when the groove angle was 90° was less than 10°, the lower limit value of the range of the groove angle in which the stop band was able to become larger than the stop band when the groove angle was 90° was specified to be 10°.

As is clear from the above description, in the case where the piezoelectric substrate 10 is made of the LiTaO$_3$ substrate, the stop band can be increased by specifying θ of the Euler Angles (φ, θ, ψ) and the groove angle γ to be within the range stipulated in Tables 12 to 15 described below.

In this regard, each of φ and ψ of the above-described data is specified to be 0°, and it is well known to a person skilled in the art that the data with respect to 0° can be applied to the range of 0°±5° in general.

TABLE 12

| Thickness of first dielectric layer h/λ [%] | θ of Euler Angles (φ, θ, ψ) [°] | Thickness of first electrode layer h/λ [%] | Thickness of second electrode layer h/λ [%] | Groove angle [°] |
|---|---|---|---|---|
| 10 < h < λ ≤ 30 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 37.1 ≤ γ < 90.0 |
| | | | 7.5 < Al ≤ 12.5 | 39.9 ≤ γ < 90.0 |
| | | | 12.5 < Al ≤ 17.5 | 39.5 ≤ γ < 90.0 |
| | | 5 < Pt ≤ 7 | 2.5 < Al ≤ 7.5 | 37.7 ≤ γ < 90.0 |
| | | | 7.5 < Al ≤ 12.5 | 32.4 ≤ γ < 90.0 |
| | | | 12.5 < Al ≤ 17.5 | 29.9 ≤ γ < 90.0 |
| | | 7 < Pt ≤ 9 | 2.5 < Al ≤ 7.5 | 52.1 ≤ γ < 90.0 |
| | | | 7.5 < Al ≤ 12.5 | 57.5 ≤ γ < 90.0 |
| | | | 12.5 < Al ≤ 17.5 | 62.8 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 19.3 ≤ γ < 90.0 |
| | | | 7.5 < Al ≤ 12.5 | 32.1 ≤ γ < 90.0 |
| | | | 12.5 < Al ≤ 17.5 | 34.8 ≤ γ < 90.0 |
| | | 5 < Pt ≤ 7 | 2.5 < Al ≤ 7.5 | 38.7 ≤ γ < 90.0 |
| | | | 7.5 < Al ≤ 12.5 | 34 ≤ γ < 90.0 |
| | | | 12.5 < Al ≤ 17.5 | 30 ≤ γ < 90.0 |
| | | 7 < Pt ≤ 9 | 2.5 < Al ≤ 7.5 | 49.2 ≤ γ < 90.0 |
| | | | 7.5 < Al ≤ 12.5 | 50.3 ≤ γ < 90.0 |
| | | | 12.5 < Al ≤ 17.5 | 50.8 ≤ γ < 90.0 |
| | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.5 ≤ γ < 90.0 |
| | | | 7.5 < Al ≤ 12.5 | 27.9 ≤ γ < 90.0 |
| | | | 12.5 < Al ≤ 17.5 | 27 ≤ γ < 90.0 |
| | | 5 < Pt ≤ 7 | 2.5 < Al ≤ 7.5 | 40 ≤ γ < 90.0 |
| | | | 7.5 < Al ≤ 12.5 | 35 ≤ γ < 90.0 |
| | | | 12.5 < Al ≤ 17.5 | 32.7 ≤ γ < 90.0 |
| | | 7 < Pt ≤ 9 | 2.5 < Al ≤ 7.5 | 49.8 ≤ γ < 90.0 |
| | | | 7.5 < Al ≤ 12.5 | 39.2 ≤ γ < 90.0 |
| | | | 12.5 < Al ≤ 17.5 | 47.4 ≤ γ < 90.0 |

TABLE 12-continued

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.0 ≤ γ < 90.0 |
| | | | 7.5 < Al ≤ 12.5 | 32.5 ≤ γ < 90.0 |
| | | | 12.5 < Al ≤ 17.5 | 37.3 ≤ γ < 90.0 |
| | | 5 < Pt ≤ 7 | 2.5 < Al ≤ 7.5 | 41.3 ≤ γ < 90.0 |
| | | | 7.5 < Al ≤ 12.5 | 38.4 ≤ γ < 90.0 |
| | | | 12.5 < Al ≤ 17.5 | 35 ≤ γ < 90.0 |
| | | 7 < Pt ≤ 9 | 2.5 < Al ≤ 7.5 | 49.7 ≤ γ < 90.0 |
| | | | 7.5 < Al ≤ 12.5 | 49.8 ≤ γ < 90.0 |
| | | | 12.5 < Al ≤ 17.5 | 49.5 ≤ γ < 90.0 |

TABLE 13

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 10 < h ≤ λ ≤ 30 | 140 < θ ≤ 144 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 41.5 ≤ γ < 90.0 |
| | | | 7.5 < Al ≤ 12.5 | 46.9 ≤ γ < 90.0 |
| | | | 12.5 < Al ≤ 17.5 | 46.3 ≤ γ < 90.0 |
| | | 5 < Pt ≤ 7 | 2.5 < Al ≤ 7.5 | 46.6 ≤ γ < 90.0 |
| | | | 7.5 < Al ≤ 12.5 | 41.7 ≤ γ < 90.0 |
| | | | 12.5 < Al ≤ 17.5 | 38.1 ≤ γ < 90.0 |
| | | 7 < Pt ≤ 9 | 2.5 < Al ≤ 7.5 | 51.8 ≤ γ < 90.0 |
| | | | 7.5 < Al ≤ 12.5 | 39.2 ≤ γ < 90.0 |
| | | | 12.5 < Al ≤ 17.5 | 41 ≤ γ < 90.0 |
| 30 < h ≤ λ ≤ 50 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.8 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 41.2 ≤ γ < 90.0 |
| | | | 7.5 < Al ≤ 12.5 | 34.2 ≤ γ < 90.0 |
| | | | 12.5 < Al ≤ 17.5 | 32.6 ≤ γ < 90.0 |
| | | 7 < Pt ≤ 9 | 2.5 < Al ≤ 7.5 | 59.2 ≤ γ < 90.0 |
| | | | 7.5 < Al ≤ 12.5 | 58.4 ≤ γ < 90.0 |
| | | | 12.5 < Al ≤ 17.5 | 33.0 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 20 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 39.8 ≤ γ < 90.0 |
| | | | 7.5 < Al ≤ 12.5 | 36.3 ≤ γ < 90.0 |
| | | | 12.5 < Al ≤ 17.5 | 33.2 ≤ γ < 90.0 |
| | | 7 < Pt ≤ 9 | 2.5 < Al ≤ 7.5 | 59.9 ≤ γ < 90.0 |
| | | | 7.5 < Al ≤ 12.5 | 48.6 ≤ γ < 90.0 |
| | | | 12.5 < Al ≤ 17.5 | 41.2 ≤ γ < 90.0 |
| | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 20.5 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 36.9 ≤ γ < 90.0 |
| | | | 7.5 < Al ≤ 12.5 | 35.8 ≤ γ < 90.0 |
| | | | 12.5 < Al ≤ 17.5 | 33.4 ≤ γ < 90.0 |
| | | 7 < Pt ≤ 9 | 2.5 < Al ≤ 7.5 | 38.5 ≤ γ < 90.0 |
| | | | 7.5 < Al ≤ 12.5 | 36.2 ≤ γ < 90.0 |
| | | | 12.5 < Al ≤ 17.5 | 37.4 ≤ γ < 90.0 |

TABLE 14

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 30 < h/λ ≤ 50 | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 22.5 ≤ γ < 90.0 |
| | | | 7.5 < Al ≤ 12.5 | 19.3 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 40.5 ≤ γ < 90.0 |
| | | | 7.5 < Al ≤ 12.5 | 30.7 ≤ γ < 90.0 |
| | | | 12.5 < Al ≤ 17.5 | 32.3 ≤ γ < 90.0 |
| | | 7 < Pt ≤ 9 | 2.5 < Al ≤ 7.5 | 46 ≤ γ < 90.0 |
| | | | 7.5 < Al ≤ 12.5 | 45 ≤ γ < 90.0 |
| | | | 12.5 < Al ≤ 17.5 | 36.3 ≤ γ < 90.0 |
| | 140 < θ ≤ 144 | 1 < Pt ≤ 3 | 2.5 < Al ≤ 7.5 | 19 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 26.7 ≤ γ < 90.0 |
| | | | 7.5 < Al ≤ 12.5 | 22.7 ≤ γ < 90.0 |
| | | | 12.5 < Al ≤ 17.5 | 18.1 ≤ γ < 90.0 |
| | | 5 < Pt ≤ 7 | 2.5 < Al ≤ 7.5 | 41.8 ≤ γ < 90.0 |
| | | | 7.5 < Al ≤ 12.5 | 39.9 ≤ γ < 90.0 |
| | | | 12.5 < Al ≤ 17.5 | 40.7 ≤ γ < 90.0 |
| | | 7 < Pt ≤ 9 | 2.5 < Al ≤ 7.5 | 46.9 ≤ γ < 90.0 |
| | | | 7.5 < Al ≤ 12.5 | 46.1 ≤ γ < 90.0 |
| | | | 12.5 < Al ≤ 17.5 | 45.7 ≤ γ < 90.0 |
| 50 < h/λ ≤ 70 | 124 < θ ≤ 128 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 56.8 ≤ γ < 90.0 |
| | | | 7.5 < Al ≤ 12.5 | 46.2 ≤ γ < 90.0 |
| | | | 12.5 < Al ≤ 17.5 | 36.5 ≤ γ < 90.0 |
| | | 5 < Pt ≤ 7 | 2.5 < Al ≤ 7.5 | 33.8 ≤ γ < 90.0 |
| | | | 7.5 < Al ≤ 12.5 | 29.4 ≤ γ < 90.0 |
| | | | 12.5 < Al ≤ 17.5 | 26.1 ≤ γ < 90.0 |
| | | 7 < Pt ≤ 9 | 2.5 < Al ≤ 7.5 | 57.2 ≤ γ < 90.0 |
| | | | 7.5 < Al ≤ 12.5 | 51.9 ≤ γ < 90.0 |
| | | | 12.5 < Al ≤ 17.5 | 39.9 ≤ γ < 90.0 |
| | 128 < θ ≤ 132 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 54.1 ≤ γ < 90.0 |
| | | | 7.5 < Al ≤ 12.5 | 40.9 ≤ γ < 90.0 |
| | | | 12.5 < Al ≤ 17.5 | 35.8 ≤ γ < 90.0 |
| | | 5 < Pt ≤ 7 | 2.5 < Al ≤ 7.5 | 48.7 ≤ γ < 90.0 |
| | | | 7.5 < Al ≤ 12.5 | 40.6 ≤ γ < 90.0 |
| | | | 12.5 < Al ≤ 17.5 | 53.7 ≤ γ < 90.0 |
| | | 7 < Pt ≤ 9 | 2.5 < Al ≤ 7.5 | 51.6 ≤ γ < 90.0 |
| | | | 7.5 < Al ≤ 12.5 | 50.6 ≤ γ < 90.0 |
| | | | 12.5 < Al ≤ 17.5 | 46 ≤ γ < 90.0 |

TABLE 15

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| 50 < h/λ ≤ 70 | 132 < θ ≤ 136 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 18.0 ≤ γ < 90.0 |
| | | | 7.5 < Al ≤ 12.5 | 42.6 ≤ γ < 90.0 |
| | | | 12.5 < Al ≤ 17.5 | 27.6 ≤ γ < 90.0 |
| | | 5 < Pt ≤ 7 | 2.5 < Al ≤ 7.5 | 34.2 ≤ γ < 90.0 |
| | | | 7.5 < Al ≤ 12.5 | 32.2 ≤ γ < 90.0 |
| | | | 12.5 < Al ≤ 17.5 | 43 ≤ γ < 90.0 |
| | | 7 < Pt ≤ 9 | 2.5 < Al ≤ 7.5 | 44.6 ≤ γ < 90.0 |
| | | | 7.5 < Al ≤ 12.5 | 49.9 ≤ γ < 90.0 |
| | | | 12.5 < Al ≤ 17.5 | 45.2 ≤ γ < 90.0 |
| | 136 < θ ≤ 140 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 19.7 ≤ γ < 90.0 |
| | | | 7.5 < Al ≤ 12.5 | 18.0 ≤ γ < 90.0 |
| | | | 12.5 < Al ≤ 17.5 | 18.0 ≤ γ < 90.0 |

TABLE 15-continued

| Thickness of first dielectric layer h/λ [%] | θ of Euler Angles (φ, θ, φ) [°] | Thickness of first electrode layer h/λ [%] | Thickness of second electrode layer h/λ [%] | Groove angle [°] |
|---|---|---|---|---|
| | | 5 < Pt ≤ 7 | 2.5 < Al ≤ 7.5 | 34.4 ≤ γ < 90.0 |
| | | | 7.5 < Al ≤ 12.5 | 33 ≤ γ < 90.0 |
| | | | 12.5 < Al ≤ 17.5 | 30.1 ≤ γ < 90.0 |
| | | 7 < Pt ≤ 9 | 2.5 < Al ≤ 7.5 | 41.2 ≤ γ < 90.0 |
| | | | 7.5 < Al ≤ 12.5 | 48 ≤ γ < 90.0 |
| | | | 12.5 < Al ≤ 17.5 | 44 ≤ γ < 90.0 |
| | 140 < θ ≤ 144 | 1 < Pt ≤ 3 | 2.5 < Al ≤ 7.5 | 10.0 ≤ γ < 90.0 |
| | | | 7.5 < Al ≤ 12.5 | 10.0 ≤ γ < 90.0 |
| | | | 12.5 < Al ≤ 17.5 | 10.0 ≤ γ < 90.0 |
| | | 3 < Pt ≤ 5 | 2.5 < Al ≤ 7.5 | 26.3 ≤ γ < 90.0 |
| | | | 7.5 < Al ≤ 12.5 | 19.4 ≤ γ < 90.0 |
| | | | 12.5 < Al ≤ 17.5 | 18.0 ≤ γ < 90.0 |
| | | 5 < Pt ≤ 7 | 2.5 < Al ≤ 7.5 | 45 ≤ γ < 90.0 |
| | | | 7.5 < Al ≤ 12.5 | 43.2 ≤ γ < 90.0 |
| | | | 12.5 < Al ≤ 17.5 | 39.5 ≤ γ < 90.0 |
| | | 7 < Pt ≤ 9 | 2.5 < Al ≤ 7.5 | 48.9 ≤ γ < 90.0 |
| | | | 7.5 < Al ≤ 12.5 | 48.1 ≤ γ < 90.0 |
| | | | 12.5 < Al ≤ 17.5 | 48 ≤ γ < 90.0 |

Meanwhile, in the case where the piezoelectric substrate 10 is LiNbO$_3$, it is preferable that $-5° \le \phi \le +5°$, $+80° \le \theta \le +130°$, $-10° \le \phi \le +10°$, and $10° \le \gamma < 90°$ are satisfied, where the Euler Angles of the piezoelectric substrate are specified to be (φ, θ, φ) and the groove angle is specified to be γ. According to this configuration, in the case where the piezoelectric substrate 10 is made of LiNbO$_3$ and a boundary acoustic wave in the SH (Shear Horizontal) mode is utilized, the stop band can be further increased. Moreover, a propagation loss of the boundary acoustic wave can be reduced particularly, and an occurrence of unnecessary spurious response can be suppressed effectively.

FIG. 80 to FIG. 84 show the relationship between the groove angle (γ) and the stop band, where the cross-sectional shape is as shown in FIG. 17 and the piezoelectric substrate is made of LiNbO$_3$. In this regard, the design parameters of the data shown in FIG. 80 to FIG. 84 are as described below.

Piezoelectric substrate 10: LiNbO$_3$ substrate having Euler Angles (φ, θ, φ) of (0, 85°, 0), (0, 95°, 0), (0, 105°, 0), (0, 115°, 0), or (0, 125°, 0)

Electrode finger ratio (duty) of IDT electrode 13: 0.5

First dielectric layer 11: SiO$_2$ layer (film thickness normalized by wave length: 60%)

First electrode layer 13a; Pt layer (film thickness normalized by wave length: 4%)

Second electrode layer 13b; Al layer (film thickness normalized by wave length: 10%)

First to third diffusion preventing films 13c to 13e; Ti film (film thickness normalized by wave length: 0.5%)

Meanwhile, in the case where the piezoelectric substrate 10 is LiNbO$_3$, it is preferable that $-5° \le \phi \le +5°$, $+200° \le \theta \le +250°$, $-10° \le \phi \le +10°$, and $10° \gamma < 90°$ are satisfied. According to this configuration, in the case where the piezoelectric substrate 10 is made of LiNbO$_3$ and a boundary acoustic wave in the Stoneley mode is utilized, the stop band can be further increased. Moreover, a propagation loss of the boundary acoustic wave can be reduced particularly, and an occurrence of unnecessary spurious response can be suppressed effectively.

FIG. 85 to FIG. 89 show the relationship between the groove angle (γ) and the stop band, where the cross-sectional shape is as shown in FIG. 17 and the piezoelectric substrate is made of LiNbO$_3$. In this regard, the design parameters of the data shown in FIG. 85 to FIG. 89 are as described below.

Piezoelectric substrate 10: LiNbO$_3$ substrate having Euler Angles (φ, θ, φ) of (0, 205°, 0), (0, 215°, 0), (0, 225°, 0), (0, 235°, 0), or (0, 245°, 0)

Electrode finger ratio (duty) of IDT electrode 13: 0.5

First dielectric layer 11: SiO$_2$ layer (film thickness normalized by wave length: 60%)

First electrode layer 13a; Pt layer (film thickness normalized by wave length: 4%)

Second electrode layer 13b; Al layer (film thickness normalized by wave length: 10%)

First to third diffusion preventing films 13c to 13e; Ti film (film thickness normalized by wave length: 0.5%)

In this regard, in the present specification, Euler Angles, a crystallographic axis, and equivalent Euler Angles refer to the following.

(Euler Angles)

In the present specification, as for the Euler Angles (φ, θ, φ) which express the cutting plane of the substrate and the propagation direction of the boundary wave, the right-handed Euler Angles described in a literature, "Danseiha Soshi Gijutu Handobukku (Acoustic Wave Device Technology Handbook)" (the Japan Society for the Promotion of Science, Committee for Acoustic Wave Device Technology 150, First copy, First edition, Issued on Jan. 30, 1991, p. 549) was used.

That is, for example, regarding the crystallographic axes X, Y, and Z of LiNbO$_3$, the X axis was turned about the Z axis by a φ turn counter-clockwise, so as to obtain an Xa axis.

Next, the Z axis was turned about the Xa axis by a θ turn counter-clockwise, so as to obtain a Z' axis.

The cutting plane of the substrate was specified to be the plane including the Xa axis, where the Z' axis was the normal to the plane.

Then, the direction of the X' axis obtained by turning the Xa axis about the Z' axis by a φ turn counter-clockwise was specified to be the propagation direction of the boundary wave.

(Crystallographic Axis)

Furthermore, the crystallographic axes X, Y, and Z axes given as initial values of the Euler Angles are specified to be parallel to the c axis, the X axis is specified to be parallel to any one of a axes in three equivalent directions, and the Y axis is specified to be in the direction of normal to the plane including the X axis and the Z axis.

(Equivalent Euler Angles)

In this regard, it is essential only that the Euler Angles (φ, θ, ψ) in the present invention are crystallographically equivalent.

For example, according to a literature (the Journal of Acoustical Society of Japan, Vol. 36, No. 3, 1980, p. 140-145), $LiNbO_3$ and $LiTaO_3$ are crystals belonging to trigonal system 3 m point group and, therefore, Formula [1] holds.

$$F(\phi, \theta, \varphi) = F(60° - \phi, -\theta, 180° - \varphi) \quad [1]$$
$$= F(60° + \phi, -\theta, \varphi)$$
$$= F(\phi, 180° + \theta, 180° - \varphi)$$
$$= F(\phi, \theta, 180° + \varphi)$$

Here, F represents any boundary wave characteristic, e.g., an electro-mechanical coupling coefficient $k_s^2$, a propagation loss, TCF, PFA, or natural unidirectionality.

It is believed that the natural unidirectionality of PFA, for example, in the case where the positive direction and the negative direction of propagation are reversed, is equivalent in practice because the absolute values are equal, although the sign is changed.

In this regard, the above-described literature relates to the surface acoustic wave. However, the symmetry of crystal is treated in the same manner regarding the boundary wave.

For example, the boundary wave propagation characteristics of the Euler Angles (30°, θ, φ) are equivalent to the boundary wave propagation characteristics of the Euler Angles (90°, 180°−θ, 180°−φ).

Moreover, for example, the boundary wave propagation characteristics of the Euler Angles (30°, 90°, 45° are equivalent to the boundary wave propagation characteristics of the Euler Angles shown in Table 16.

In this regard, the material constant of the conductor used for calculation in the present invention is a value of a polycrystal. However, regarding crystals, e.g., epitaxial films, as well, the crystal orientation dependence of the substrate is predominant over the boundary wave characteristics as compared with the crystal orientation dependence of the film in itself. Therefore, the boundary wave propagation characteristics at the same level to the extent that cause no problem in practice are obtained on the basis of Formula [1].

TABLE 16

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |

TABLE 16-continued

| φ (°) | θ (°) | ψ (°) |
|---|---|---|
| 330 | 90 | 315 |
| 330 | 270 | 45 |
| 330 | 270 | 225 |

Other Modified Preferred Embodiments

In the above-described preferred embodiments, the three-media boundary acoustic wave device formed from a piezoelectric material, and the first and the second dielectric layers is explained. However, the boundary acoustic wave device according to the present invention is not limited to the three-media boundary acoustic wave device. The boundary acoustic wave device according to the present invention may be a two-media boundary acoustic wave device not including the second dielectric layer. In this regard, in the case where the second dielectric layer is disposed, an insertion loss can be reduced because of a waveguide effect and, therefore, it is preferable that the boundary acoustic wave device according to the present invention is the three-media boundary acoustic wave device.

In the present invention, the IDT electrode structure is not limited to the structures shown in the above-described preferred embodiment and the first modified preferred embodiment. The IDT electrode may have, for example, structures as shown in FIG. 11 to FIG. 16.

Figure 11:
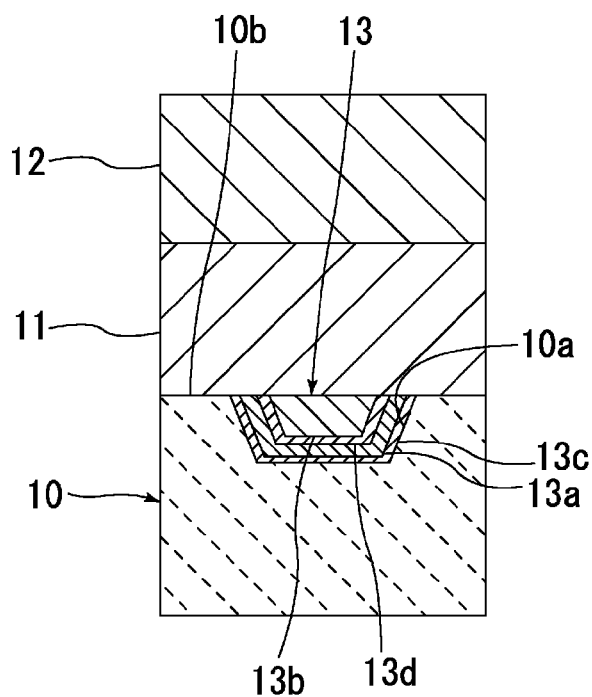
FIG. 11 is a magnified schematic cross-sectional view of a portion of an IDT electrode in a second modified preferred embodiment of the present invention.

In the example shown in FIG. 11, the IDT electrode 13 is formed from a first diffusion preventing film 13c disposed in a groove 10a on a piezoelectric substrate 10, a first electrode layer 13a disposed on the first diffusion preventing film 13c, a second electrode layer 13b disposed on the first electrode layer 13a, and a second diffusion preventing film 13d disposed between the first electrode layer 13a and the second electrode layer 13b. Then, all the first and the second electrode layers 13a and 13b and the first and the second diffusion preventing films 13c and 13d are disposed in the groove 10a. As shown in FIG. 11, diffusion of the electrode material from the electrode layers 13a and 13b can be prevented by disposing the diffusion preventing films 13c and 13d between the electrode layers 13a and 13b adjacent to each other and between the electrode layer 13a and the piezoelectric substrate 10. Furthermore, the adhesion between the electrode layers 13a and 13b can be enhanced.

The material for the diffusion preventing films 13c and 13d is not specifically limited. For example, the diffusion preventing films 13c and 13d can be made of, for example, at least one type of metal selected from the group consisting of Ti, Ni, Cr, and Ta or an alloy containing at least one type of metal selected from the group consisting of Ti, Ni, Cr, and Ta.

Figure 12:
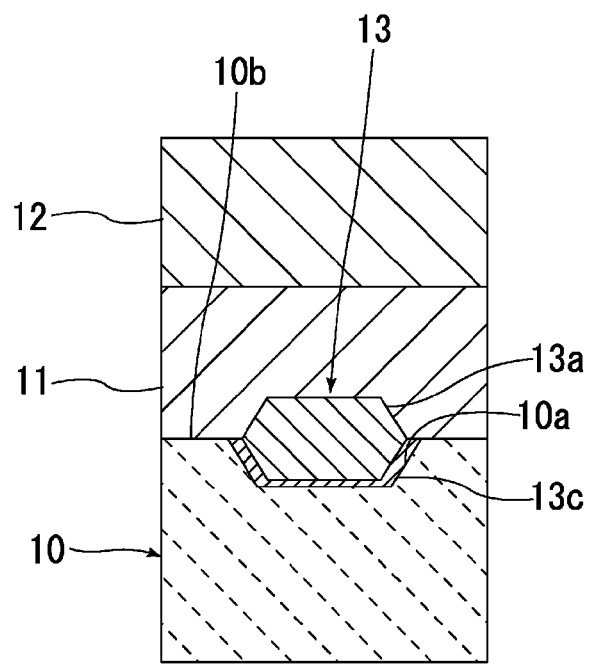
FIG. 12 is a magnified schematic cross-sectional view of a portion of an IDT electrode in a third modified preferred embodiment of the present invention.

Alternatively, in the example shown in FIG. 12, only a first electrode layer 13a is disposed as the electrode layer, and a first diffusion preventing film 13c is disposed between the first electrode layer 13a and the piezoelectric substrate 10. A part of the first electrode layer 13a is located in the groove 10a, and the remainder portion is located outside the groove 10a.

Figure 13:
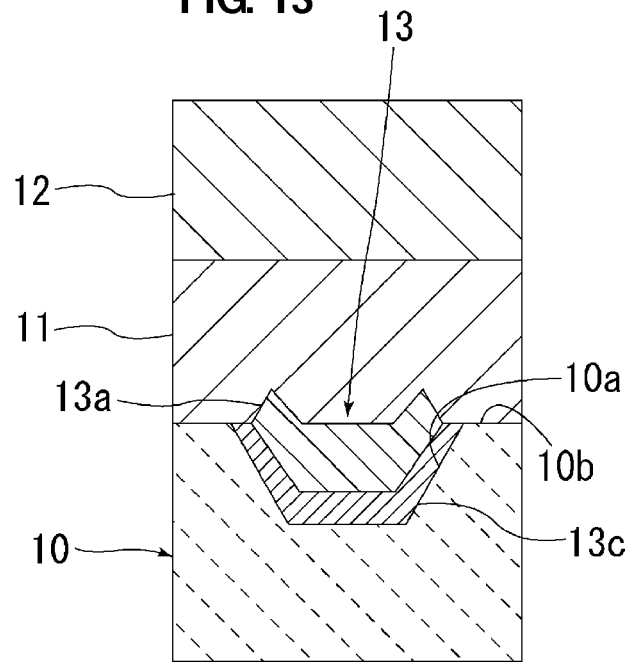
FIG. 13 is a magnified schematic cross-sectional view of a portion of an IDT electrode in a fourth modified preferred embodiment of the present invention.

Regarding the example shown in FIG. 13, as in the example shown in FIG. 12, the IDT electrode 13 is formed from a first electrode layer 13a and a first diffusion preventing film 13c. In the example shown in FIG. 13, the surface of the central portion of the first electrode layer 13a is flush with the surface 10b of a piezoelectric substrate 10, and a portion excluding the end portion of the first electrode layer 13a is located in the groove 10a.

Figure 14:
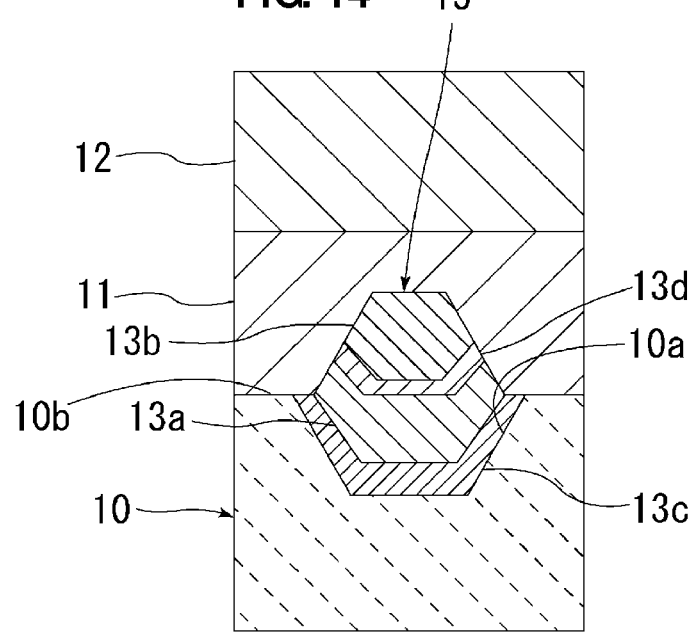
FIG. 14 is a magnified schematic cross-sectional view of a portion of an IDT electrode in a fifth modified preferred embodiment of the present invention.

Regarding the example shown in FIG. 14, as in the example shown in FIG. 11, the IDT electrode 13 is formed from first and second electrode layers 13a and 13b and first and second diffusion preventing films 13c and 13d. In the example shown in FIG. 11, the whole IDT electrode 13 is located in the groove 10a. However, in the example shown in FIG. 14, a part of the first electrode layer 13a, the second diffusion preventing film 13d, and the second electrode layer 13b are located outside the groove 10a. Consequently, in the example shown in FIG. 14, in the inside of the groove 10a, only the first electrode layer 13a made of a high-density electrically conductive material is located, and the second electrode layer 13b made of a low-density electrically conductive material is not located.

Figure 15:
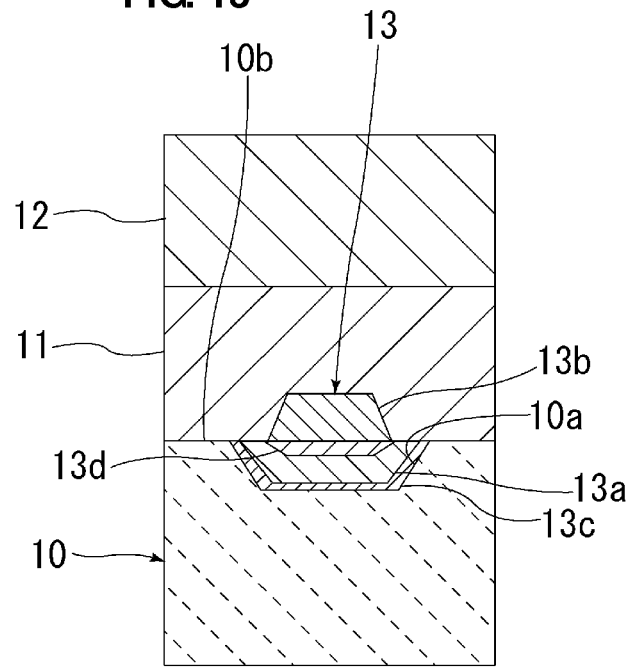
FIG. 15 is a magnified schematic cross-sectional view of a portion of an IDT electrode in a sixth modified preferred embodiment of the present invention.

Regarding the example shown in FIG. 15 as well, as in the example shown in FIG. 11 and the example shown in FIG. 14, the IDT electrode 13 is formed from first and second electrode layers 13a and 13b and first and second diffusion preventing films 13c and 13d. In the example shown in FIG. 15, only the first electrode layer 13a made of a high-density electrically conductive material of the first and the second electrode layers 13a and 13b is located in the groove 10a, and the second electrode layer 13b is located outside the groove 10a. Concretely, the first electrode layer 13a and the first and the second diffusion preventing films 13c and 13d are located in the groove 10a, and the second electrode layer 13b is located outside the groove 10a.

Figure 16:
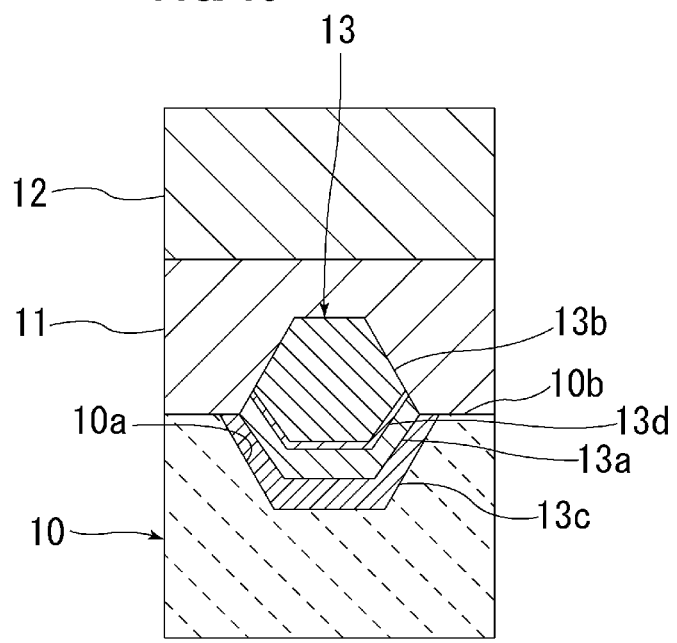
FIG. 16 is a magnified schematic cross-sectional view of a portion of an IDT electrode in a seventh modified preferred embodiment of the present invention.

Regarding the example shown in FIG. 16 as well, as in the examples shown in FIGS. 11, 14 and 15, the IDT electrode 13 is formed from first and second electrode layers 13a and 13b and first and second diffusion preventing films 13c and 13d. In the example shown in FIG. 16, a part of each of the first and the second electrode layers 13a and 13b is located in the groove 10a. That is, a part of the second electrode layer 13b made of a low-density electrically conductive material is also located in the groove 10a.

In this regard, in the examples shown in FIGS. 11 to 16, the case where only the first and the second electrode layers 13a and 13b are included as the electrode layers is explained. However, the IDT electrode 13 may include at least three electrode layers.

Meanwhile, the boundary acoustic wave device according to the present invention may be, for example, a resonator or a filter device.

Furthermore, the cross-sectional shape of the groove disposed in the piezoelectric substrate is not specifically limited to the trapezoidal shape and may be a semi-elliptic shape, a semi-oval shape, a triangular shape, or the like.

Moreover, it is essential only that the angle formed by the upper end portion of the inside surface of the groove with the surface of the piezoelectric substrate is less than 90 degrees, and a portion which forms an angle of 90° or more with the surface of the piezoelectric substrate may be present as a part of the inside surface of the groove.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A boundary acoustic wave device comprising:
   a piezoelectric substrate including a surface provided with a groove;
   a first dielectric layer disposed on the surface of the piezoelectric substrate; and
   an IDT electrode disposed at a boundary between the piezoelectric substrate and the first dielectric layer such that at least a first portion thereof is located in the groove; wherein
   in the inside of the groove, a groove angle, which is defined as an angle between an upper end portion of an inside surface of the groove and the surface of the piezoelectric substrate, is less than 90 degrees;
   the piezoelectric substrate is made of $LiTaO_3$;
   the IDT electrode includes a first electrode layer, which is located in the groove of the piezoelectric substrate and which includes Pt, and a second electrode layer, which is located outside the groove of the piezoelectric substrate and which includes Al, and the first dielectric layer is made of silicon oxide; and
   $\theta$ of the Euler Angles $(\phi, \theta, \psi)$ and the groove angle $\gamma$ are within the range specified in Tables 1 to 4 described below and each of $\phi$ and $\psi$ of the Euler Angles is within the range of $0°\pm5°$, where the Euler Angles of the piezoelectric substrate are specified to be $(\phi, \theta, \psi)$ and the groove angle is specified to be $\gamma$

TABLE 1

| Thickness of first dielectric layer h/λ [%] | θ of Euler Angles (φ, θ, ψ) [°] | Thickness of first electrode layer h/λ [%] |
|---|---|---|
| 10 < h < λ ≤ 30 | 124 < θ ≤ 128 | 1 < Pt ≤ 3 |
|  |  | 3 < Pt ≤ 5 |
|  |  | 5 < Pt ≤ 7 |
|  |  | 7 < Pt ≤ 9 |
|  | 128 < θ ≤ 132 | 1 < Pt ≤ 3 |
|  |  | 3 < Pt ≤ 5 |
|  |  | 5 < Pt ≤ 7 |
|  |  | 7 < Pt ≤ 9 |
|  | 132 < θ ≤ 136 | 1 < Pt ≤ 3 |
|  |  | 3 < Pt ≤ 5 |
|  |  | 5 < Pt ≤ 7 |
|  |  | 7 < Pt ≤ 9 |
|  | 136 < θ ≤ 140 | 1 < Pt ≤ 3 |
|  |  | 3 < Pt ≤ 5 |
|  |  | 5 < Pt ≤ 7 |
|  |  | 7 < Pt ≤ 9 |

| Thickness of first dielectric layer h/λ [%] | θ of Euler Angles (φ, θ, ψ) [°] | Thickness of second electrode layer h/λ [%] | Groove angle [°] |
|---|---|---|---|
| 10 < h < λ ≤ 30 | 124 < θ ≤ 128 | 2.5 < Al ≤ 7.5 | 10.0 ≤ γ < 90.0 |
|  |  | 7.5 < Al ≤ 12.5 | 10.0 ≤ γ < 90.0 |
|  |  | 12.5 < Al ≤ 17.5 | 10.0 ≤ γ < 90.0 |
|  |  | 2.5 < Al ≤ 7.5 | 37.1 ≤ γ < 90.0 |
|  |  | 7.5 < Al ≤ 12.5 | 39.9 ≤ γ < 90.0 |
|  |  | 12.5 < Al ≤ 17.5 | 39.5 ≤ γ < 90.0 |
|  |  | 2.5 < Al ≤ 7.5 | 37.7 ≤ γ < 90.0 |
|  |  | 7.5 < Al ≤ 12.5 | 32.4 ≤ γ < 90.0 |
|  |  | 12.5 < Al ≤ 17.5 | 29.9 ≤ γ < 90.0 |
|  |  | 2.5 < Al ≤ 7.5 | 52.1 ≤ γ < 90.0 |
|  |  | 7.5 < Al ≤ 12.5 | 57.5 ≤ γ < 90.0 |
|  |  | 12.5 < Al ≤ 17.5 | 62.8 ≤ γ < 90.0 |
|  | 128 < θ ≤ 132 | 2.5 < Al ≤ 7.5 | 10.0 ≤ γ < 90.0 |
|  |  | 7.5 < Al ≤ 12.5 | 10.0 ≤ γ < 90.0 |
|  |  | 12.5 < Al ≤ 17.5 | 10.0 ≤ γ < 90.0 |
|  |  | 2.5 < Al ≤ 7.5 | 19.3 ≤ γ < 90.0 |
|  |  | 7.5 < Al ≤ 12.5 | 32.1 ≤ γ < 90.0 |
|  |  | 12.5 < Al ≤ 17.5 | 34.8 ≤ γ < 90.0 |
|  |  | 2.5 < Al ≤ 7.5 | 38.7 ≤ γ < 90.0 |
|  |  | 7.5 < Al ≤ 12.5 | 34 ≤ γ < 90.0 |
|  |  | 12.5 < Al ≤ 17.5 | 30 ≤ γ < 90.0 |
|  |  | 2.5 < Al ≤ 7.5 | 49.2 ≤ γ < 90.0 |
|  |  | 7.5 < Al ≤ 12.5 | 50.3 ≤ γ < 90.0 |
|  |  | 12.5 < Al ≤ 17.5 | 50.8 ≤ γ < 90.0 |

TABLE 1-continued

| Thickness of first dielectric layer h/λ [%] | θ of Euler Angles (φ, θ, φ) [°] | Thickness of second electrode layer h/λ [%] | Groove angle [°] |
|---|---|---|---|
| | 132 < θ ≤ 136 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 18.5 ≤ γ < 90.0 |
| | | 7.5 < Al ≤ 12.5 | 27.9 ≤ γ < 90.0 |
| | | 12.5 < Al ≤ 17.5 | 27 ≤ γ < 90.0 |
| | | 2.5 < Al ≤ 7.5 | 40 ≤ γ < 90.0 |
| | | 7.5 < Al ≤ 12.5 | 35 ≤ γ < 90.0 |
| | | 12.5 < Al ≤ 17.5 | 32.7 ≤ γ < 90.0 |
| | | 2.5 < Al ≤ 7.5 | 49.8 ≤ γ < 90.0 |
| | | 7.5 < Al ≤ 12.5 | 39.2 ≤ γ < 90.0 |
| | | 12.5 < Al ≤ 17.5 | 47.4 ≤ γ < 90.0 |
| | 136 < θ ≤ 140 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 18.0 ≤ γ < 90.0 |
| | | 7.5 < Al ≤ 12.5 | 32.5 ≤ γ < 90.0 |
| | | 12.5 < Al ≤ 17.5 | 37.3 ≤ γ < 90.0 |
| | | 2.5 < Al ≤ 7.5 | 41.3 ≤ γ < 90.0 |
| | | 7.5 < Al ≤ 12.5 | 38.4 ≤ γ < 90.0 |
| | | 12.5 < Al ≤ 17.5 | 35 ≤ γ < 90.0 |
| | | 2.5 < Al ≤ 7.5 | 49.7 ≤ γ < 90.0 |
| | | 7.5 < Al ≤ 12.5 | 49.8 ≤ γ < 90.0 |
| | | 12.5 < Al ≤ 17.5 | 49.5 ≤ γ < 90.0 |

TABLE 2

| Thickness of first dielectric layer h/λ [%] | θ of Euler Angles (φ, θ, φ) [°] | Thickness of first electrode layer h/λ [%] |
|---|---|---|
| 10 < h < λ ≤ 30 | 140 < θ ≤ 144 | 1 < Pt ≤ 3 |
| | | 3 < Pt ≤ 5 |
| | | 5 < Pt ≤ 7 |
| | | 7 < Pt ≤ 9 |
| 30 < h < λ ≤ 50 | 124 < θ ≤ 128 | 1 < Pt ≤ 3 |
| | | 3 < Pt ≤ 5 |
| | | 5 < Pt ≤ 7 |
| | | 7 < Pt ≤ 9 |
| | 128 < θ ≤ 132 | 1 < Pt ≤ 3 |
| | | 3 < Pt ≤ 5 |
| | | 5 < Pt ≤ 7 |
| | | 7 < Pt ≤ 9 |
| | 132 < θ ≤ 136 | 1 < Pt ≤ 3 |
| | | 3 < Pt ≤ 5 |
| | | 5 < Pt ≤ 7 |
| | | 7 < Pt ≤ 9 |

| Thickness of first dielectric layer h/λ [%] | θ of Euler Angles (φ, θ, φ) [°] | Thickness of second electrode layer h/λ [%] | Groove angle [°] |
|---|---|---|---|
| 10 < h < λ ≤ 30 | 140 < θ ≤ 144 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 41.5 ≤ γ < 90.0 |
| | | 7.5 < Al ≤ 12.5 | 46.9 ≤ γ < 90.0 |
| | | 12.5 < Al ≤ 17.5 | 46.3 ≤ γ < 90.0 |
| | | 2.5 < Al ≤ 7.5 | 46.6 ≤ γ < 90.0 |
| | | 7.5 < Al ≤ 12.5 | 41.7 ≤ γ < 90.0 |
| | | 12.5 < Al ≤ 17.5 | 38.1 ≤ γ < 90.0 |
| | | 2.5 < Al ≤ 7.5 | 51.8 ≤ γ < 90.0 |
| | | 7.5 < Al ≤ 12.5 | 39.2 ≤ γ < 90.0 |
| | | 12.5 < Al ≤ 17.5 | 41 ≤ γ < 90.0 |
| 30 < h < λ ≤ 50 | 124 < θ ≤ 128 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 18.8 ≤ γ < 90.0 |
| | | 7.5 < Al ≤ 12.5 | 18.0 ≤ γ < 90.0 |
| | | 12.5 < Al ≤ 17.5 | 18.0 ≤ γ < 90.0 |
| | | 2.5 < Al ≤ 7.5 | 41.2 ≤ γ < 90.0 |
| | | 7.5 < Al ≤ 12.5 | 34.2 ≤ γ < 90.0 |
| | | 12.5 < Al ≤ 17.5 | 32.6 ≤ γ < 90.0 |
| | | 2.5 < Al ≤ 7.5 | 59.2 ≤ γ < 90.0 |
| | | 7.5 < Al ≤ 12.5 | 58.4 ≤ γ < 90.0 |
| | | 12.5 < Al ≤ 17.5 | 33.0 ≤ γ < 90.0 |

TABLE 2-continued

| Thickness of first dielectric layer h/λ [%] | θ of Euler Angles (φ, θ, φ) [°] | Thickness of second electrode layer h/λ [%] | Groove angle [°] |
|---|---|---|---|
| | 128 < θ ≤ 132 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 20 ≤ γ < 90.0 |
| | | 7.5 < Al ≤ 12.5 | 18.0 ≤ γ < 90.0 |
| | | 12.5 < Al ≤ 17.5 | 18.0 ≤ γ < 90.0 |
| | | 2.5 < Al ≤ 7.5 | 39.8 ≤ γ < 90.0 |
| | | 7.5 < Al ≤ 12.5 | 36.3 ≤ γ < 90.0 |
| | | 12.5 < Al ≤ 17.5 | 33.2 ≤ γ < 90.0 |
| | | 2.5 < Al ≤ 7.5 | 59.9 ≤ γ < 90.0 |
| | | 7.5 < Al ≤ 12.5 | 48.6 ≤ γ < 90.0 |
| | | 12.5 < Al ≤ 17.5 | 41.2 ≤ γ < 90.0 |
| | 132 < θ ≤ 136 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 20.5 ≤ γ < 90.0 |
| | | 7.5 < Al ≤ 12.5 | 18.0 ≤ γ < 90.0 |
| | | 12.5 < Al ≤ 17.5 | 18.0 ≤ γ < 90.0 |
| | | 2.5 < Al ≤ 7.5 | 36.9 ≤ γ < 90.0 |
| | | 7.5 < Al ≤ 12.5 | 35.8 ≤ γ < 90.0 |
| | | 12.5 < Al ≤ 17.5 | 33.4 ≤ γ < 90.0 |
| | | 2.5 < Al ≤ 7.5 | 38.5 ≤ γ < 90.0 |
| | | 7.5 < Al ≤ 12.5 | 36.2 ≤ γ < 90.0 |
| | | 12.5 < Al ≤ 17.5 | 37.4 ≤ γ < 90.0 |

TABLE 3

| Thickness of first dielectric layer h/λ [%] | θ of Euler Angles (φ, θ, φ) [°] | Thickness of first electrode layer h/λ [%] |
|---|---|---|
| 30 < h < λ ≤ 50 | 136 < θ ≤ 140 | 1 < Pt ≤ 3 |
| | | 3 < Pt ≤ 5 |
| | | 5 < Pt ≤ 7 |
| | | 7 < Pt ≤ 9 |
| | 140 < θ ≤ 144 | 1 < Pt ≤ 3 |
| | | 3 < Pt ≤ 5 |
| | | 5 < Pt ≤ 7 |
| | | 7 < Pt ≤ 9 |
| 50 < h < λ ≤ 70 | 124 < θ ≤ 128 | 1 < Pt ≤ 3 |
| | | 3 < Pt ≤ 5 |
| | | 5 < Pt ≤ 7 |
| | | 7 < Pt ≤ 9 |
| | 128 < θ ≤ 132 | 1 < Pt ≤ 3 |
| | | 3 < Pt ≤ 5 |
| | | 5 < Pt ≤ 7 |
| | | 7 < Pt ≤ 9 |

| Thickness of first dielectric layer h/λ [%] | θ of Euler Angles (φ, θ, φ) [°] | Thickness of second electrode layer h/λ [%] | Groove angle [°] |
|---|---|---|---|
| 30 < h < λ ≤ 50 | 136 < θ ≤ 140 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 22.5 ≤ γ < 90.0 |
| | | 7.5 < Al ≤ 12.5 | 19.3 ≤ γ < 90.0 |
| | | 12.5 < Al ≤ 17.5 | 18.0 ≤ γ < 90.0 |
| | | 2.5 < Al ≤ 7.5 | 40.5 ≤ γ < 90.0 |
| | | 7.5 < Al ≤ 12.5 | 30.7 ≤ γ < 90.0 |
| | | 12.5 < Al ≤ 17.5 | 32.3 ≤ γ < 90.0 |
| | | 2.5 < Al ≤ 7.5 | 46 ≤ γ < 90.0 |
| | | 7.5 < Al ≤ 12.5 | 45 ≤ γ < 90.0 |
| | | 12.5 < Al ≤ 17.5 | 36.3 ≤ γ < 90.0 |
| | 140 < θ ≤ 144 | 2.5 < Al ≤ 7.5 | 19 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 26.7 ≤ γ < 90.0 |
| | | 7.5 < Al ≤ 12.5 | 22.7 ≤ γ < 90.0 |
| | | 12.5 < Al ≤ 17.5 | 18.1 ≤ γ < 90.0 |
| | | 2.5 < Al ≤ 7.5 | 41.8 ≤ γ < 90.0 |
| | | 7.5 < Al ≤ 12.5 | 39.9 ≤ γ < 90.0 |
| | | 12.5 < Al ≤ 17.5 | 40.7 ≤ γ < 90.0 |
| | | 2.5 < Al ≤ 7.5 | 46.9 ≤ γ < 90.0 |
| | | 7.5 < Al ≤ 12.5 | 46.1 ≤ γ < 90.0 |
| | | 12.5 < Al ≤ 17.5 | 45.7 ≤ γ < 90.0 |

TABLE 3-continued

| Thickness of first dielectric layer h/λ [%] | θ of Euler Angles (φ, θ, φ) [°] | Thickness of first electrode layer h/λ [%] | Groove angle [°] |
|---|---|---|---|
| 50 < h < λ ≤ 70 | 124 < θ ≤ 128 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 56.8 ≤ γ < 90.0 |
| | | 7.5 < Al ≤ 12.5 | 46.2 ≤ γ < 90.0 |
| | | 12.5 < Al ≤ 17.5 | 36.5 ≤ γ < 90.0 |
| | | 2.5 < Al ≤ 7.5 | 33.8 ≤ γ < 90.0 |
| | | 7.5 < Al ≤ 12.5 | 29.4 ≤ γ < 90.0 |
| | | 12.5 < Al ≤ 17.5 | 26.1 ≤ γ < 90.0 |
| | | 2.5 < Al ≤ 7.5 | 57.2 ≤ γ < 90.0 |
| | | 7.5 < Al ≤ 12.5 | 51.9 ≤ γ < 90.0 |
| | | 12.5 < Al ≤ 17.5 | 39.9 ≤ γ < 90.0 |
| | 128 < θ ≤ 132 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 54.1 ≤ γ < 90.0 |
| | | 7.5 < Al ≤ 12.5 | 40.9 ≤ γ < 90.0 |
| | | 12.5 < Al ≤ 17.5 | 35.8 ≤ γ < 90.0 |
| | | 2.5 < Al ≤ 7.5 | 48.7 ≤ γ < 90.0 |
| | | 7.5 < Al ≤ 12.5 | 40.6 ≤ γ < 90.0 |
| | | 12.5 < Al ≤ 17.5 | 53.7 ≤ γ < 90.0 |
| | | 2.5 < Al ≤ 7.5 | 51.6 ≤ γ < 90.0 |
| | | 7.5 < Al ≤ 12.5 | 50.6 ≤ γ < 90.0 |
| | | 12.5 < Al ≤ 17.5 | 46 ≤ γ < 90.0 |

TABLE 4

| Thickness of first dielectric layer h/λ [%] | θ of Euler Angles (φ, θ, φ) [°] | Thickness of first electrode layer h/λ [%] |
|---|---|---|
| 50 < h < λ ≤ 70 | 132 < θ ≤ 136 | 1 < Pt ≤ 3 |
| | | 3 < Pt ≤ 5 |
| | | 5 < Pt ≤ 7 |
| | | 7 < Pt ≤ 9 |
| | 136 < θ ≤ 140 | 1 < Pt ≤ 3 |
| | | 3 < Pt ≤ 5 |
| | | 5 < Pt ≤ 7 |
| | | 7 < Pt ≤ 9 |
| | 140 < θ ≤ 144 | 1 < Pt ≤ 3 |
| | | 3 < Pt ≤ 5 |
| | | 5 < Pt ≤ 7 |
| | | 7 < Pt ≤ 9 |

| Thickness of first dielectric layer h/λ [%] | θ of Euler Angles (φ, θ, φ) [°] | Thickness of second electrode layer h/λ [%] | Groove angle [°] |
|---|---|---|---|
| 50 < h < λ ≤ 70 | 132 < θ ≤ 136 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 18.0 ≤ γ < 90.0 |
| | | 7.5 < Al ≤ 12.5 | 42.6 ≤ γ < 90.0 |
| | | 12.5 < Al ≤ 17.5 | 27.6 ≤ γ < 90.0 |
| | | 2.5 < Al ≤ 7.5 | 34.2 ≤ γ < 90.0 |
| | | 7.5 < Al ≤ 12.5 | 32.2 ≤ γ < 90.0 |
| | | 12.5 < Al ≤ 17.5 | 43 ≤ γ < 90.0 |
| | | 2.5 < Al ≤ 7.5 | 44.6 ≤ γ < 90.0 |
| | | 7.5 < Al ≤ 12.5 | 49.9 ≤ γ < 90.0 |
| | | 12.5 < Al ≤ 17.5 | 45.2 ≤ γ < 90.0 |
| | 136 < θ ≤ 140 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 19.7 ≤ γ < 90.0 |
| | | 7.5 < Al ≤ 12.5 | 18.0 ≤ γ < 90.0 |
| | | 12.5 < Al ≤ 17.5 | 18.0 ≤ γ < 90.0 |
| | | 2.5 < Al ≤ 7.5 | 34.4 ≤ γ < 90.0 |
| | | 7.5 < Al ≤ 12.5 | 33 ≤ γ < 90.0 |
| | | 12.5 < Al ≤ 17.5 | 30.1 ≤ γ < 90.0 |
| | | 2.5 < Al ≤ 7.5 | 41.2 ≤ γ < 90.0 |
| | | 7.5 < Al ≤ 12.5 | 48 ≤ γ < 90.0 |
| | | 12.5 < Al ≤ 17.5 | 44 ≤ γ < 90.0 |
| | 140 < θ ≤ 144 | 2.5 < Al ≤ 7.5 | 10.0 ≤ γ < 90.0 |
| | | 7.5 < Al ≤ 12.5 | 10.0 ≤ γ < 90.0 |
| | | 12.5 < Al ≤ 17.5 | 10.0 ≤ γ < 90.0 |
| | | 2.5 < Al ≤ 7.5 | 26.3 ≤ γ < 90.0 |
| | | 7.5 < Al ≤ 12.5 | 19.4 ≤ γ < 90.0 |
| | | 12.5 < Al ≤ 17.5 | 18.0 ≤ γ < 90.0 |
| | | 2.5 < Al ≤ 7.5 | 45 ≤ γ < 90.0 |
| | | 7.5 < Al ≤ 12.5 | 43.2 ≤ γ < 90.0 |
| | | 12.5 < Al ≤ 17.5 | 39.5 ≤ γ < 90.0 |
| | | 2.5 < Al ≤ 7.5 | 48.9 ≤ γ < 90.0 |
| | | 7.5 < Al ≤ 12.5 | 48.1 ≤ γ < 90.0 |
| | | 12.5 < Al ≤ 17.5 | 48 ≤ γ < 90.0. |

2. The boundary acoustic wave device according to claim 1, further comprising a second dielectric layer which is disposed on the first dielectric layer and which has an acoustic velocity larger than that of the first dielectric layer.

3. The boundary acoustic wave device according to claim 2, wherein each of the first and the second dielectric layers is made of silicon oxide, silicon nitride, or aluminum nitride.

4. The boundary acoustic wave device according to claim 1, wherein an average density of the first portion of the IDT electrode is higher than an average density of the piezoelectric substrate.

5. The boundary acoustic wave device according to claim 1, wherein at least a portion of the first portion of the IDT electrode is made of at least one metal selected from the group consisting of Pt, Au, W, Ta, Mo, Ni, and Cu or an alloy containing at least one metal selected from the group consisting of Pt, Au, W, Ta, Mo, Ni, and Cu.

6. The boundary acoustic wave device according to claim 1, wherein the IDT electrode includes a laminate including a plurality of electrode layers, and a resistivity of at least one layer of the plurality of electrode layers is about 5 μΩcm or less.

7. The boundary acoustic wave device according to claim 1, wherein the electrode layer having a resistivity of about 5 μΩcm or less is made of at least one metal selected from the group consisting of Al, Cu, Au, and Ag or an alloy containing at least one metal selected from the group consisting of Al, Cu, Au, and Ag.

8. The boundary acoustic wave device according to claim 1, wherein the IDT electrode includes a laminate including a plurality of electrode layers, and a diffusion preventing film is disposed in at least one of a location between the IDT electrode and a bottom of the groove and a location between adjacent electrode layers of the plurality of electrode layers.

9. The boundary acoustic wave device according to claim 8, wherein the diffusion preventing film is made of at least one metal selected from the group consisting of Ti, Ni, Cr, and Ta or an alloy containing at least one metal selected from the group consisting of Ti, Ni, Cr, and Ta.

10. The boundary acoustic wave device according to claim 1, wherein the groove angle is within the range of about 10° to about 80°.

* * * * *